United States Patent
Matsui

(10) Patent No.: US 6,940,782 B2
(45) Date of Patent: Sep. 6, 2005

(54) MEMORY SYSTEM AND CONTROL METHOD FOR THE SAME

(75) Inventor: Yoshinori Matsui, Tokyo (JP)

(73) Assignee: Elpida Memory, Inc. (JP)

( * ) Notice: Subject to any disclaimer, the term of this patent is extended or adjusted under 35 U.S.C. 154(b) by 0 days.

(21) Appl. No.: 10/460,987

(22) Filed: Jun. 13, 2003

(65) Prior Publication Data

US 2003/0231543 A1 Dec. 18, 2003

(30) Foreign Application Priority Data

Jun. 13, 2002 (JP) .................................... P2002-172939

(51) Int. Cl.$^7$ ............................................... G11C 8/00
(52) U.S. Cl. ..................................... 365/233; 365/191
(58) Field of Search ............................... 365/233, 191, 365/198, 230.01

(56) References Cited

U.S. PATENT DOCUMENTS

| | | | |
|---|---|---|---|
| 6,456,544 B1 * | 9/2002 | Zumkehr | 365/193 |
| 6,724,666 B2 * | 4/2004 | Janzen et al. | 365/191 |
| 6,819,625 B2 * | 11/2004 | Ruckerbauer et al. | 365/233 |

FOREIGN PATENT DOCUMENTS

| | | |
|---|---|---|
| JP | 2000-353027 | 12/2000 |
| JP | 2001-256772 | 9/2001 |
| KR | 2002-0012035 | 2/2002 |

OTHER PUBLICATIONS

Japanese translation of Korean Office action prepared by Korean associate and sent to Japanese associate on May 9, 2005.
Untranslated Korean Office Action issued on Apr. 29, 2005 in connection with corresponding Korean application No. 10-2003-0037836.
English translation of relevant portions of Korean Patent Office Action issued Apr. 29, 2005 submitted in lieu of statement of relevancy of prior art teachings to the instant application.

* cited by examiner

Primary Examiner—Anh Phung
(74) Attorney, Agent, or Firm—Ostrolenk, Faber, Gerb & Soffen, LLP

(57) ABSTRACT

A memory system and a control method for the same enable stable operation at high frequencies without a radiant noise problem. In the memory system, a plurality of DRAMs is provided on each of a plurality of modules, and each DRAM is connected with a memory controller by data lines and clock lines. The clock lines have a topology exclusively applied to each module, while the data lines have a topology for connecting them to their associated DRAMs on each module. Command/address lines also have a topology similar to that of the clock lines. In this case, data signals supplied through the data lines and clock and command/address signals supplied through the clock lines and the command/address lines are transferred at different timings between the DRAMs and the memory controller. For this reason, the DRAMs and the memory controller are provided with circuits for matching the timings.

31 Claims, 58 Drawing Sheets

MEMORY SYSTEM AND CONTROL METHOD FOR THE SAME

BACKGROUND OF THE INVENTION

1. Field of the Invention

The present invention relates to a memory system including a semiconductor memory, such as a DRAM, and a control method for the same.

2. Description of the Related Art

As this type of memory system, there is one disclosed in Japanese Unexamined Patent Publication No. 2001-256772 (hereinafter referred to as "quoted example 1"). In quoted example 1, a clock signal supplied from a memory controller MC to each module is reproduced and buffered through a PLL circuit on the module before it is distributed to each DRAM on the module. Meanwhile, an address and command signal is buffered by a buffer on each module before it is distributed to each DRAM. A data signal is supplied from the MC to the DRAMs on each module in parallel.

Quoted example 1 discloses a topology in which a data line on each module is not branched with respect to a data bus on a motherboard. This enables the operating frequency of a signal to be increased.

However, quoted example 1 merely discloses a wiring configuration on a module and does not at all refers to synchronizing the timings of address command signals and data signals with clock signals. Hence, it is impossible to analogize the timing relationship among the address command signals, the data signals and the clock signals, and also impossible to analogize any specific configuration for transferring address command signals and data signals to and from the DRAMs by utilizing the timing relationship.

Especially when operating a memory system at high frequencies, it is important to accomplish clock synchronization for transferring signals without a timing loss in addition to achieving improved signal quality. In the case of quoted example 1, the address signals, the command signals and the clock signals are all buffered on the modules, so that the signal timings at the DRAM ends depend on the characteristics of the individual buffering devices, thus leading to timing mismatches. Furthermore, the topologies of the signal lines for the data signals and the clock signals are completely different. As a result, since the signal timings are also different, how to match the data signals to the clock signals in the DRAMs becomes an important assignment.

The applicant has previously filed Japanese Patent Application No. 2001-236759 (hereinafter referred to as "quoted example 2"). Quoted example 2 discloses a memory system shown in FIG. 59. As illustrated, for each bundle of data lines $102_1$, $102_2$, $102_3$ and $102_4$ for transferring data signals, clock signal lines $103_1$, $103_2$, $103_3$ and $103_4$ associated or matched with the bundles $102_1$, $102_2$, $102_3$ and $102_4$ are connected such that they extend from the memory controller MC to the DRAMS of the modules. This configuration does not pose any problem with matching timings with the clock signals as long as the transfer of the data signals is concerned.

However, it is required to generate clock signals for each bundle of data signals on the system, and as the number of the bundles of data signals increases, the number of clock signals increases and the frequencies of data signals and clock signals increase, the problem of radiant noises may occur.

Furthermore, in the memory system shown in FIG. 59, the lines are branched, although command signals and address signals (hereinafter generically referred to as "command/address signals") are not buffered in the modules. This makes it difficult to accomplish operation at high frequencies. In addition, quoted example 2 has disclosed the configuration in which each module is provided with a buffer for buffering command/address signals. It is necessary, however, to increase the number of clock signals for each bundle of data signals. Hence, it is considered inevitable for radiant noises to occur at high frequencies, as mentioned above.

SUMMARY OF THE INVENTION

Accordingly, an object of the present invention is to provide a memory system that stably operates at high frequencies.

Another object of the present invention is to provide a memory system having a topology free from the influences by radiant noises.

A yet another object of the present invention is to provide a memory system having different wiring topologies for data signals and command/address signals.

A further object of the present invention is to provide a method for transferring data signals and command/address signals suited for the foregoing topologies.

To this end, according to one aspect of the present invention, there is provided a memory system that includes a memory device and a memory controller for controlling the memory device, wherein the memory controller is equipped with a unit for outputting a command/address signal to the memory device in synchronization with a clock signal and also outputting a data signal, and the memory device has a unit for receiving the command/address signal to generate an internal command/address signal based on the data signal.

According to another aspect of the present invention, there is provided a memory system including a plurality of memory devices for commonly receiving a command/address signal to operate, and a memory controller for controlling the memory devices, wherein each of the plurality of memory devices includes a unit for receiving data signals all associated the same, and a unit for generating internal command/address signals based on the timings of the data signals.

Preferably, the memory controller includes a unit for outputting a pseudo clock signal to a data signal line when initializing the system so as to supply a timing for the data signal, and the memory device includes a unit for internally generating an internal clock having the phase of the data signal using the pseudo clock signal as a source upon receipt of the pseudo clock signal, thus retaining the timing of the data signal in the memory device.

Preferably, the memory device includes a unit for generating a first multi-phase clock of a shifted phase obtained by dividing the frequency of the clock signal internally supplied from the memory controller, a unit for generating an internal clock of the memory device having the phase of the data signal, a unit for generating a second multi-phase clock of a shifted phase obtained by dividing the internal clock by the same cycle as that of the clock signal, and a unit for generating an internal command/address signal of a data signal phase by associating the first and second multi-phase clocks on a one-to-one basis.

Preferably, the memory controller includes a unit for generating first and second pseudo frequency divided clocks by dividing the frequencies of the command/address signal and the data signal, while the memory device has a unit for comparatively distinguishing the first and second pseudo frequency divided clocks and associating them.

Preferably, the memory controller includes a unit for outputting a pseudo clock signal at initialization as a frequency divided clock, while the memory device includes a unit for comparatively distinguishing a reception clock obtained from a received command/address signal and the frequency divided clock and associating the frequency divided clock and the reception clock.

Preferably, the memory controller includes a unit for outputting a pseudo clock signal obtained by frequency-dividing a data signal and for outputting a clock signal for generating a timing for a data signal by also frequency-dividing the data signal in a similar manner, and the memory device has a unit for internally generating multi-phase clocks obtained by shifting the phases from individual frequency divided clocks and a unit for generating an internal command/address signal of the phase of a data signal by associating multi-phase clocks.

Preferably, the memory device has a unit for transmitting a data signal to the memory controller at the timing of the internal data phase clock.

Preferably, the memory controller includes a unit for generating a timing for discriminating a data signal on the basis of a pseudo frequency divided clock upon receipt of the pseudo frequency divided clock generated at the timing of the internal data phase clock of the memory device.

Preferably, the memory device is a DRAM.

According to a further aspect of the present invention, there is provided a memory system including a memory controller for generating a pseudo clock signal on a data signal line and a device adapted to retain a phase of a data signal in relation to a clock signal from the pseudo clock signal by a clock reproducing circuit, wherein the memory controller has a unit for periodically generating a sampling clock after retaining the phase, and the device includes a phase adjusting unit for adjusting the phase of subsequent data signals according to the sampling clocks after retaining the phase.

Preferably, the memory controller decreases the clock frequency of a data signal and also decreases a sampling frequency after retaining the phase, while the phase adjusting means of the device includes a unit for adjusting subsequent data phases according to the sampling clock after retaining the phase thereby to cause normal data transmission to take place while a sampling clock is being produced.

According to a further aspect of the present invention, there is provided a memory system including a memory controller for generating a pseudo clock signal on a data signal line, and a device adapted to retain a phase of a data signal in relation to a clock signal from the pseudo clock signal by a clock reproducing circuit, wherein the memory controller periodically decreases the clock generation frequency of a data signal and also decreases a sampling frequency in a clock reproducing circuit of the device after retaining the phase so as to adjust the data phase thereafter, thus causing normal data transmission to take place while a sampling clock is being produced.

Preferably, the memory system further includes a unit for periodically producing a clock or a plurality of clocks after retaining the phase.

Preferably, the memory system applies the transfer method for the sampling clocks to bidirectional transmission of data signals.

Preferably, a data line for retaining an initial phase and a data line for sampling after retaining the phase are different.

According to a further aspect of the present invention, there is provided a memory system including a device adapted to transmit a pseudo clock signal to a data signal line and the phase of a data signal in relation to a clock signal is retained on the basis of the pseudo clock signal by a clock synchronizing and reproducing circuit, wherein a pseudo clock signal having its frequency decreased is transmitted to a dedicated sampling data line after retaining the phase, the signal is referred to in the device, and the sampling frequency in the clock synchronizing and reproducing circuit is also decreased to adjust data phases thereafter.

According to a further aspect of the present invention, there is provided a memory system including a device adapted to transmit a pseudo clock signal to a data signal line and the phase of a data signal in relation to a clock signal is retained on the basis of the pseudo clock signal by a clock synchronizing and reproducing circuit, wherein a pseudo clock signal having its frequency of generating clocks periodically decreased is transmitted to a dedicated sampling data line after retaining the phase, the signal is referred to in the device, and the sampling frequency in the clock synchronizing and reproducing circuit is also decreased to adjust data phases thereafter.

Preferably, a clock or a plurality of clocks is periodically generated after retaining the phase.

Preferably, the transfer method for pseudo clock signals using a sampling data line is applied for bidirectional transmission of data signals.

Preferably, bidirectional sampling clocks and other ranks of sampling clocks are transmitted at predetermined intervals on the same signal line.

According to a further object of the present invention, there is provided a control method for a memory system having a memory device and a memory controller for controlling the memory device, the method including a step for outputting a command/address signal from the memory controller to the memory device in synchronization with a clock signal, and for outputting a data signal also, and a step for receiving the command/address signal to generate an internal command/address signal based on the received data signal in the device.

According to a further aspect of the present invention, there is provided a control method for a memory system having a plurality of memory devices for commonly receiving a command/address signal to operate, and a memory controller for controlling the memory devices, wherein each of the plurality of memory devices executes a step for receiving data signals all associated the same and a step for generating internal command addresses based on the phases of the data signals.

Preferably, the control method for a memory system further includes a step for outputting a pseudo clock signal from the memory controller to a data signal line when initializing the system so as to supply a timing for the data signal, and a step for internally generating an internal clock based on the phase of the data signal using the pseudo clock signal as a source when the memory device receives the pseudo clock signal, thus retaining the timing of the data signal in the memory device.

Preferably, the control method for a memory system further includes a step for generating a first multi-phase clock of a shifted phase obtained by dividing the frequency of the clock signal supplied from the memory controller, a step for generating an internal clock of the memory device that has the phase of the data signal, a step for generating a second multi-phase clock of a shifted phase obtained by dividing the internal clock by the same cycle as that of the clock signal, and a step for generating an internal command/address signal of a data signal phase by associating the first and second multi-phase clocks on a one-to-one basis, the steps being carried out in the memory device.

Preferably, the control method for a memory system further includes a step carried out by the memory controller to generate first and second pseudo frequency divided clocks by dividing the frequencies of the command/address signal and the data signal, and a step carried out by the memory device to comparatively distinguish the first and second pseudo frequency divided clocks and associate them.

Preferably, the control method for a memory system further includes a step for outputting a pseudo clock signal at initialization as a frequency divided clock from the memory controller, and a step for comparatively distinguishing a reception clock obtained from a received command/address signal and the frequency divided clock and associating the frequency divided clock and the reception clock.

Preferably, the control method for a memory system further includes a step for outputting a pseudo clock signal obtained by dividing the transmission frequency of a data signal from the memory controller, a step for outputting a clock signal for generating a timing for a data signal as the clock signal obtained by dividing the transmission frequency of the data signal from the memory controller, a step for generating multi-phase clocks obtained by shifting the phases from a pseudo clock signal and a clock signal in the memory device, and a step for generating an internal command/address signal of the phase of a data signal by associating multi-phase clocks in the memory device.

Preferably, the control method for a memory system further includes a step for transmitting a data signal from the memory device to the memory controller at the timing of the internal data phase clock.

Preferably, the control method for a memory system further includes a step for receiving in memory controller a pseudo frequency divided clock generated at a timing of an internal data phase clock of the memory device, and a step for generating a timing for discriminating a data signal on the basis of the pseudo frequency divided clock.

According to a further aspect of the present invention, there is provided a control method for a memory system including a device adapted to transmit a pseudo clock signal to a data signal line and to retain a phase of a data signal in relation to a clock signal from the pseudo clock signal by a clock reproducing circuit, the method including a step for periodically generating a sampling clock after retaining the phase, and for adjusting the phases of data signals thereafter in the device.

According to a further aspect of the present invention, there is provided a system including a device and a controller that controls the device, which are interconnected via a data line and a clock line, wherein the topology of the data line is different from the topology of the clock line.

Preferably, the device and the controller are further connected via a command/address line, and the command/address line has the same topology as that of the clock line.

Preferably, the topology of the data line is such that the distance between the device and the controller is shorter, as compared with the topology of the clock line or the command/address line.

Preferably, the device includes DRAMs individually mounted on a plurality of modules, each module is provided with the clock line or the command/address line, and mutually associated DRAMs on the modules are connected to the same data line.

Preferably, the clock line and the command/address line extends from the proximal end to the distal end of each module, and the DRAMs on each module are connected to the clock line and the command/address line.

Preferably, the clock line and the command/address line are branched into two parts in the central area of each module and connected to the DRAMs on each module.

Preferably, the device is provided in each of a plurality of modules and has a ranked DRAM for reading and writing, the data line is connected to an associated DRAM in a plurality of ranks, and the DRAM of each rank is provided with common clock line and address line.

Preferably, the controller and each of the DRAMs respectively includes a matching unit of the controller and a matching unit of the DRAM for matching the timing of a data signal output onto the data line and the timing of a clock signal or command output onto the clock line or the command/address line.

Preferably, the matching unit of the controller includes a device for outputting a continuously reversing data signal as a pseudo clock signal onto the data line, a device for outputting a clock signal onto the clock line, and a device for outputting a command in synchronization with the clock signal onto the command/address line, while the matching unit of the DRAM includes an internal data clock generating device for generating a data clock in the DRAM on the basis of the pseudo clock signal supplied through the data line, a device for transferring the command transmitted in synchronization with the clock signal on the clock line from the timing of the clock signal onto the data clock in the DRAM.

Preferably, the memory controller further includes a sampling clock generating unit for periodically generating a sampling clock by using the pseudo clock signal after the phase in the device and the memory controller is retained, and the device includes a phase adjusting unit for adjusting the phase of data signal thereafter on the basis of the sampling clock after retaining the phase.

Preferably, the sampling clock generating unit includes a unit for generating the sampling clock by decreasing either the clock generating frequency or the clock frequency of a data signal, and a unit for outputting the sampling clock to the data line.

Preferably, the sampling clock generating unit includes a unit for generating the sampling clock by decreasing either the clock generating frequency or the clock frequency of a data signal, and a unit for outputting the sampling clock to a data line exclusively used for sampling.

Preferably, the data line for transmitting the sampling clock is commonly used by a plurality of devices.

Preferably, the data line for transmitting the sampling clock is used for bidirectional transmission between the memory controller and the device.

DESCRIPTION OF THE PREFERRED EMBODIMENTS

Figure 1:
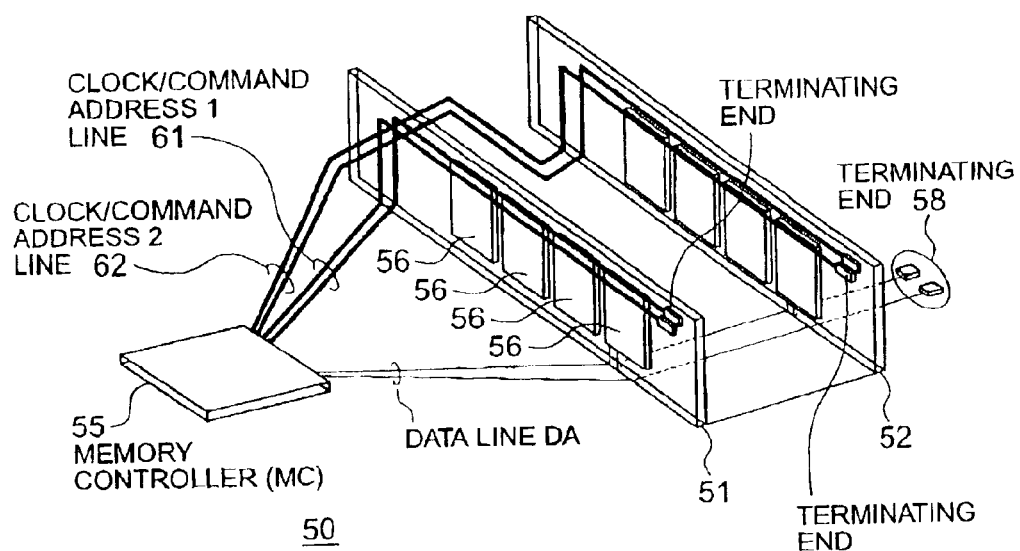
FIG. 1 is a perspective view for providing an outline of a memory system in accordance with the present invention.

Referring to FIG. 1, the configuration of a memory system in accordance with the invention will be schematically explained. The memory system shown in the figure has a memory controller (MC) 55 mounted on a motherboard 50, and a first module 51 and a second module 52 provided in a standing manner on the motherboard 50 through a connector (not shown). In this example, the front and back surfaces of the modules 51 and 52 are provided with a plurality of memory devices (DRAMs in this case) 56 arranged in parallel, as illustrated. More specifically, the DRAMs 56 are disposed in parallel with gaps provided therebetween with respect to the direction crossing the lengthwise direction (i.e., the direction of the short sides) of the modules 51 and 52. The present invention can be also applied to a case where a plurality of memory devices is disposed on either the front or the back of the modules 51 and 52.

The MC 55 is connected to the DRAMs 56 on the modules 51 and 52 through data lines DA. As illustrated, the data lines DA include the lines on the motherboard 50 and the lines on the modules extending from the connector to the DRAMs 56. Module lines 56 are provided on the modules 51 and 52. The data lines DA in the figure extend to terminating ends 58 to connect the DRAMs 56 mounted on the front and back surfaces of the modules 51 and 52. More specifically, the data lines DA are connected between the MC 55 and the DRAMs 56 of the modules 51 and 52 by matching an effective wiring impedance in a topology with virtually no branching. In this case, the modules 51 and 52 have the DRAMs 56 connected via common data lines DA. In the figure, only one set of the data lines DA and the DRAMs 56 on the modules 51 and 52 connected to the data lines DA; however, other DRAMs 56 are also connected via the data lines.

The memory system illustrated in FIG. 1 differs from the ones in quoted examples 1 and 2 described above in that the modules 51 and 52 individually have clock line and command/address lines 61 and 62 (hereinafter referred to as "the first clock and command/address lines and the second clock and command/address lines"). More specifically, the first clock and command/address lines 61 are connected to the module 51 to be commonly connected to the DRAMs 56 on the module 51. Similarly, the second clock and command/address lines 62 are connected to the module 52 to be commonly connected to the DRAMs 56 on the module 52. In other words, the first and second clock and command/address lines 61 and 62 are dedicated lines in the modules 51 and 52, respectively, and terminate on the individual modules 51 and 52.

In this configuration, clock signals and command/address signals are supplied from the MC 55 to the module 51 via the first clock and command/address lines 61, while clocks signals and command/address signals are supplied from the MC 55 to the module 52 via the second clock and command/address lines 62. Herein, the command/address signals mean command signals and/or address signals, as previously mentioned, and used as the generic term of these two types of signals.

As illustrated, the clock and command/address lines are wired with respect to the modules 51 and 52 in a topology virtually free of branching, and are connected to the DRAMs 56 by matching an effective wiring impedance. In this case, there are branches for leading in the lines at the ends of the DRAMs; however, the deterioration in quality attributable to the leading in can be ignored. Furthermore, the command/address signals are generated to match the clock signals, thus allowing the DRAMs to receive the command/address signals in synchronization with the clock signals.

In this configuration, it is necessary to pay attention to the fact that the timings for transferring the clock signals and the command/address signals in each DRAM are different from the timings for transferring data signals in each DRAM. For this reason, as it will be discussed hereinafter, a continuously reversing data signal that repeats successive reversal is bi-directionally transmitted as a pseudo clock signal between the MC 55 and the DRAMs 56 through the data lines DA when initializing the system.

In this case, the continuously reversing data signal is transmitted from the MC 55 to retain the data phase by using the clock signal as a source in each DRAM 56, then an internal data phase clock is generated to permit the transfer of data signals through the data lines DA. Subsequently, operations, such as initialization and timing matching, of the MC 55 are performed, using the continuously reversing data signals of the DRAMs; however, the initializing operation and other operations will be described hereinafter.

In the configuration shown in FIG. 1, the clock signals require only the number of sets of modules mounted on the memory system. Although the timings are different for the data signals and the command/address signals in the DRAMs 56, as previously mentioned, the problem of the different timings will be solved by the matching operation, which will be discussed hereinafter.

Figure 2:
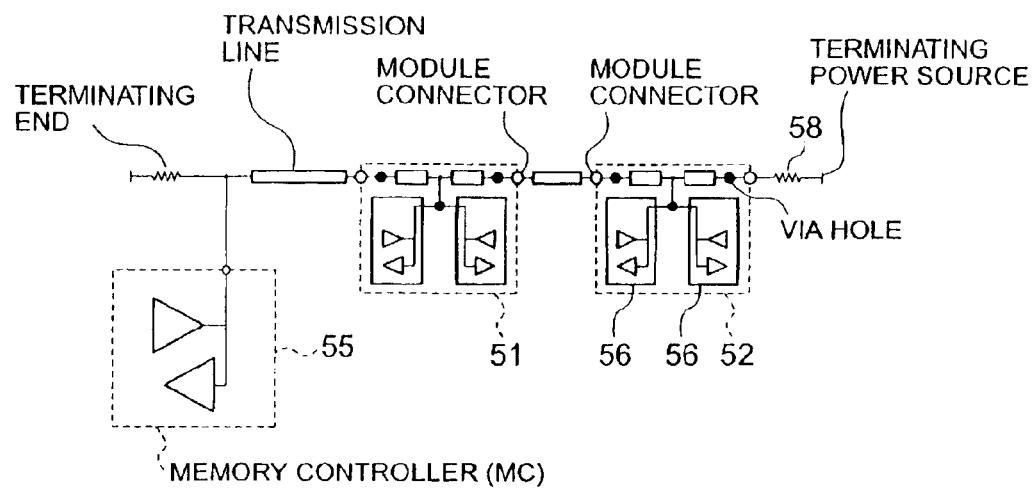
FIG. 2 is an equivalent circuit diagram of the data wiring in the memory system shown in FIG. 1.
Figure 3:
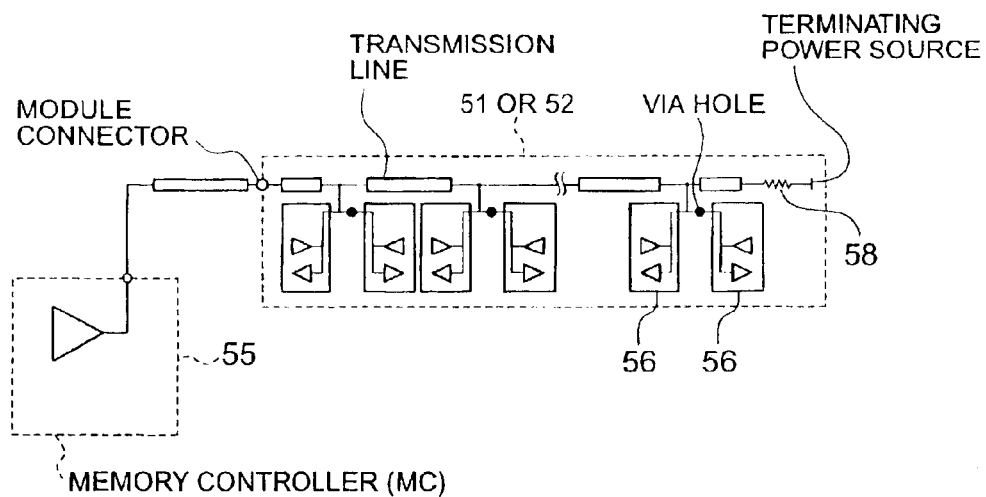
FIG. 3 is an equivalent circuit diagram of the clock and command/address wiring in the memory system shown in FIG. 1.

FIGS. 2 and 3 schematically show equivalent circuits of the data lines DA and clock and command/address lines of the memory system shown in FIG. 1. Referring to FIG. 2, the data line DA is connected to the MC 55, which is simply represented by a transfer amplifier, modules 51 and 52, and the terminating end 58. The data line DA includes the transmission line connecting the MC 55 and the module 51, the lines in the modules 51 and 52, the lines between the modules 51 and 52, and the line to a terminating resistor. The lines in the modules 51 and 52 include the internal lines connected to the DRAMs 56 (represented by transfer amplifiers in this case) mounted on the front and back surfaces of the modules through via holes indicated by black dots. The modules 51 and 52 are interconnected a module connector and a transmission line. The MC 55 and the module 51, and the module 52 and the terminating end 58 are also connected by a transmission line. The DRAMs 56 mounted on the front and back surfaces of the modules 51 and 52 shown in the figures are also represented by transfer amplifiers.

Referring now to FIG. 3, the clock and command/address lines connect the MC 55 with the respective module 51 or 52 by a transmission line through a module connector, and also with the DRAMs 56 mounted on the module 51 or 52 by internal lines. The DRAMs 56 disposed on the front surfaces of the modules 51 and 52 are directly connected to the internal lines, while the DRAMs 56 on the back surfaces thereof are connected to the internal lines through the via holes indicated by black dots.

Referring back to FIG. 1, when the distance between the modules 51 and 52 was set to 10 mm and a transmission line having a characteristic impedance Z0 of 34Ω and a transmission delay tpd of 7 ps/mm was used, then the wiring length from the MC 55 to the module 51 was 120 mm, the transmission delay being 700 ps, while the wiring length between the MC 55 and the module 52 was 120 mm, the transmission delay being 840 ps.

Figure 4:
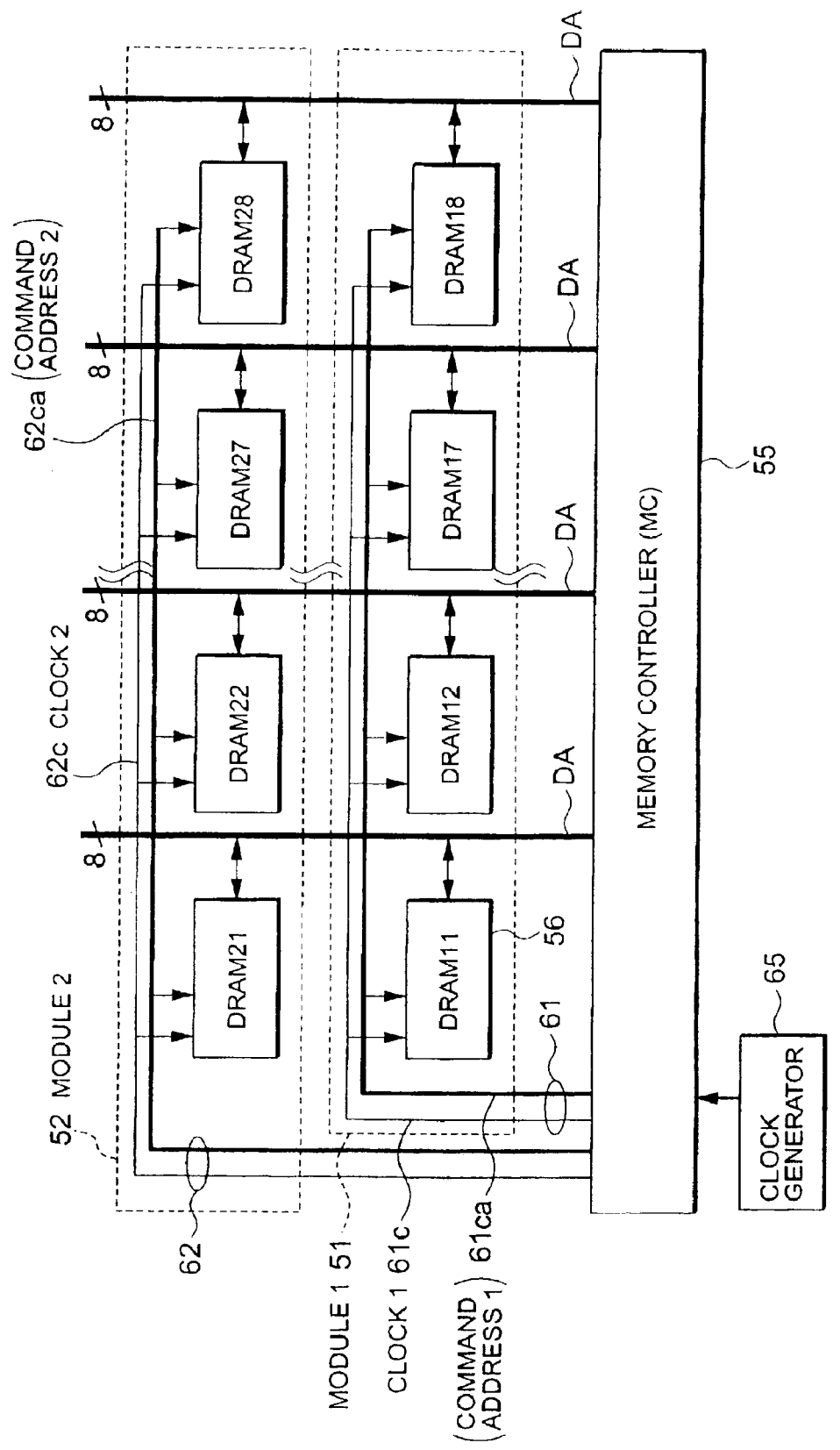
FIG. 4 is a schematic diagram illustrating the topology of a memory system according to an embodiment of the present invention.

Referring now to FIG. 4, the wiring in the memory system according to the first embodiment of the invention shown in FIG. 1 will be explained more specifically. The MC 55 shown in FIG. 4 is connected to a clock generator 65 and also connected to the DRAMs 56 of the modules 51 and 52 by the clock and command/address lines 61 and 62 and the data lines DA. As illustrated, the a plurality of DRAMs 56 are mounted on the modules 51 and 52, and the DRAMs 56 are sequentially numbered from the vicinity of the connection points of the clock and command/address lines 61 and 62 connected to the modules 51 and 52. In the case of the example shown in FIG. 4, the DRAMs of the module 51 are numbered 11 through 18, while the DRAMs of the module 52 are numbered 21 through 28.

Accordingly, in the following description, reference numeral 56 will be used to generically refer to the DRAMs, while the numbers assigned to the individual DRAMs will be used when particular DRAMs of the modules 51 and 52 are referred to.

The clock and command/address lines 61 and 62 shown in FIG. 4 are separated into clock lines 61c and 62c and command/address lines 61ca and 62ca. As is obvious from FIGS. 1 and 4, these clock lines and the command/address lines share the same topology, which is different from the topology of the data lines DA.

Upon receipt of a clock from the clock generator 65, the MC 55 supplies the clock signal to the modules 51 and 52 through the clock line 61c and 62c provided for the modules 51 and 52, respectively. The command/address signals for the modules 51 and 52 are supplied to the modules 51 and 52 through the command/address lines 61ca and 62ca individually connecting the MC 55 with the modules 51 and 52, respectively.

The clock line 61c and the command/address line 61ca are connected to the DRAMs 11 through 18 provided on the module 51 to supply the clock signals and the command/address signals to the DRAMs 11 through 18 on the module 51. Similarly, the clock line 62c and the command/address line 62ca are connected to the DRAMs 21 through 28 provided on the module 52 to supply the clock signals and the command/address signals to the DRAMs 21 through 28 on the module 52. Furthermore, the data lines DA transfer data signal on a 8-bit basis to and from the corresponding DRAMs on the two modules 51 and 52.

Hence, in this example, the same number of clock and command/address lines as that of the modules 51 and 52 is provided, and the same number of data lines DA as that of the DRAMs 11 through 18 and 21 through 28 on the modules 51 and 52 is provided. As previously described, according to this configuration, the command/address signals and the clock signals are supplied for each module from the MC 55 to the modules 51 and 52, respectively, through wiring that has the topology with virtually no branching. It is assumed that the branching for leading into the terminals of the DRAMs 56 is ignorable.

Thus, the wiring impedance with respect to the command/address signals and the clock signals in the modules 51 and 52 is matched to be virtually equal, so that the command/address signals can be received by the DRAMs 11 through 18 and 21 through 28 of the modules 51 and 52, respectively, by the clock signals. Meanwhile, data lines DA are connected to the DRAMs 11 through 18 and 21 through 28 of the modules 51 and 52, respectively, in a branching-free topology with a matched effective wiring impedance, as explained in conjunction with FIG. 1.

In the illustrated memory system, as previously described, the pseudo clock signal is bi-directionally transferred to the data lines DA when initializing the system to retain the data phase by using an internal clock signal as a source in the DRAMs 11 through 18 and 21 through 28 so as to generate an internal data phase clock signal. Thereafter, the transfer of data signals is begun.

This configuration requires only the same number of sets of clock signals as that of the number of modules 51 and 52 mounted on the memory system. Although the timings of the data signals and the command/address signals in the DRAMs 11 through 18 and 21 through 28 are different, the difference in timing can be eliminated by the technique to be discussed hereinafter.

Figure 5:
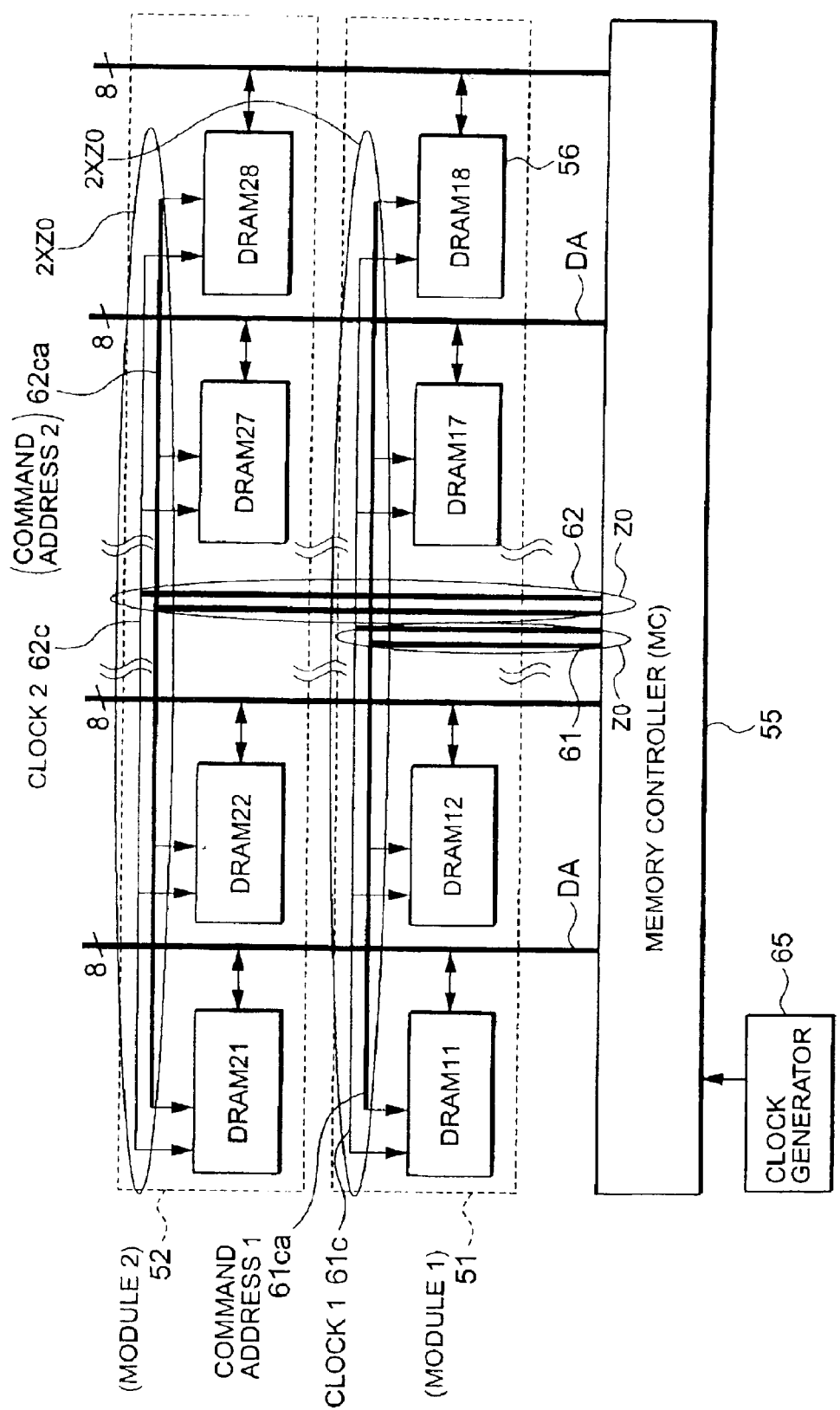
FIG. 5 is a schematic diagram illustrating the topology of a memory system according to another embodiment of the present invention.

FIG. 5 shows a modification example of the memory system according to the first embodiment of the invention. In FIG. 5, the components corresponding to those shown in FIG. 4 are assigned the same reference numerals and symbols. The memory system shown in FIG. 5 differs from the one shown in FIG. 4 in that the clock and command/address lines 61 and 62 for the modules 51 and 52 are disposed at the central portions of the DRAMs 11 through 18 and 21 through 28 mounted on the modules 51 and 52.

To be more specific, in FIG. 5, the clock and command/address line 61 connected to the module 51 extends from the MC 55 to the central position of the module 51. At the central position of the module 51, the line 61 is branched off into two lines and connected to the DRAMs 11 through 18 and 21 through 28 disposed on the right and left in relation to the central position of the module 51. More specifically, the clock signal line 61c and the command/address signal line 61ca making up the clock and command/address line 61 are both branched off into two segments at the central position of the module 51 and connected to the DRAMs 11 through 18 disposed on both sides in relation to the central position of the module 51. Similarly, the clock signal line 62c and the command/address signal line 62ca making up the clock and command/address line 62 are both branched off into two segments at the central position of the module 52 and connected to the DRAMs 21 through 28 disposed on both sides in relation to the central position of the module 52.

In the shown example, the command/address signal lines 61ca and 62ca and the clock signal lines 61c and 62c are branched off into two segments at the central position of each of the modules 51 and 52. This may cause mismatching of impedance before or after the branching position, resulting in the reflection of signals or the like.

Considerations have been given to avoid the aforesaid possible inconvenience, and the example uses a wire having a characteristic impedance Z0 for the signal lines as far as the central positions of the modules 51 and 52, which is a branching position, from the MC 55, and a wire having a characteristic impedance 2Z0 for the lines after the branching position. This makes it possible to effectively match the wiring impedance.

In other words, when the clock and command/address lines 61 and 62 are branched into two segments, the wire having the characteristic impedance which is double that of the wire used before the branching point is used for the wire after the branching point so as to achieve effective wiring impedance matching even if the lines are split. The data lines DA are the same as those shown in FIG. 4, and the explanation will be omitted. Obviously, therefore, the memory system shown in FIG. 5 provides the same advantages as those of the memory system shown in FIG. 4.

Figure 6:
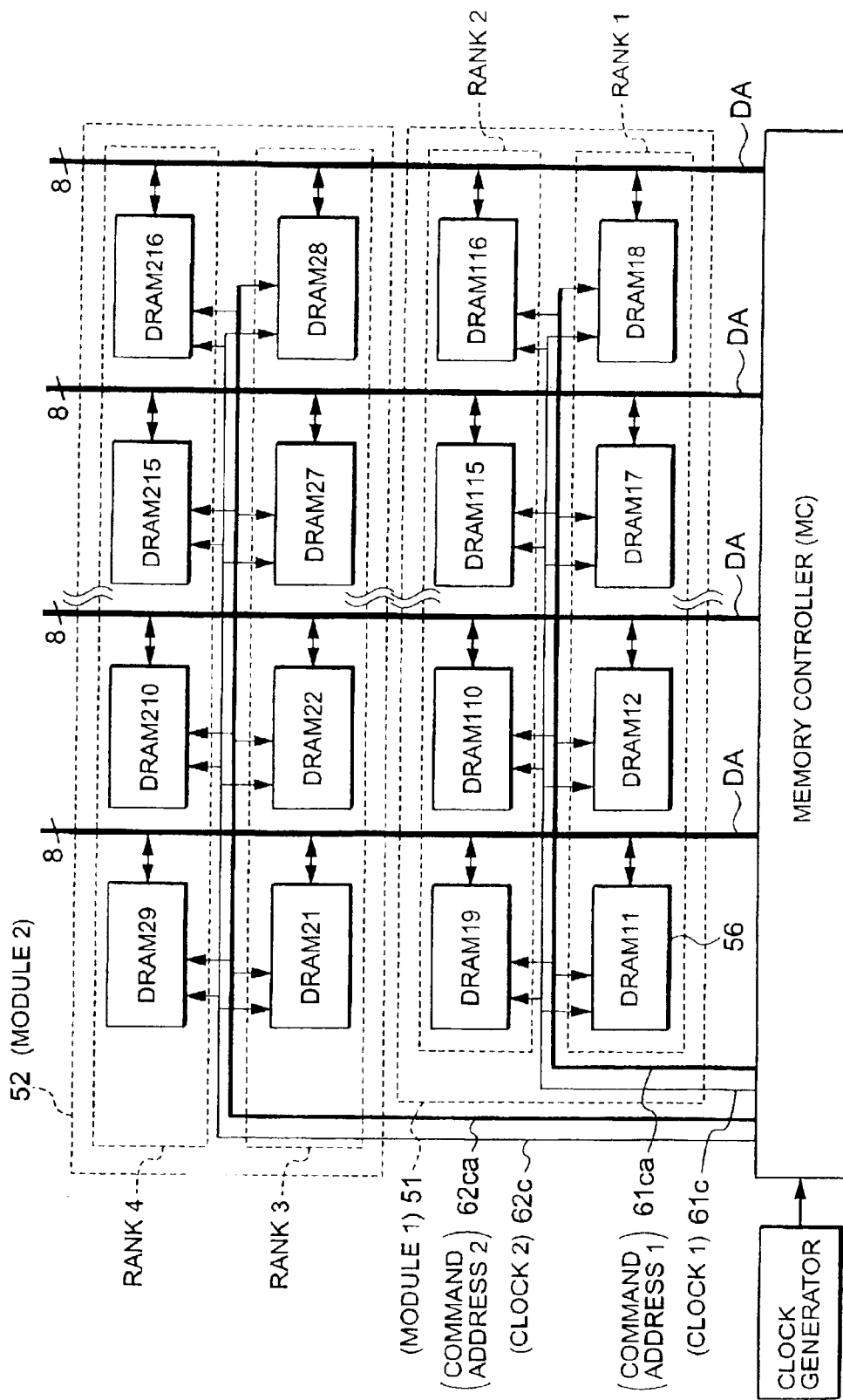
FIG. 6 is a schematic diagram illustrating the topology of a memory system according to yet another embodiment of the present invention.

Referring now to FIG. 6, in a memory system according to another modification example of the embodiment of the invention, each of modules 51 and 52 has a plurality of groups of DRAMs 56 (referred to as "ranks" in this example) for simultaneous writing and reading. In this example, the module 51 has ranks 1 and 2, while the module 52 has ranks 3 and 4. As in the example shown in FIG. 4, a clock signal line 61a and a command/address signal line 61ca unique to the module 51 are connected to the module 51, while a clock signal line 62a and a command/address signal line 62ca unique to the module 52 are connected to the module 52. These signal lines 61a, 61ca, 62a and 62ca are extended from one end of each of the modules 51 and 52 to the DRAMs 56, as in the case of the example shown in FIG. 4.

The DRAMs 56 included in rank 1 of the module 51 are sequentially numbered as DRAMs 11 through 18, as in the case shown in FIG. 4, while the DRAMs 56 included in rank 2 are also numbered as DRAM 19 and 110 through 115 and 116. Similarly, the DRAMs 56 included in rank 3 of the module 52 are numbered as DRAMs 21 through 28, while the DRAMs 56 included in rank 4 are also numbered as DRAM 29 and 210 through 215 and 216. Among these DRAMs, the DRAMs 18, 116, 28 and 216 are the ones connected at the farthest position or the farthest end from the position where the command/address lines 61ca and 62ca and the clock lines 61c and 62c on the modules 51 and 52 are led in, while the DRAMs 11, 19, 21 and 29 are the ones connected at the nearest position or the nearest end from the position where the command/address lines 61ca and 62ca and the clock lines 61c and 62c on the modules 51 and 52 are led in.

According to this configuration, data signals are simultaneously written and read to and from the DRAMs 11 through 18, 19 through 116, 21 through 28, and 29 through 216 of ranks 1, 2, 3 and 4.

In the memory system shown in FIG. 6, the lengths of the data lines DA extending between the groups of DRAMs 56, i.e., the DRAMs 11 through 18, 19 through 116, 21 through 28, and 29 through 216, respectively, and the MC 55 are virtually the same. Therefore, the data signals transferred through the data lines DA arrive virtually at the same time, whereas the clock signals and the command/address signals taken into the groups of DRAMs (DRAMs 11 through 18, 19 through 116, 21 through 28, and 29 through 216) for each rank through the command/address lines in synchronization with the clock signals arrive at a different time from that of the data signals.

Moreover, in the DRAMs 11 through 18, 19 through 116, 21 through 28 and 29 through 216 in the same rank, there is a difference in signal propagation time in the clock and command/address signal lines between the DRAMs 11, 19, 21 and 29 disposed closely to the MC 55 and the DRAMs 18, 116, 28 and 216 disposed far from the MC 55. For example, if the wiring length is 85 mm, the characteristic impedance Z0 is 57 Ω and the effective transmission delay is 11.8 ps/mm in each rank, then the clock and command/ address signals incur a 1003 ps wiring delay between the farthest end and the closest end.

Thus, in each DRAM, it is required to associate the command/address signals and the data signals, and read data of the same rank associated with command/address signals must be discriminated in the MC 55. For this reason, although the wiring topology theoretically permits an operation at high frequencies of 500 MHz or more, it is necessary to match the command signals and the data signals, taking the aforesaid difference in wiring delay into account. Especially when the memory system is operated at 1 Gps or more, it is essential to eliminate the time difference between the command signals and the data signals.

The invention is intended to eliminate the time difference in the DRAMs and the MC 55 to permit operation at high frequencies of 1 Gbps or more. Methods for eliminating the time difference that can be applied to the memory systems shown in FIGS. 4, 5 and 6 will be explained. Diverse methods are possible, three of which will be proposed below as the examples.

First, in the memory systems shown in FIGS. 4 through 6 that use the configurations according to the invention, the elimination of the time difference requires an initializing operation for matching the timing of data signals and the timing of clock and command/address signals in the DRAMs (hereinafter referred to as "initialization 1"), an initializing operation for discriminating the timing of data signals and the timings of clock and command/address signals in the DRAMs in the MC (hereinafter referred to as "initialization 2"), and an initializing operation for the DRAMs to identify which clock signal is providing the timing at which data signals are being transmitted (hereinafter referred to as "initialization 3"). Furthermore, in the MC, reading data from the DRAMs requires an initializing operation for discriminating the timing for reading data from the DRAMs (hereinafter referred to as "initialization 4").

For better understanding of the invention, the normal operation after the completion of the foregoing initializing operations will be described.

Figure 7:
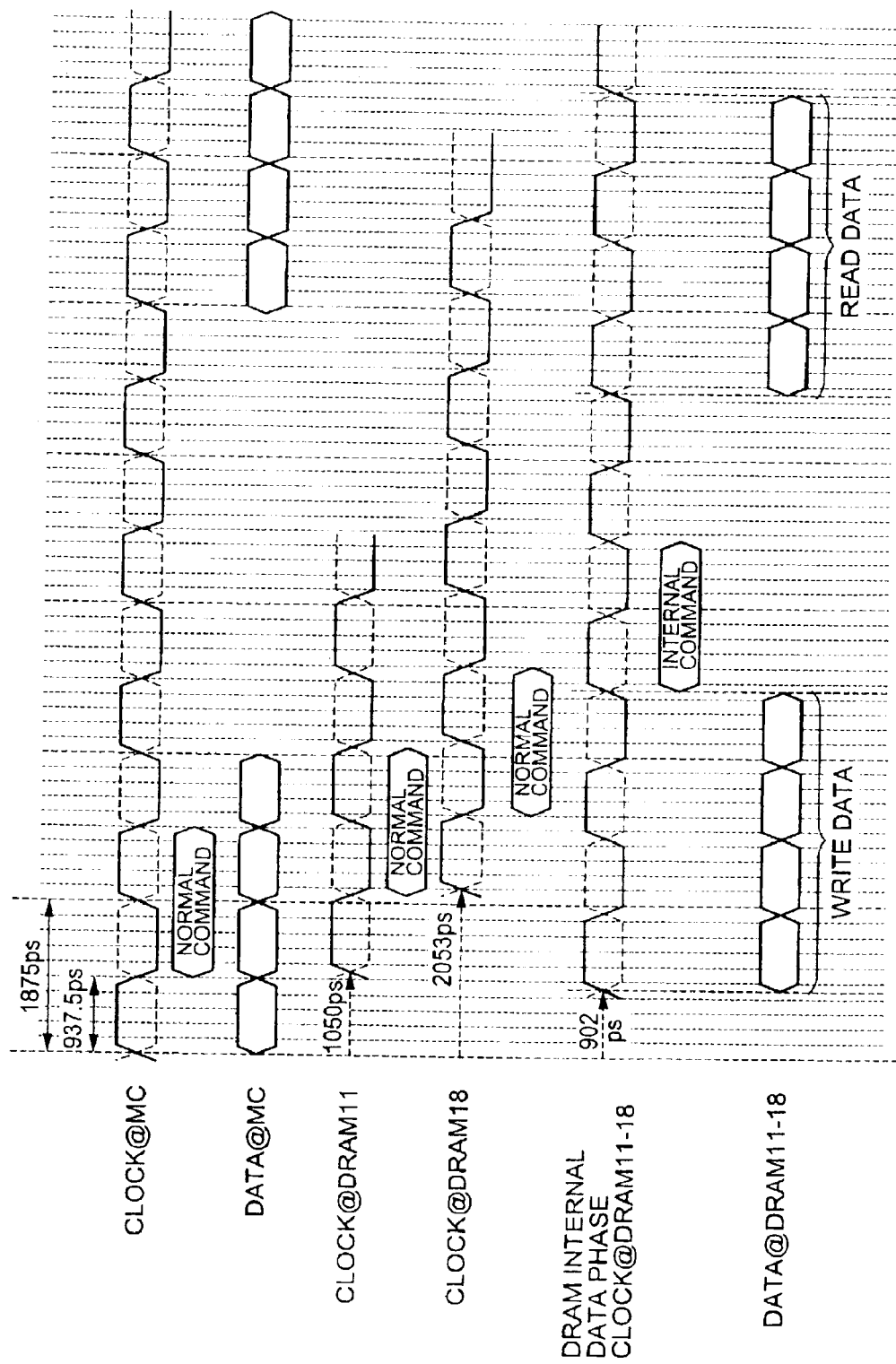
FIG. 7 is a timing chart illustrating a normal operation in an example of the present invention applicable to the memory system shown in FIG. 4 through FIG. 6.

Referring to FIG. 7, an example of the normal operation of the memory system according to an embodiment of the present invention will be explained. The illustrated operation can be applied to a memory system having a plurality of modules or ranks shown in FIGS. 4 through 6. In this case, the operation illustrated in FIG. 7 will be explained, assuming that the exemplary normal operation has been applied to the memory system shown in FIG. 4.

It is assumed that DRAMs 11 through 18 are disposed on the module 51 according to the layout shown in FIG. 4. The MC 55 of the memory system according to the invention issues a command/address signal by adjusting it such that the center of the effective width of the signal coincides with the rising edge of a clock signal (refer to the clock@MC and normal command shown in FIG. 7). In this example, the MC 55 outputs data such that the data matches an edge of a clock signal (refer to data@MC).

The MC 55 generates clock signals at a 1875 ps cycle, i.e., at a 533 MHz frequency, and the clock signals reach the DRAM 11 in the module 51 disposed near the MC 55 with a delay of 1050 ps (refer to clock@DRAM11) and reach the DRAM 18 disposed at the farthest end of the module 51 with a delay of 2053 ps (refer to clock@DRAM18).

This means that the clocks from the MC 55 are delayed by 1003 ps (=2053–1050 ps) in the module 51.

The DRAMs 11 through 18 matches the data phase by the initializing operation, which will be discussed later, then generate DRAM internal clocks (refer to DRAM internal data phase clock@DRAM).

In this state, write data is issued from the MC 55 by being matched to both rising and falling edges of the clock signals (clock@MC) in the MC 55 (refer to data@MC in FIG. 7) and written to the DRAMs 11 through 18 by being matched to the DRAM internal data phase clock@DRAMs 11 through 18 (refer to data@DRAMs11–18).

Read data is issued from the DRAMs (refer to data@DRAM) by being matched to both rising and falling edges of the DRAM internal clock matched to the phase of the data generated by initialization in each DRAM (refer to DRAM internal data phase clock@DRAM)

Furthermore, the command signal (normal command) issued from the MC 55 in synchronization with the clock is captured once as an internal command at the timing of each DRAM internal data phase clock signal in the DRAM. Thus, according to the invention, each command is transferred to the data phase timing to generate the internal command signal. Hence, the operations in the DRAMs, particularly, the activation of DRAM core arrays, pre-charging, data read and data write are carried out at the timing of the internal data phase. At this time, the DRAM internal data phase timing and the timing of the clock from the MC are retained by the initialization.

As explained in conjunction with FIG. 4, since the data phases are virtually the same in the DRAMs in the same module, all the DRAMs perform internal operations at the same timing and send the data with a matched timing back to the MC 55. In the MC 55, the data and command/address signals to be transmitted are synchronized with the clock signals, making it possible to easily control the operation timings of the DRAMs 11 through 18 and 21 through 28, or the like by monitoring clock count.

Moreover, the use of the method according to the invention, which will be described later, enables the MC 55 to transfer the command signal issued at the timing of the clock signal to the data phase clock timing generated in the MC 55 and to receive the data transmitted from the DRAMs by counting the number of clocks.

Figure 8:
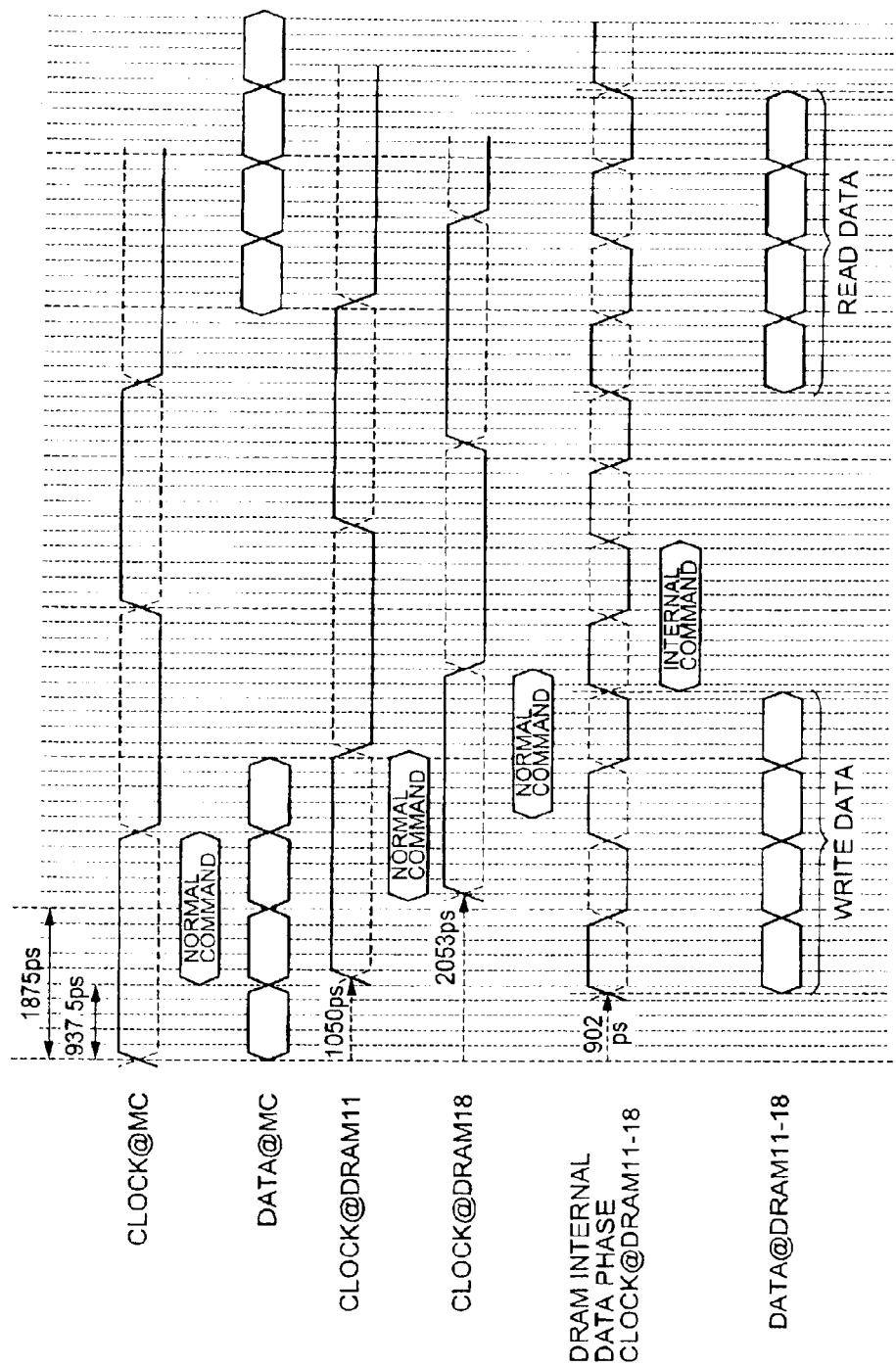
FIG. 8 is a timing chart illustrating a normal operation in another example of the present invention applicable to the memory system shown in FIG. 4 through FIG. 6.

Referring now to FIG. 8, another example of the normal operation of the memory system according to an embodiment of the invention will be explained. The operation shown in the figure can be also applied to the memory systems shown in FIGS. 4 through 6. Hence, the operation of the memory system shown in FIG. 8 will be described with reference to FIG. 4. The example shown in FIG. 8 differs from the memory system shown in FIG. 7 in that the MC 55 generates the clock signal (clock@MC) at a cycle (2006 ps), which is longer than the delay time in each module, taking the delay time (1003 ps) in each module into account. Other normal commands and data signals are generated in the same manner as in the memory system shown in FIG. 7 (refer to clock@MC and data@MC).

Thus, in the example shown in FIG. 8, the clock signal having a frequency (e.g., 177 MHz) lower than the clock signal shown in FIG. 7 is used, taking the delay time in the modules into account. This enables the DRAMs of each rank to receive normal commands in one cycle of the clock signal (refer to clock@DRAM11 and clock@DRAM18). In the shown example, the clock signals and normal commands from the MC are received by the DRAMs 11 and 18 with delays of 1050 ps and 2053 ps, respectively (refer to clock@DRAM11 and clock@DRAM18). These delay times affecting the clock signals of the DRAMs 11 through 18 are based on the differences in delay time only in each clock signal cycle. Hence, attention is to be paid only to the delay time in the clock signal cycle for the DRAMs 11 through 18 when generating the internal data phase clocks in the DRAMs so as to retain the phase difference between the clock signal and the DRAM internal data phase clock (refer to DRAM internal data phase clock@DRAMs11–18).

Thus, in the DRAMs 11 through 18, it is possible to generate the internal data phase clock, considering only the delay time in the clock signal cycle, to receive internal command in synchronization with the data phase clock, and to transfer data in synchronization with the internal data phase clock (data@DRAMs11–18).

In other words, in the DRAMs 11 through 18, as in the case of the memory system shown in FIG. 7, based on a clock signal obtained by a pseudo clock signal generated at initialization, the internal clock signals (refer to the DRAM internal data phase clock@DRAM) are generated in the DRAMs, the internal command signals are generated at the timings of the internal clocks, and write data and read data are written and read in synchronization with the internal clocks (refer to data@DRAMs 11 through 18). The operations illustrated in FIGS. 7 and 8 will be explained in more detail hereinafter.

As previously mentioned, the operations illustrated in FIGS. 7 and 8 require initialization. To perform the initializing operation, it is necessary to provide a means for transferring the command signal captured at the timing of the clock signal from the MC onto the data phase timing to generate an internal command signal in the DRAMs, and a means for receiving the data signals issued to match the data phases in the DRAMs by associating the data signals with command signals in the MC. The following explanation will be focused mainly on these means.

In the following explanation, although the clocks and data will be represented as single signals for simplicity, two clocks will be actually used for a differential signal and two data lines will be used for initialization.

There will be no detailed description of the clock reproducing circuit shown in the figures and the circuit technologies required for implementing the functions of the circuit, including clock phase adjustment, clock frequency division, clock multiplication, and phase shifting, because standard circuit technologies will be used.

It must be noted that none of the memory systems according to the embodiments shown in FIGS. 4 through 6 have system clock signals for transferring data signals. The present invention uses the following technology in place of using system clock signals. Pseudo clock signals composed of continuously reversed data signals are transmitted from the MC to the DRAMs when initializing the system, while the phase difference of the clock signals supplied to the DRAMs in the same topology as that of command/address signals is retained, thereby generating, in the DRAMs, the clock signals for transferring data signals in the DRAMs as source clocks. Thus, data signals are transferred.

Using the timing charts shown in FIGS. 9 and 10, description will be given of the initializing operation performed by the embodiment shown in FIG. 7, that is, the operation performed for issuing an initialization command. In this case, the MC issues the initialization command in synchronization with a clock (clock@MC and command@MC) and also issues the data signal continuously repeating reversion (continuously reversing data signal) as the pseudo clock signal.

Then, the step for setting the DRAM internal data clock phase by using the initialization command and the continuously reversing data signal (hereinafter referred to as "initialization 1") is carried out in the MC, the step for setting the phase of the data clock for each DRAM (hereinafter referred to as "initialization 2"), and the step for setting the destination to which a command/address signal is transferred from a clock timing to a data clock timing in each DRAM (hereinafter referred to as "initialization 3"). When the MC issues the read command to a DRAM, the MC further carries out a step for discriminating the read command with which the data read from the DRAM is associated (hereinafter referred to as "initialization 4"). The description will be given first of initialization 1.

Figure 9:
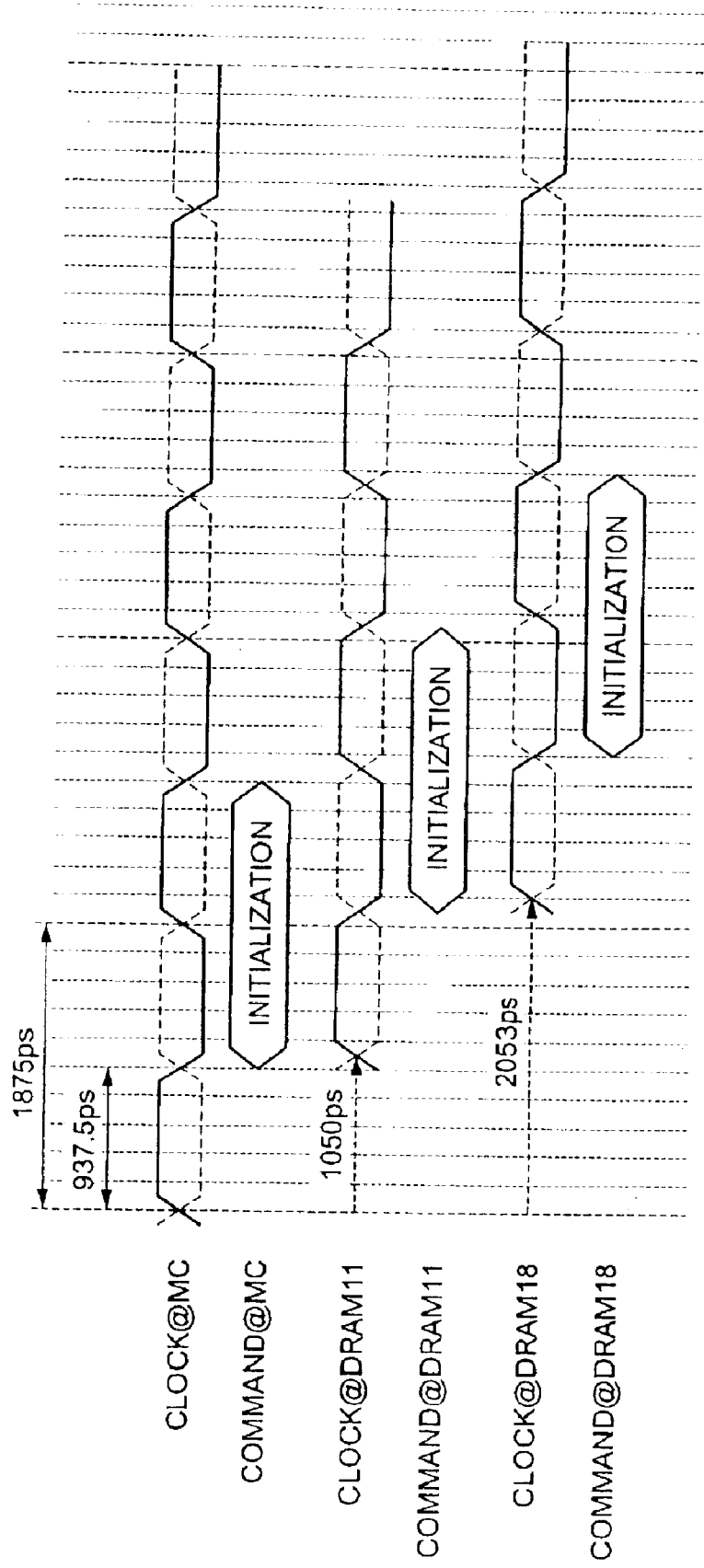
FIG. 9 is a timing chart illustrating the operation for issuing an initialization command in a first example of the present invention.

Referring to FIG. 9, the MC generates a clock signal (refer to clock@MC) and generates the initialization command such that the central position thereof coincides or matches with the rising edge of the clock signal (refer to command@MC). The clock signal and the initialization command from the MC 55 are supplied with a 1050-ps delay to the DRAM 11, which is positioned at the nearest end, while they are supplied with a 2053-pseudo delay to the DRAM 18, which is positioned at the farthest end. The relationship between the clock signals and the initialization commands supplied to the DRAMs 11 through 18 is identical to the relationship between the clocks and initialization commands in the MC. This is because the clock and command/address signal lines have like topologies.

Figure 10:
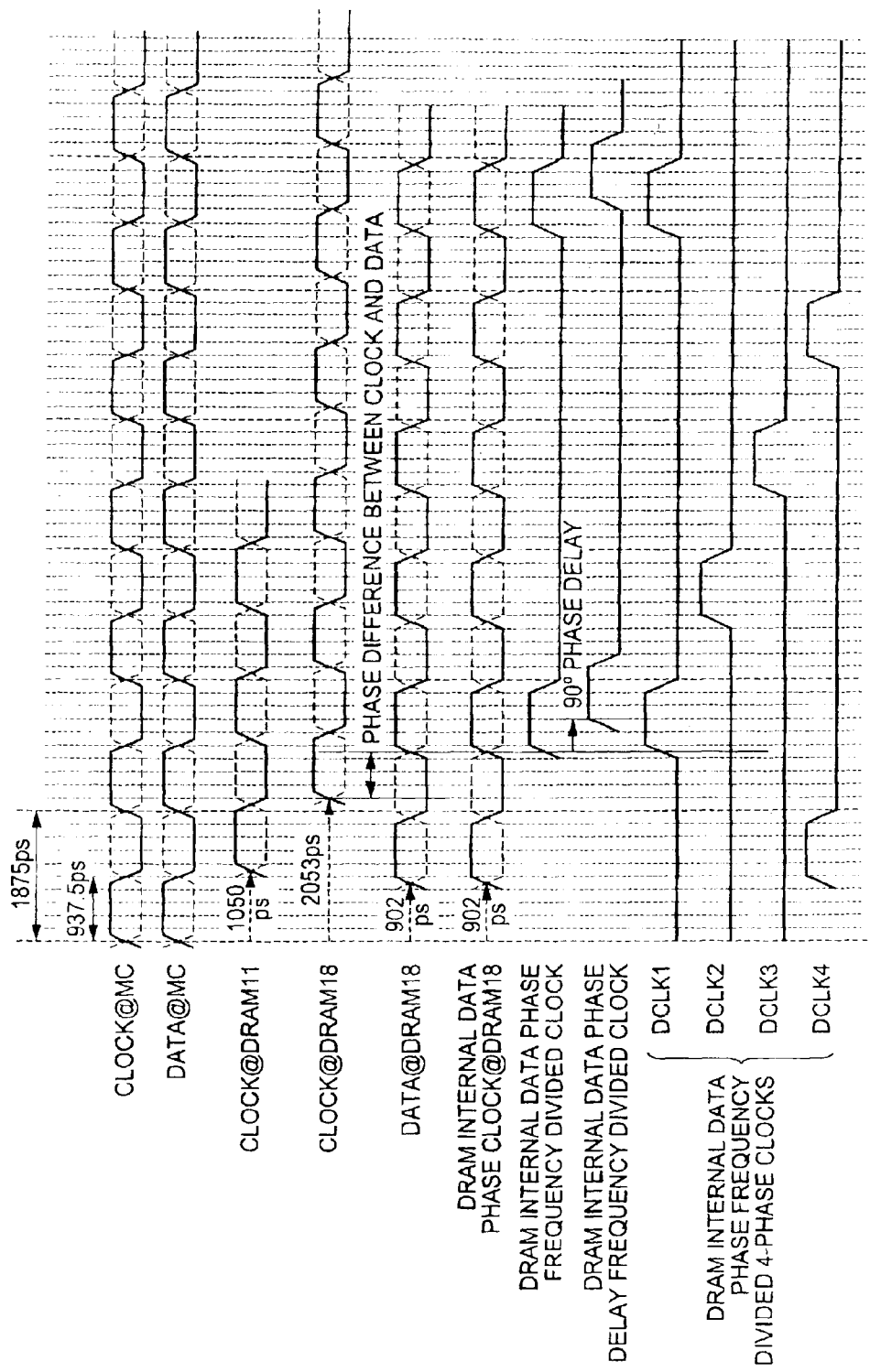
FIG. 10 is a timing chart illustrating an initializing operation in a DRAM in the first example of the present invention.

Meanwhile, as shown in FIG. 10, the continuously reversing data signal (data@MC) from the MC 55 is supplied to the DRAMs 11 through 18 via the data line DA having a topology different from that of the clock and command/address signal line. In this case, the continuously reversing signal is supplied as the pseudo clock signal to all the DRAMs 11 through 18 with virtually the same delay time (902 ps in this case), as shown in FIG. 10. As previously described, the clock signals (clock@MC) from the MC 55 are supplied to the DRAMs 11 through 18 with mutually different delay times (the 1050 ps delay for the DRAM 11 and the 2053 ps delay for the DRAM 18). A time difference, i.e., a phase difference, attributable to the difference in delay time due to the difference of lines arises between the data signals and the clock signals, command/address signals.

The difference in delay time between the data signals and the clock signals in the DRAM 18 will now be explained. A data signal reaches the DRAM 18 with the 902-ps delay, then a clock signal reaches the DRAM 18 1151 ps after the arrival of the data signal (refer to clock@DRAM18 and data@DRAM18). This means that there is a phase difference equivalent to 1151 ps between the clock signal and the data signal.

Upon receipt of the continuously reversing data signal issued by the MC, the DRAM 18 generates an internal data phase clock matched to the received continuously reversing data signal (refer to DRAM internal data phase clock@DRAM18). This means that, in initialization 1, the continuously reversing data signal is used as the pseudo clock signal rather than the clock signal from the MC to decide the internal data phase clock.

Subsequently, the clock signal (clock@MC) is received by the DRAM 18 with a delay time of 2053 ps. In this example, the cycle of the clock signal is 1875 ps, so that the delay time of the clock signal is longer than the cycle of the clock signal. Hence, the transfer of a data signal is not necessarily carried out in the DRAMs 11 through 18 within the same clock cycle; therefore, it is necessary in this example to discriminate the clock signal that provides the timing at which the data is received. It is also necessary to retain the phase difference between the continuously reversing data signal and the clock signal.

Taking the above into account, the embodiment is adapted to generate the internal data phase clock by using the continuously reversing data signal in a DRAM and divide the frequency of the internal data phase clock (divide in quarters in this case) so as to decide the internal phase of the data signal in each DRAM.

In other words, the internal data phase clock (refer to DRAM internal data phase clock@DRAM18) is divided in quarters to generate the internal data phase frequency divided clock (refer to DRAM internal data phase frequency divided clock), while the quartered internal data phase frequency divided clock is phase-delayed by 90 degrees so as to produce an internal data phase delay frequency divided clock (DRAM internal data phase delay frequency divided clock).

At the same time, using the above internal data phase frequency divided clock as the reference, internal data phase frequency divided 4-phase clocks (DCLK1 through DCLK4) are generated in the DRAM 18 (refer to DRAM internal data phase frequency divided 4-phase clocks). This sets the DRAM internal data clock phases. These internal phase frequency divided clocks or the like are used to eliminate the phase differences between clock signals and data signals in the DRAM 18, as it will be discussed hereinafter.

Figure 11:
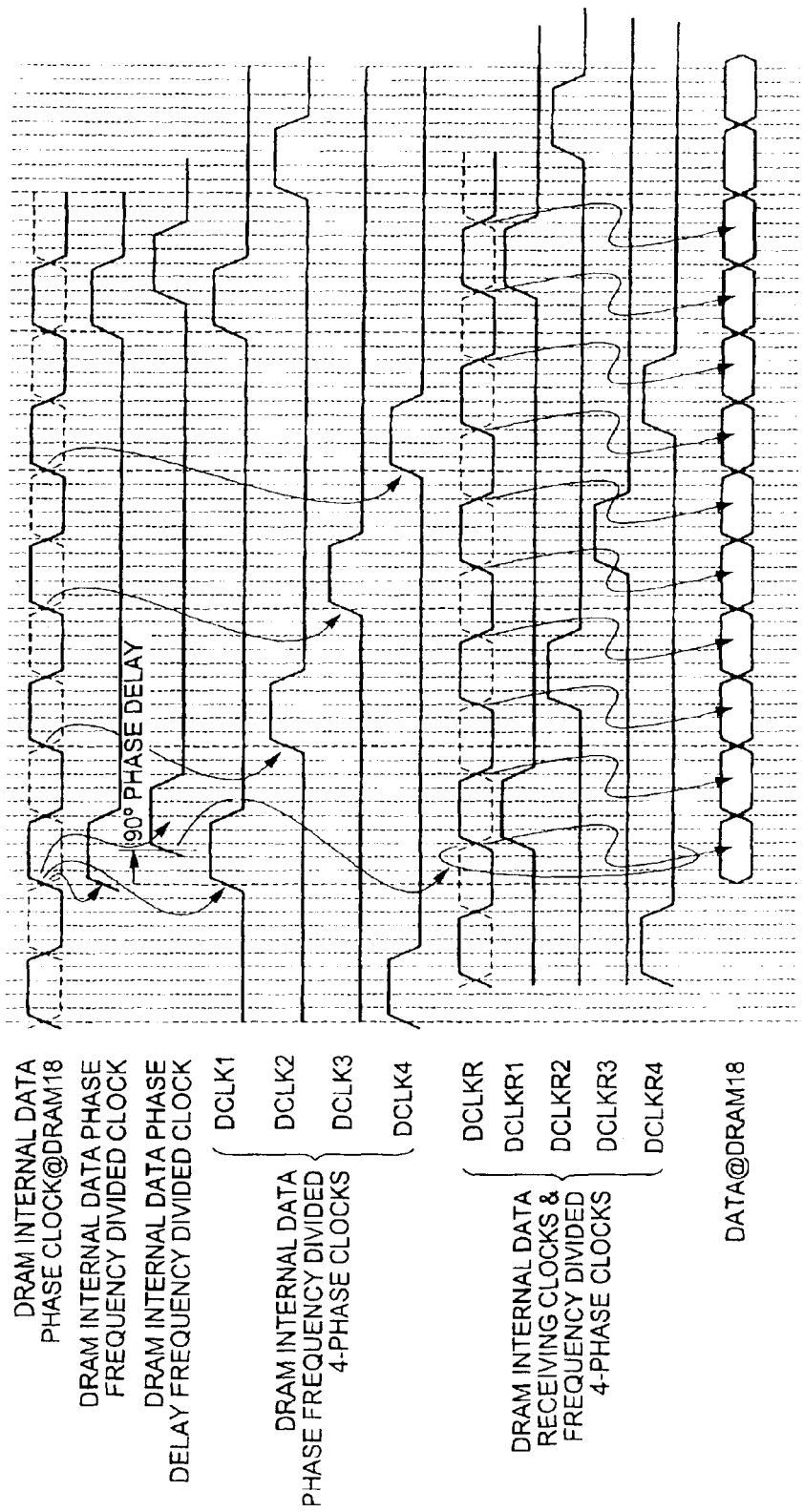
FIG. 11 is a timing chart illustrating a write operation in a DRAM in the first example of the present invention.

Referring to FIG. 11, the clock timing for the DRAM internal data after initialization 1 will now be explained. In this case, it is assumed that a write operation is performed. The DRAM internal data phase frequency divided 4-phase clocks (DCLK1 through DCLK4) are generated as described above, while the clocks DCLKRs for receiving DRAM internal data and the frequency divided 4-phase clocks for receiving the DRAM internal data (refer to DCLKR1 through DCLKR4) are generated from the DRAM internal data phase delay frequency divided clocks obtained by delaying their phases by 90 degrees and frequency-divided.

As is obvious from FIG. 11, these receiving clocks DCLKR, DCLKR1 through DCLKR4 are produced on the basis of the internal data phase delayed frequency divided clock obtained by delaying the phase of the DRAM internal data phase frequency divided clock by 90 degrees. After receiving the initialization command, the data signals from the MC 55 are written at the edges of these internal data receiving clocks DCLKRs.

Figure 12:
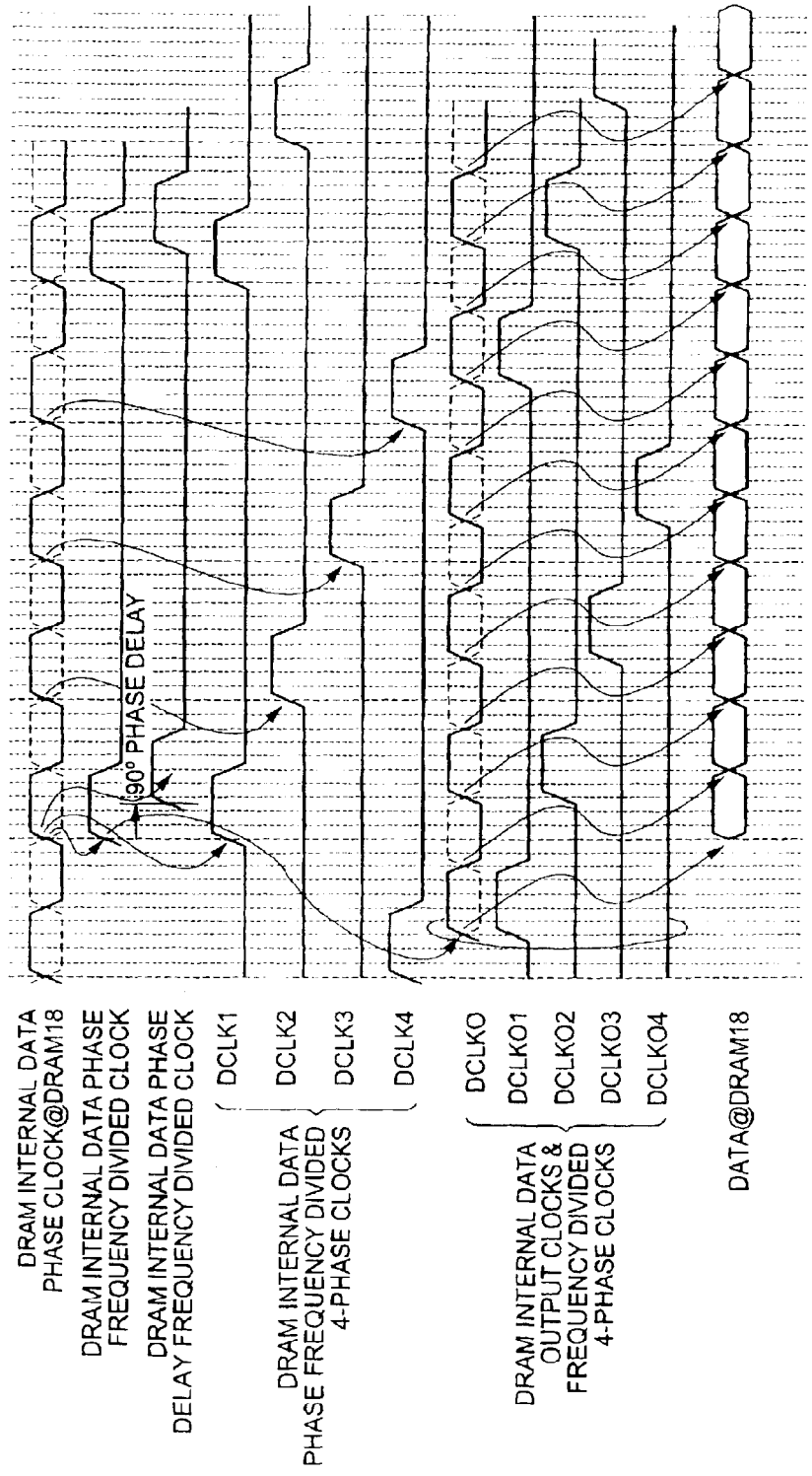
FIG. 12 is a timing chart illustrating a read operation in a DRAM in the first example of the present invention.

FIG. 12 shows the timings for reading data signals after receiving the initialization command. As shown in FIG. 12, using the internal data phase frequency divided clock (refer to DRAM internal data phase frequency divided clock), a DRAM internal data output clock DCLK0 and frequency divided 4-phase clocks DCLK01 through DCLK04 are generated in the DRAM 18. At an edge of the internal data output clock DCLK0, a data signal is read from the DRAM 18 (refer to data@dRAM18). As shown in FIG. 12, following the initialization, the DRAM internal data output clock DCLK0 is generated on the basis of the DRAM internal data phase clock. Based on the internal data output clock DCLK0, the data is read from the DRAM 18, and these pieces of data are output to the MC in the form of continuously reversing data signals.

Figure 13:
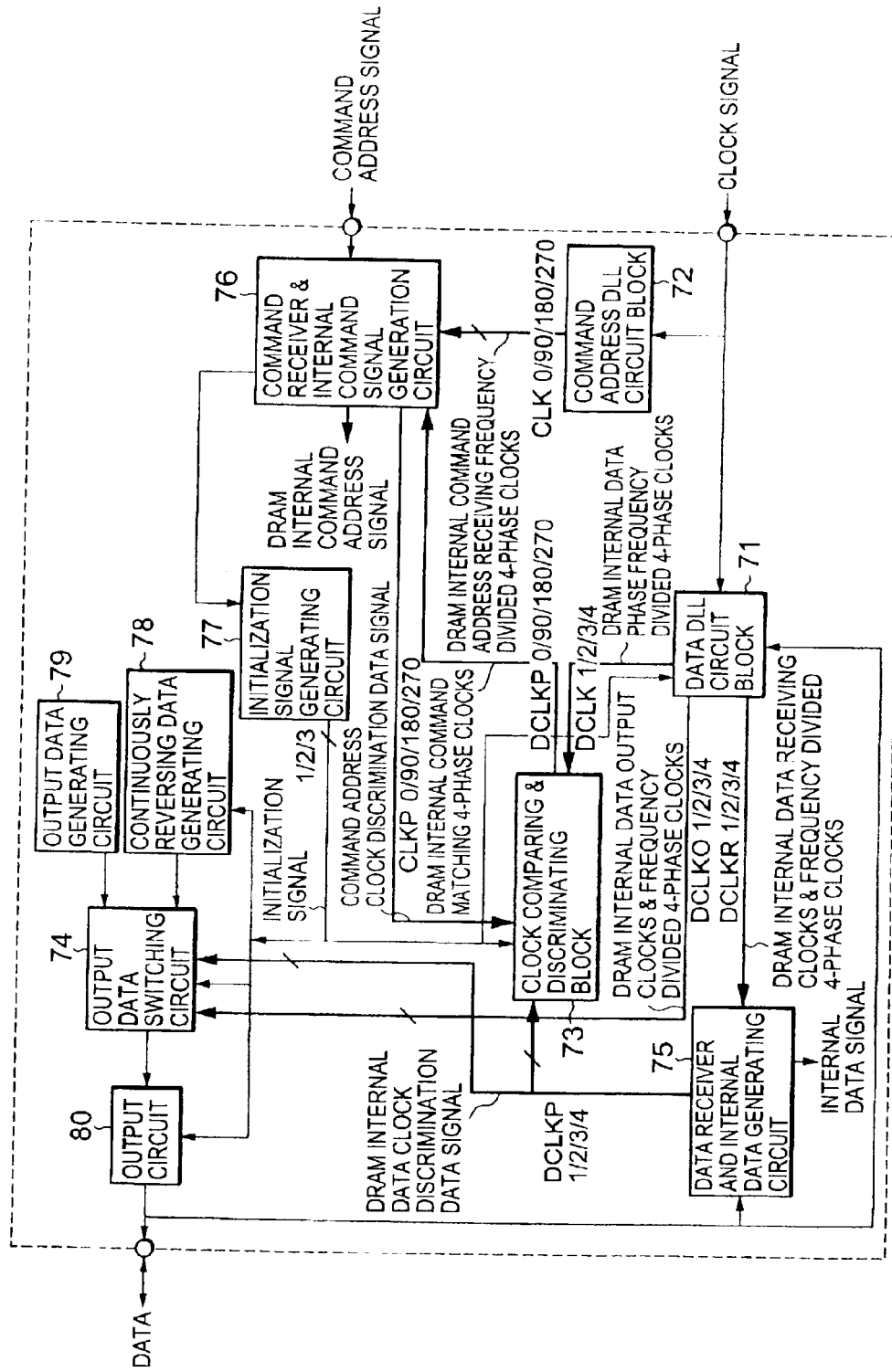
FIG. 13 is a block diagram illustrating an internal configuration of a DRAM used with the first example of the present invention.

FIG. 13 shows a specific configuration of the DRAM performing the foregoing operation. The illustrated DRAM has a data DLL circuit block 71 that receives the continuously reversing data signals as pseudo clock signals from the MC and also receives clock signals. The block 71 generates the internal data phase frequency divided 4-phase clocks DCLK1/2/3/4, the internal data receiving clock and frequency divided 4-phase clocks DCLKR, DCLKR1/2/3/4, and the internal data outputting clock and frequency divided 4-phase clocks DCLK0, DCLK01/2/3/4. The DRAM further includes a command/address DLL circuit block 72 that generates the DRAM internal command/address receiving frequency divided 4-phase clocks CLK0/90/180/270 in response to the clock signals. The configurations of these blocks 71 and 72 will be discussed later.

Referring to FIG. 13, for initialization 1, the data DLL circuit block 71 generates the DRAM internal data phase frequency divided 4-phase clocks DCLK, DCLK1/2/3/4 (refer to FIGS. 10 and 11) from the pseudo clock signals supplied as the continuously reversing data signals via the data lines DA, and send them to a clock comparing and discriminating block 73. Meanwhile, the DRAM internal data output clock and the frequency divided 4-phase clocks DCLK0, DCLK01/2/3/4 are supplied to an output data switching circuit 74. The DRAM internal data receiving clock DCLKR and the DRAM internal data frequency divided 4-phase clocks DCLKR1/2/3/4 are supplied to a data receiver and internal data generating circuit 75.

The command/address DLL circuit block 72 outputs the DRAM internal command/address receiving the frequency divided 4-phase clocks CLK0/90/180/270 to a command receiver and an internal command signal generating circuit 76 to discriminate the phases of the clock signals. The command receiver and the internal command signal generating circuit 76 receive the command/address signals and the DRAM internal command/address receiving frequency divided 4-phase clocks CLK0/90/180/270, and DCLK0/90/180/270 supplied from the clock comparing and discriminating block 73, then associate or match their timings so as to generate DRAM internal command/address signals at matched timings. In this case, "0/90/180/270" of CLK0/90/180/270 and DCLK0/90/180/270 indicate the phases of the frequency divided 4-phase clocks. This makes it possible to discriminate the clock signals that provide the timings at which the command/address signals are received.

Furthermore, the command receiver and the internal command signal generating circuit 76 outputs the command/address clock discrimination data signals CLKP0/90/180/270 discriminating the timings of the received command/address signals by phases, and an initialization timing signal. The DRAM internal command/address signals are supplied to the memories of the DRAMs, while the command/address clock discrimination data signals CLKP0/90/180/270 and the initialization timing signal are supplied to the clock comparing and discriminating block 73 and the initialization signal generating circuit 77, respectively.

The clock comparing and discriminating block 73 compares the DRAM internal data phase frequency divided 4-phase clocks DCLK 1/2/3/4 and the command/address clock discrimination data signals CLKP0/90/180/270 by referring to the initialization signals 1/2/3/4 from the initialization signal generating circuit 77, then supplies the DRAM internal command matching 4-phase clocks DCLK0/90/180/270, which are the results of the comparison, to the command receiver and the internal command signal generating circuit 76. The DCLK0/90/180/270 indicate the phases of the continuously reversing data signals at which the clock signals from the MC are received.

Based on the DCLK0/90/180/270, the command receiver and the internal command signal generating circuit 76 match the timing of the DRAM internal command/address signal to the timing of the continuously reversing data signal.

Meanwhile, upon receipt of a data signal, the data receiver and internal data generating circuit 75 store internal data signals in a memory according to the DRAM internal data receiving clock and the frequency divided 4-phase clocks DCLKR, DCLKR1/2/3/4. In the case of initialization, the data receiver and internal data generating circuit 75 output the DRAM internal data clock discrimination signals DCLKP1/2/3/4, which indicate the receiving timings of the received data signals, to the output data switching circuit 74.

The output data switching circuit 74 judges the output or input of data, and operates in response to the DRAM internal data clock discrimination data signals DCLKP1/2/3/4, the DRAM internal data output clocks, the frequency divided 4-phase clock DCLK01/2/3/4, and initialization signals 1/2/3/4. In the case of the initializing operation, the initial continuously reversing data from a continuously reversing data generating circuit 78 is output to the MC as output data through the intermediary of the output data switching circuit 74 and an output circuit 80. For normal operation, data is transferred through the intermediary of the output data switching circuit 74 and the output circuit 80.

Figure 14:
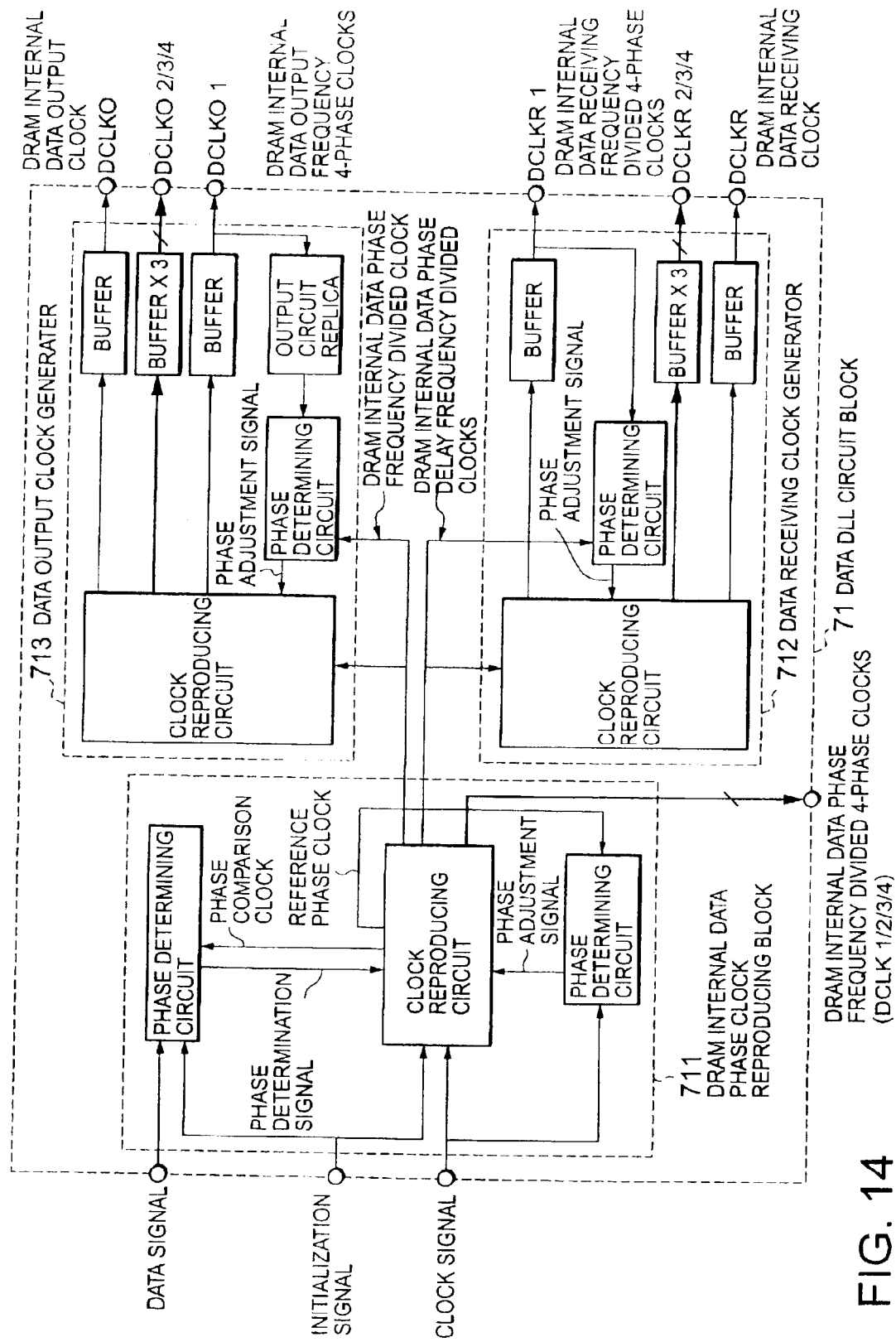
FIG. 14 is a block diagram illustrating the details of a data DLL circuit block used with the DRAM shown in FIG. 13.
Figure 15:
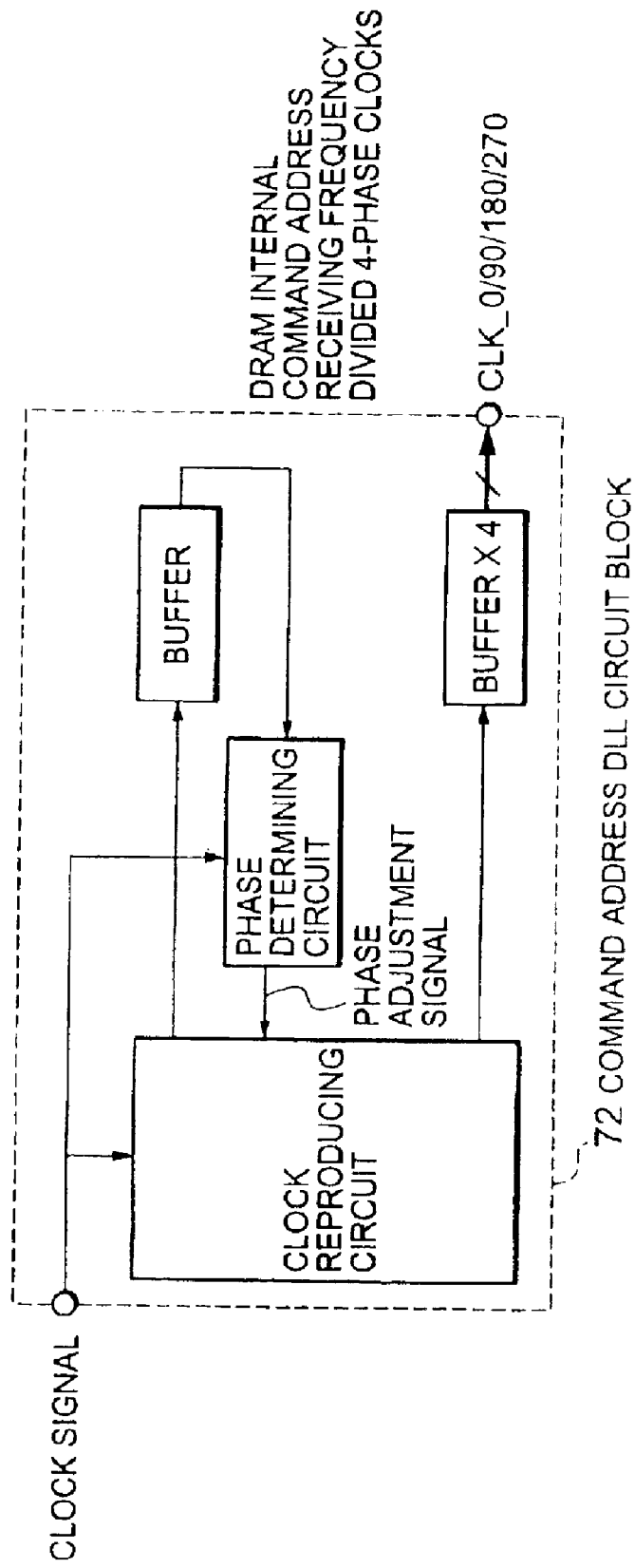
FIG. 15 is a block diagram illustrating the details of a command/address DLL circuit block used with the DRAM shown in FIG. 13.

FIG. 14 shows the data DLL circuit block 71 shown in FIG. 13 and FIG. 15 shows the command/address DLL circuit block 72. Referring to FIGS. 13 and 14, the data DLL circuit block 71 receives data signals, initialization signals and clock signals to generate the DRAM internal data output clocks DCLK0 and the frequency divided 4-phase clocks DCLK01/2/3/4 thereof, the DRAM internal data receiving clocks DCLKR and the frequency divided 4-phase clocks DCLKR1/2/3/4 thereof, and the DRAM internal data phase frequency divided 4-phase clocks DCLK1/2/3/4, as is obvious from FIG. 13.

Referring also to FIG. 14, the data DLL circuit block 71 has a DRAM internal data phase reproducing block 711 that operates in response to a data signal, an initialization signal and a clock signal. Connected to the data DLL circuit block 71 are a data receiving clock generator 712 and a data output clock generator 713.

The DRAM internal data phase reproducing block 711 is constructed of a clock reproducing circuit that reproduces clocks in response to clock signals and initialization signals, a phase determining circuit that compares the phases of data signals and initialization signals and outputs phase determination signals to the clock reproducing circuit, and a phase determining circuit that compares the phases of clock signals and reference phase clocks and outputs phase adjustment signals to the clock reproducing circuit.

In the DRAM internal data phase clock reproducing block 711, the phase determining circuit, which operates in response to an initialization signal and a data signal, determines that the data signal supplied in the form of a continuously reversing data signal as a pseudo clock signal if the initialization signal indicates initialization 1 and sends the phase of the data signal in the form of a phase determination signal to the clock reproducing circuit.

If the initialization signal indicates initialization 1, the clock reproducing circuit supplies the pseudo clock signal as a reference phase clock to the phase determining circuit. The clock reproducing circuit also generates, from the pseudo clock signal, a DRAM internal data phase frequency divided clock and a DRAM internal data phase delay frequency divided clock, and outputs these generated clocks to the data output clock generator 713 and the data receiving clock generator 712, respectively. Furthermore, the clock reproducing circuit shown in the figure outputs the DRAM internal data phase frequency divided 4-phase clocks DCLK1/2/3/4 to the clock comparing and discriminating circuit 73 shown in FIG. 13. For the normal operation other than the initialization operation, the phase determining circuit, which operates in response to clock signals and reference phase clocks, detects the phase difference between these two clock signals and outputs a phase adjustment signal to the clock reproducing circuit.

As shown in the figure, the data receiving clock generator 712 is constructed of a clock reproducing circuit and a phase determining circuit operating in response to DRAM internal data phase delay frequency divided clocks, and three buffers. The data receiving clock generator 712 outputs the foregoing DRAM internal data receiving clocks DCLKR and their frequency divided 4-phase clocks DCLKR1/2/3/4 to the data receiver and internal data generating circuit 75 shown in FIG. 13.

The data output clock generator 713 is constructed of a clock reproducing circuit and a phase determining circuit operating in response to DRAM internal data phase frequency divided clocks, three buffers and an output circuit replica. The data output clock generator 713 outputs DCLK0 and DCLK01/2/3/4 to the clock comparing and discriminating circuit 73 and the output data switching circuit 74, respectively.

In this configuration, data signals are not referred to after initialization. However, based on the phase difference between a data signal and a clock signal retained during initialization, the DRAM internal data phase clock reproducing block 711 generates an internal data phase clock, as shown in FIG. 16 (refer to DRAM internal data phase clock@DRAM18).

Figure 16:
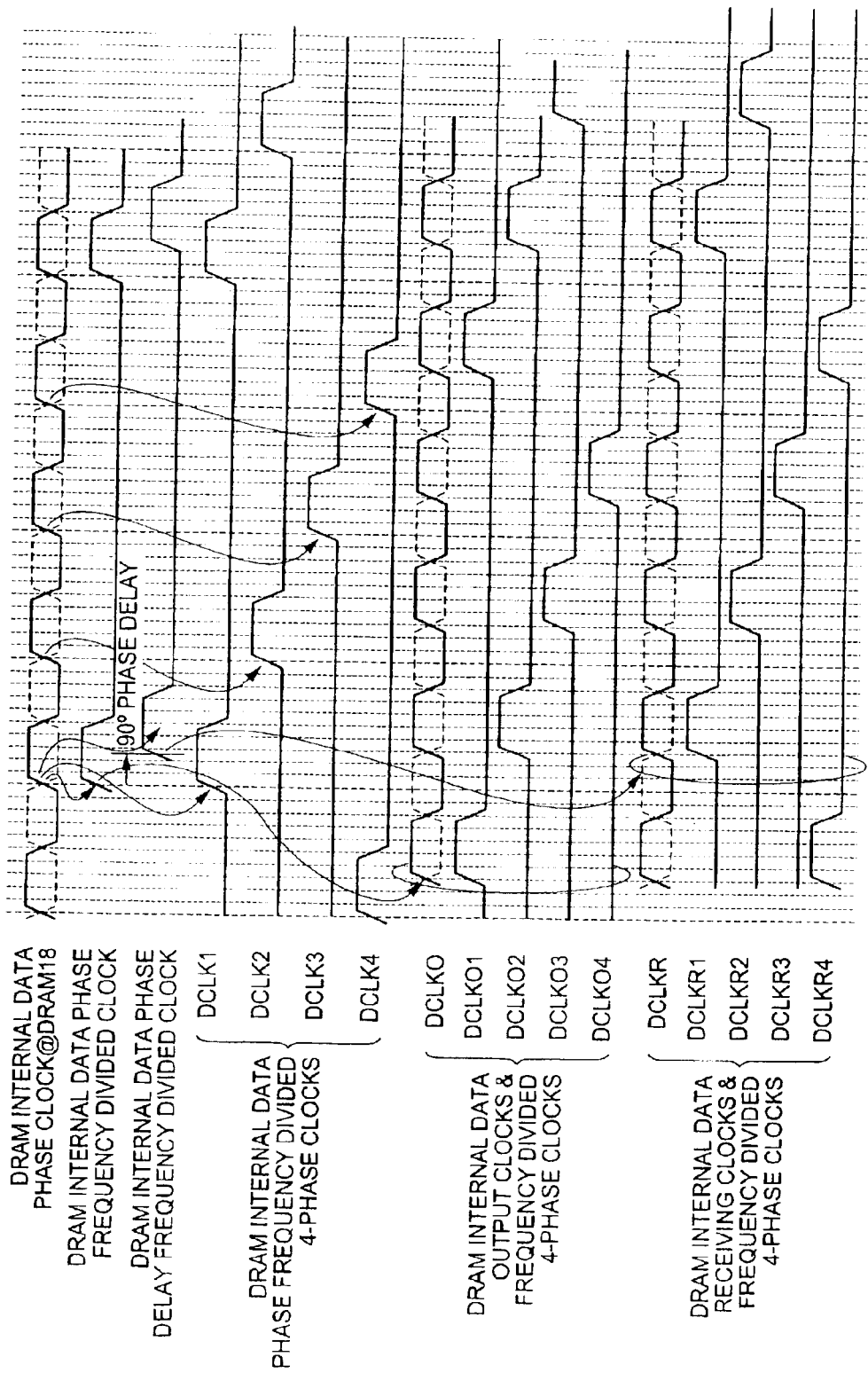
FIG. 16 is a timing chart illustrating various types of clocks shown in FIG. 13.

Referring also to FIG. 16, DRAM internal data phase quartered clocks DCLK1/2/3/4 obtained by quartering DRAM internal data phase clocks and DRAM internal data phase delay frequency divided clocks obtained by quartering clock signals with a phase delayed by 90 degrees are provided by the DRAM internal data phase clock reproducing block 711, and supplied to the data output clock generator 713 and the data receiving clock generator 712, respectively.

As previously described, the data output clock generator 713 and the data receiving clock generator 712 produce the DRAM internal output clock DCLK0 and the receiving clock DCLKR, and also produce their frequency divided 4-phase clocks DCLK01/2/3/4 and DCLKR1/2/3/4. The 4-phase clocks are generated by delaying the phase by 90 degrees from received frequency divided clocks. The receiving and transmitting clocks are generated by multiplying the frequency divided clocks by four times.

The DRAM internal data phase frequency divided 4-phase clocks DCLK1/2/3/4 are supplied from the DRAM internal data phase clock reproducing block 711 to the clock comparing and discriminating block 73. In this case, the three 4-phase frequency divided clocks are generated, each 4-phase clock is generated using "0" of the DRAM internal data phase frequency divided clocks as the reference, and 0 through 3 being associated therewith.

Referring now to FIGS. 13 and 15, the command/address DLL circuit block 72 will be described. The command/address DLL circuit block 72 shown in FIG. 15 is constructed of a clock reproducing circuit and a phase determining circuit that operate in response to clock signals, a buffer and another buffer for dividing a frequency in quarters. The command/address DLL circuit block 72 generates DRAM internal command/address receiving frequency divided 4-phase clocks CLK0/90/180/270 from clock signals.

These 4-phase clocks CLK0/90/180/270 are generated to discriminate a transfer destination where a command/address signal is to be transferred onto the timing of a DRAM internal data phase clock generated from a data signal after a command/address signal is received. Performing frequency division permits handling even if a time difference for the transferring exceeds a clock cycle.

In the embodiments described above, quadruple-frequency clocks have been used to allow a signal to be transferred onto a different timing with an adequate margin with respect to the wiring delay (1003 ps) in an operation at 1 Gbps or more. In general, however, n-fold frequency divided clocks may be used.

Figure 17:
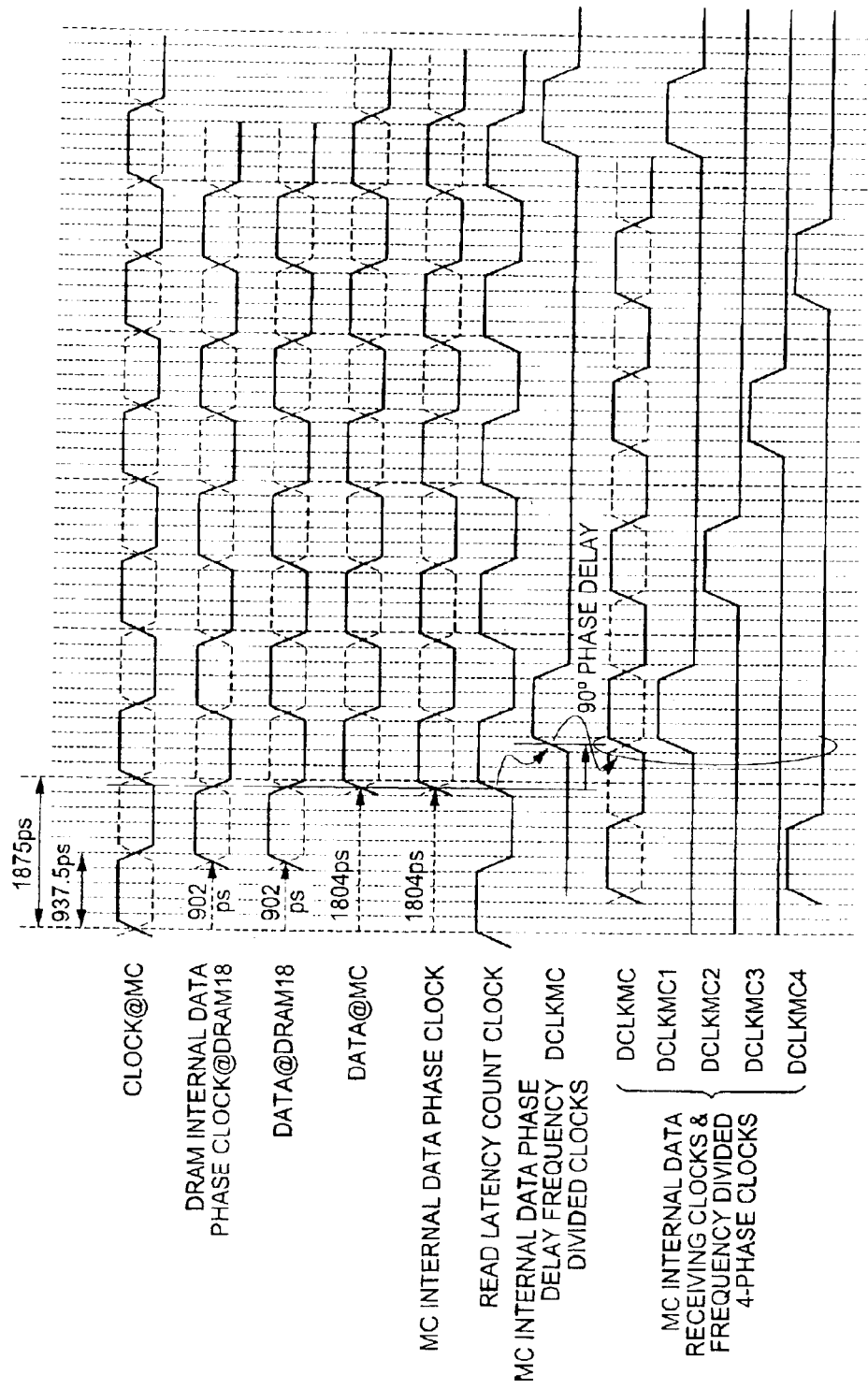
FIG. 17 is a timing chart illustrating the operation timings of a memory controller (MC) used with the first example of the present invention.

Referring now to FIG. 17, the next step, i.e., initialization 2, performed in the MC will be explained. In this case, a continuously reversing data signal is transmitted to the MC from a DRAM. As indicated by data@DRAM18 shown in FIG. 17, the continuously reversing data signal from the DRAM 18 is output as a pseudo data signal by being matched at the rising and falling edges of the DRAM internal data phase clock (refer to DRAM internal data phase clock@DRAM18) generated by the DRAM during initialization 1, delayed by 902 ps before reaching the MC.

As in the DRAM, the MC generates an MC internal data phase clock from the pseudo data signal, and an MC internal data phase delay frequency divided clock, an MC internal data receiving clock DCLKMC, and 4-phase frequency divided clocks DCLKMC1/2/3/4 are generated. Then, the matching of timing is performed to receive data from the DRAMs. The configuration of the MC will be discussed later with reference to FIG. 28.

If a memory system has a plurality of ranks, then the initialization has to be performed for each rank. In this case, the MC retains data phase for each rank. This matches the clock timings of the DRAMs and the MC. Even when the clock timings of the DRAMs and the MC have been matched, it is still necessary to discriminate the clock timing at which data is transferred between the DRAMs and the MC.

Hence, in the DRAMs, initialization 3 for determining the destination where a signal is transferred from the aforesaid clock timing to the data phase timing.

Figure 18:
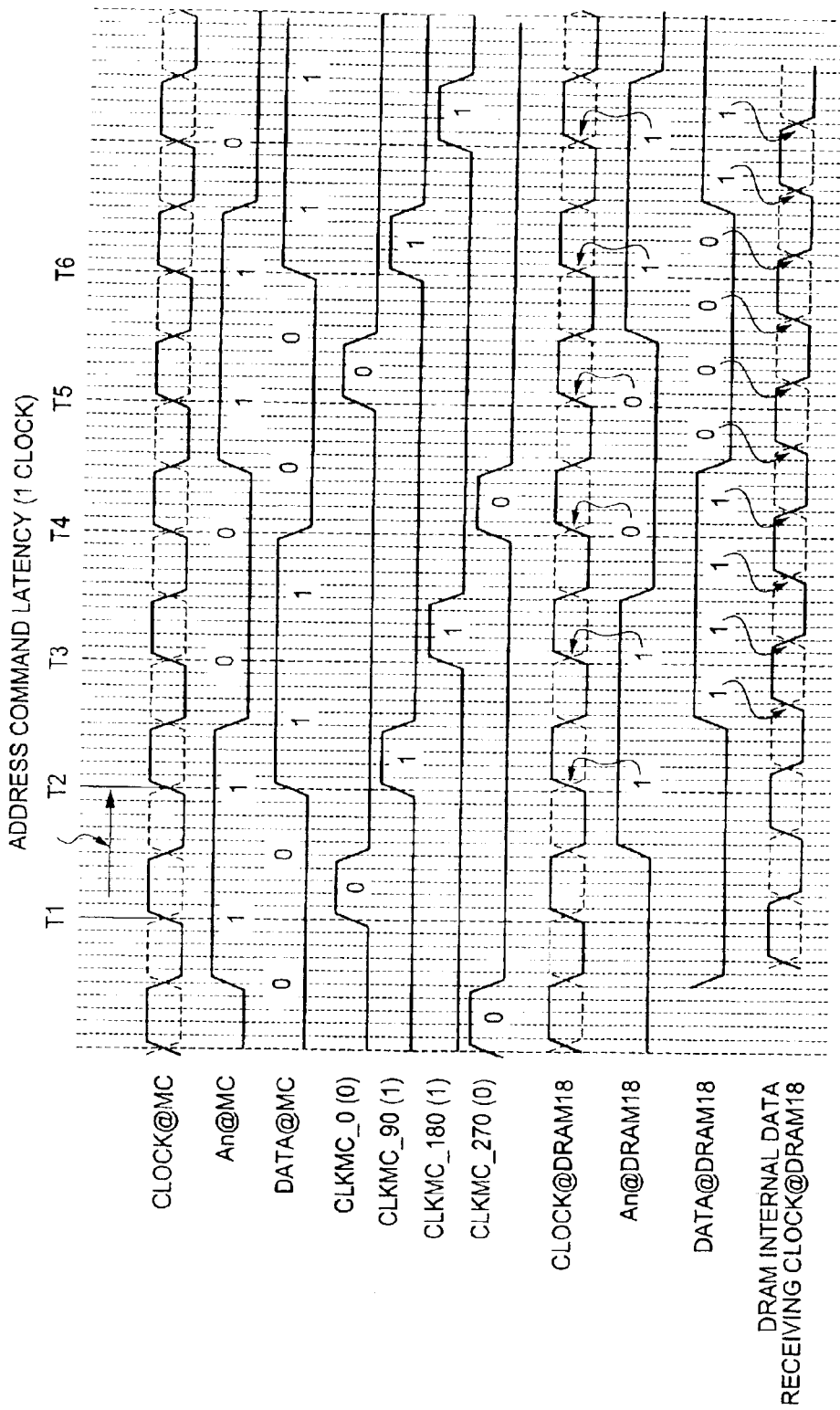
FIG. 18 is a timing chart illustrating the transfer of data between the DRAM and the MC in the first example of the present invention.

FIG. 18 shows a timing chart of initialization 3, wherein the clocks generated in the DRAMs and the individual frequency divided clocks based on data timings, i.e., the command address receiving frequency divided 4-phase clocks, and the DRAM internal data phase frequency divided 4-phase clocks are associated. For this purpose, a signal of a quartered frequency cycle is transmitted for one address signal and one data signal from the MC and received by a DRAM.

By associating each rising timing with one frequency divided clock that provides a corresponding rising timing, the transfer from a clock timing to a data phase timing is accomplished.

Figure 19:
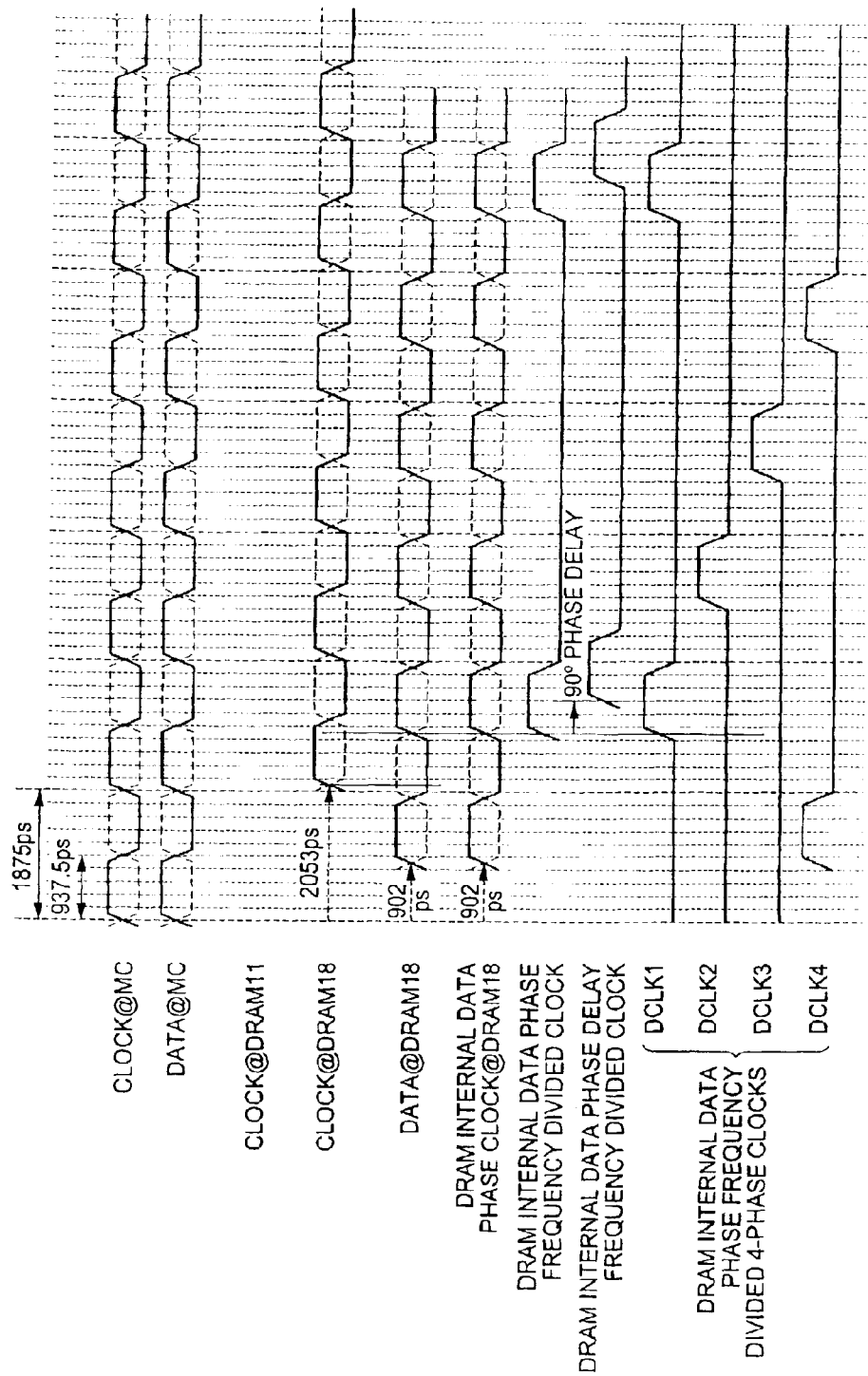
FIG. 19 is a timing chart illustrating the data internal clocks in the first example of the present invention.

The timing chart shown in FIG. 19 will be referred to before starting the explanation in conjunction with FIG. 18. As shown in FIG. 19, if the data signal were transmitted from the MC at the same time with a clock signal, then the clock signal would reach the DRAM 18 at the far end in a rank with a time lag. This means that a command would be supplied later than data in the DRAM, disabling the DRAM.

To solve the problem, the phase of the quartered signal to be transmitted through the data line DA is delayed one clock, as indicated by data@MC shown in FIG. 18. More specifically, when a command signal is transmitted from the MC to the DRAM at the rise of the clock of T1, it is transferred, in the DRAM, onto the data phase clock associated with the clock edge of the timing of T2 in the MC. This sets the destination where the command address is transferred from a DRAM internal clock timing to a data clock timing.

The MC counts the number of clocks and recognizes that a command is executed in a DRAM with one-clock effective delay. In other words, the MC recognizes that an address/command latency lasts for one clock. In this embodiment, the delay is set to one clock; however, if it is necessary to increase the delay, a greater number of clocks is set in MC.

Figure 20:
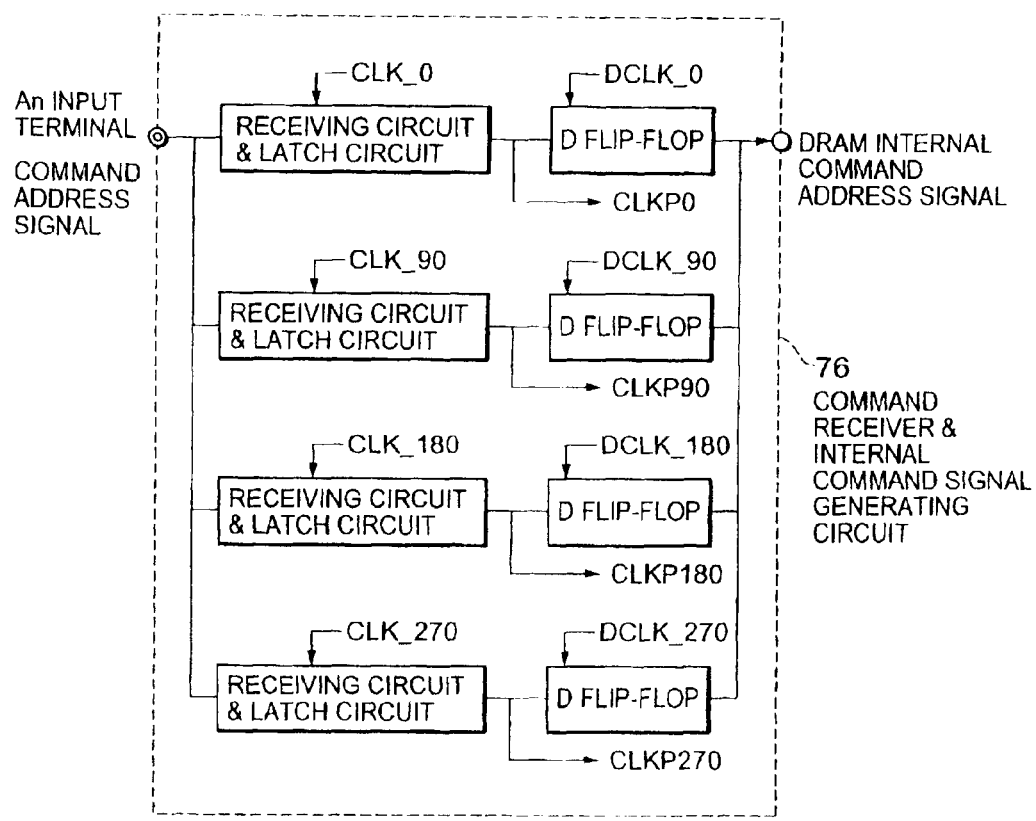
FIG. 20 is a block diagram showing a command receiver and internal command signal generating circuit used with the DRAM shown in FIG. 13.
Figure 21:
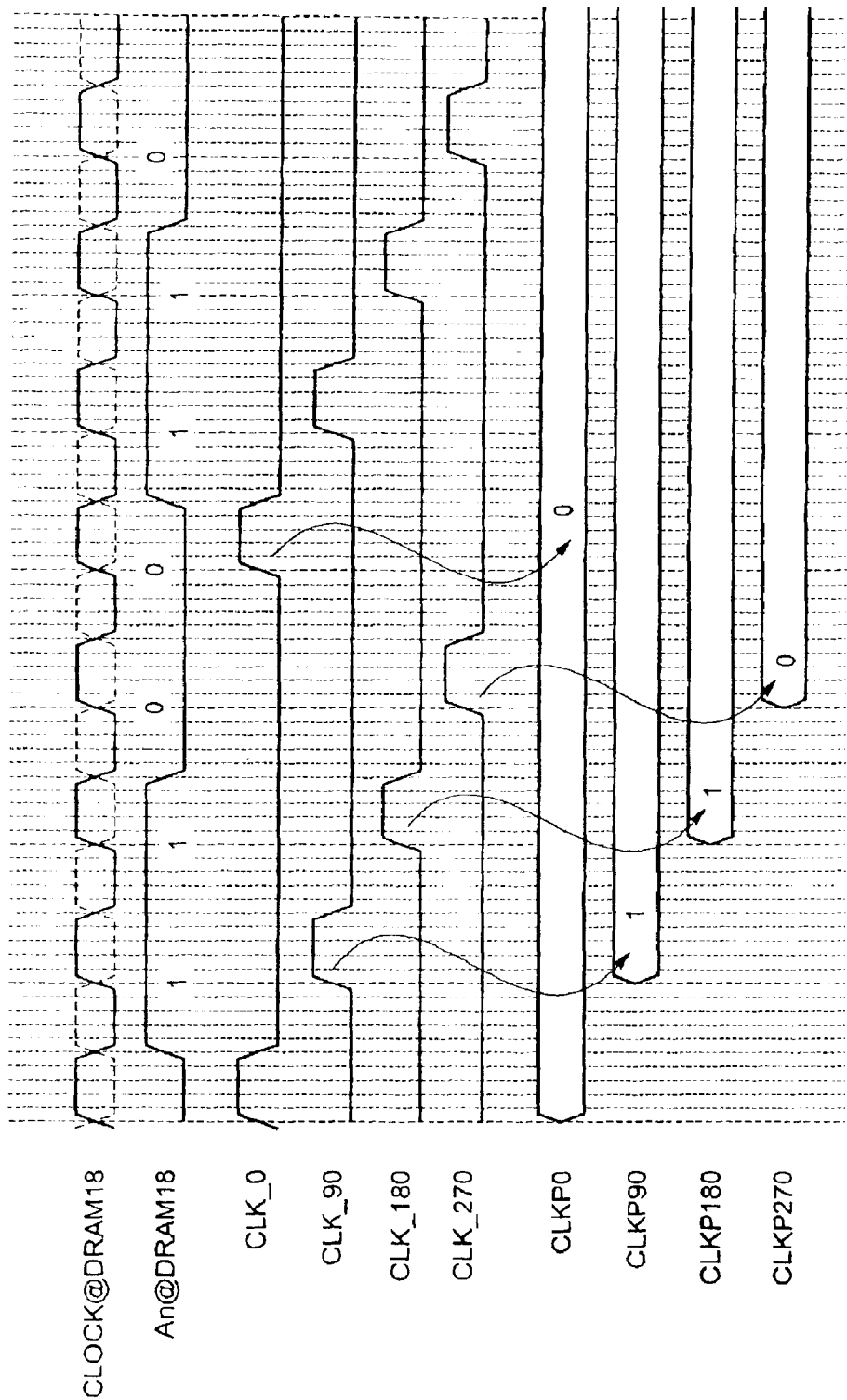
FIG. 21 is a timing chart illustrating the initializing operation for receiving command/address in the DRAM shown in FIG. 13.

FIGS. 20 and 21 show a command receiver and an internal command signal generating circuit 76 of the DRAM shown in FIG. 13, and the operational waveforms in initialization 3 thereof, respectively. The command receiver and the internal command signal generating circuit 76 shown in FIG. 20 receive a command/address signal (An) through an input terminal and outputs a DRAM internal command/address signal. For this purpose, the circuit shown in the figure is constructed of four receiver and latching circuits and four D flip-flops.

Referring also to FIG. 21, a command/address signal is supplied through a command/address signal terminal (An input terminal) to the four receivers and latching circuits provided in the command receiver and the internal command signal generating circuit 76. It is assumed that an address signal An is supplied as a command/address signal (refer to An@DRAM18). The address signal An is generated by the MC at the rise of a clock signal, and received by the DRAM 18. In this example, as the address signal An, "110011" is received by the DRAM 18 (refer to An@DRAM 18). In this case, the address signal An is transmitted and received in the form of a continuously reversing data signal.

The four receiver and latching circuits (R&L) shown in FIG. 20 also receive the clocks of four different phases CLK0/90/180/270 obtained by dividing in quarters a clock signal received from the command/address DLL circuit block 72 shown in FIG. 13. Hence, the command/address signals are respectively latched in the four receiver and latching circuits by the 4-phase clocks CLK0/90/180/270. In this case, the clocks CLK0/90/180/270 are the DRAM internal command address receiving frequency divided 4-phase clocks, and indicate the phases for receiving the command addresses in the DRAM.

The latching results are supplied as the command address clock discriminating data signals CLKP0/90/180/270 to the clock comparing and discriminating block 73 shown in FIG. 13 and also to the command receiver and the D flip-flops (hereinafter referred to as "DF/Fs") in the internal command signal generating circuit 76.

In the example shown in FIG. 21, the address signal An is latched by a clock CLK0/90/180/270, and the command address clock discriminating data signal CLKP0/90/180/270 at 0110 is output from the four receiver and latching circuit (R&Ls), as shown in the figure.

The DF/Fs receive the DRAM internal command matching 4-phase clocks DCLK0/90/180/270, and the DRAM internal command address signals are output to the DRAMs according to the DCLK0/90/180/270. This means that the clocks of the command/address signals are matched to the clocks of data signals by the DF/Fs, that is, the DRAM internal command/address signals are transferred to the timings of the DRAM internal command matching 4-phase clocks DCLK0/90/180/270.

Figure 22:
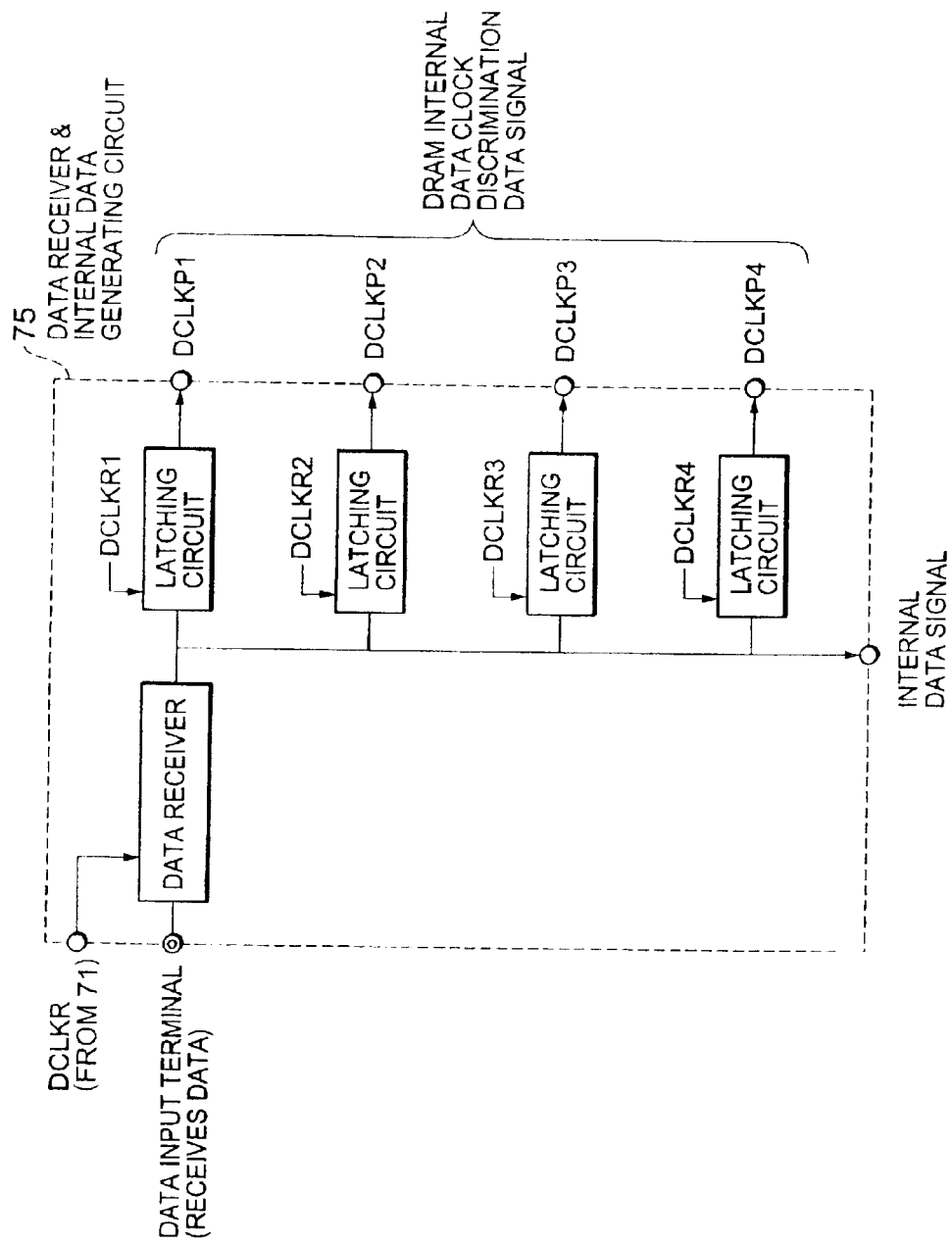
FIG. 22 is a block diagram illustrating a data receiver and internal data generating circuit shown in FIG. 13.

FIG. 22 shows a specific circuit configuration of the data receiver and internal data generating circuit 75 shown in FIG. 13. The data receiver and internal data generating circuit 75 includes a data input terminal for receiving data signals and an output terminal for outputting the DRAM internal data clock discriminating data signals DCLKP1/2/3/4. Data signals from the data input terminal are supplied to the data receiver.

The data receiver receives data signals at the timings of the DRAM internal data receiving clocks DCLKR, and the received data signals are latched by the four latches at the timings of the frequency divided 4-phase clocks DCLKR1/2/3/4. The frequency divided 4-phase clocks DCLKR1/2/3/4 are being applied to the four latching circuits, so that the latched data signals are divided in quarters to be the DRAM internal data clock discriminating data signals DCLKP1/2/3/4.

Figure 23:
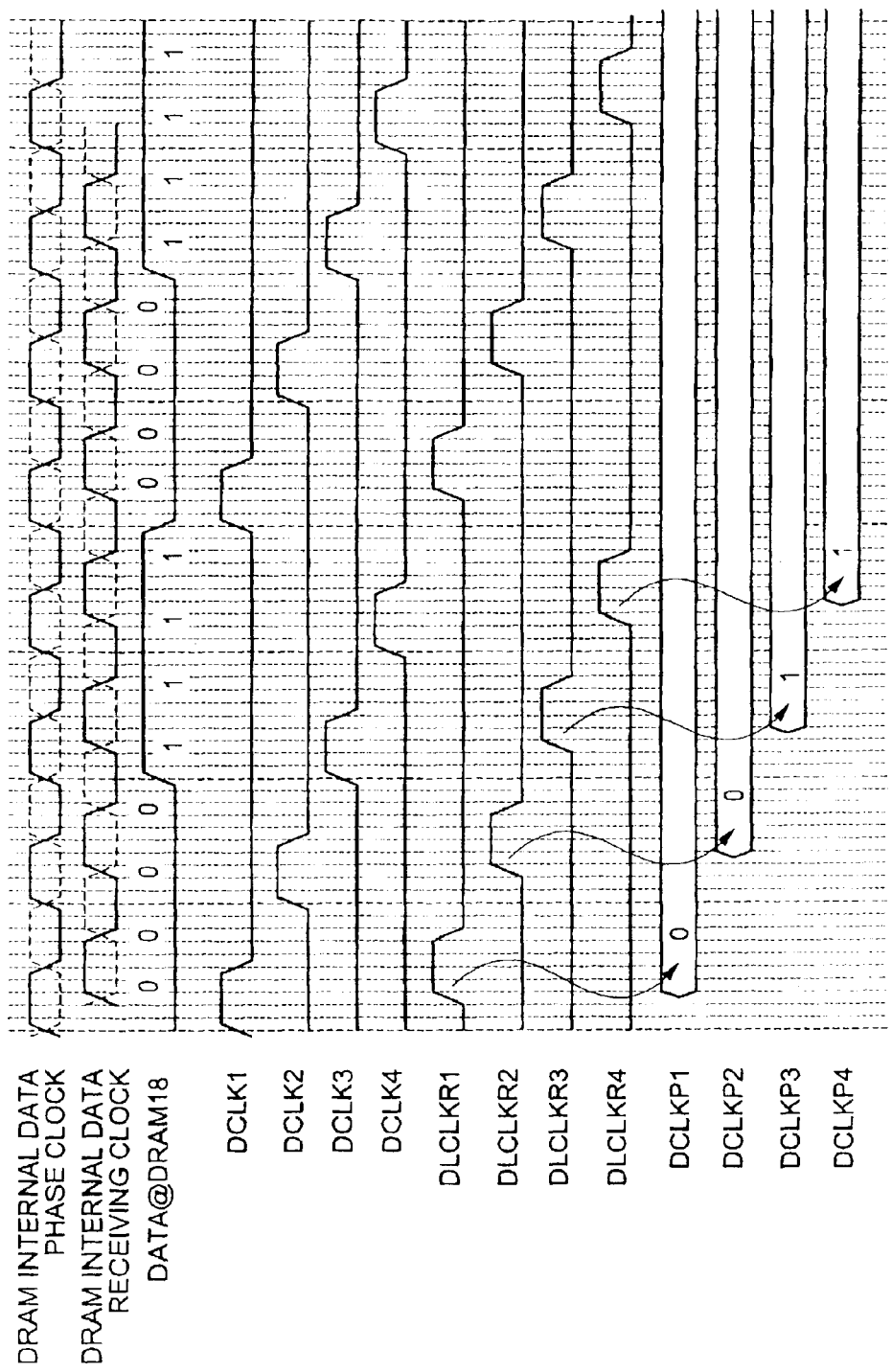
FIG. 23 is a timing chart illustrating the internal operation at the data clock side in FIG. 13.

FIG. 23 shows a DRAM internal data receiving clock DCLKR delayed by 90 degrees with respect to the DRAM internal data phase clock and the frequency divided 4-phase clocks DCLKR1 through DCLKR4 obtained by dividing the clock DCLKR in quarters. These clocks are supplied to the data receiver and latching circuits. In the illustrated example, data strings (continuously reversing data strings) of 0000111100001111 are supplied as a data signal. These data strings are received by the data receiver at the front edges of DCLKR, and the received data signals are latched by the latching circuits at the timings of DCLKR1 through DCLKR4. As a result, the latching circuits output the DRAM internal data clock discriminating signals DCLKP1 through DCLKP4 of 0011, as shown in FIG. 23.

Thus, the command address clock discriminating data signals and the internal data clock discriminating data signals are respectively output from the command receiver and internal command signal generating circuit 76 and the data receiver and internal data signal generating circuit 75 shown in FIGS. 20 and 22.

Figure 24:
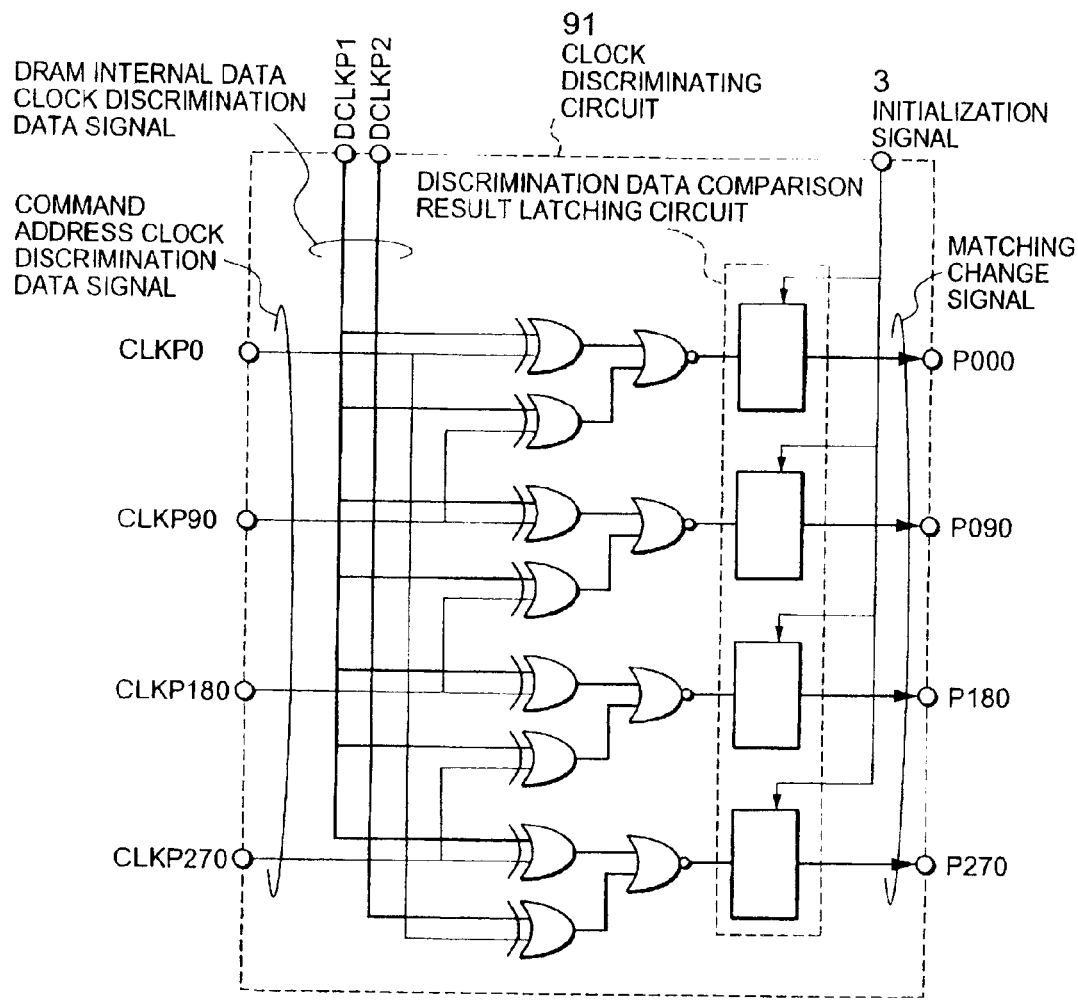
FIG. 24 is a block diagram showing a clock discriminating circuit used with the DRAM in FIG. 13.

FIG. 24 shows a clock discriminating circuit 91 provided in the clock comparing and discriminating block 73. A clock discriminating circuit 91 receives the foregoing DRAM internal data clock discriminating data signals DCLKP1/2/3/4 and the command address clock discriminating data signals CLKP0/90/180/270. The clock discriminating circuit 91 compares the above two types of discriminating data signals and outputs the matching change signals P000, P090, P180 and P270. The illustrated clock comparing and discriminating circuit 91 determines whether adjoining DCLKP1/2 and command address clock discriminating data signals CLKP0/90/180/270 among the DRAM internal data clock discriminating data signals DCLKP1/2/3/4 match or mismatch by an exclusive OR circuit and a NOR circuit. The determination results are latched in the latching circuits. The latching circuits take out the determination results according to an initialization signal 3 indicating initialization 3 to generate matching change signals P000, P090, P180 and P270. Referring to FIG. 24, if, for example, CLKP0 and DCLKP1 match, and CLKP90 and DCLKP90 also match, then the output of a NOR circuit on these data signals will be logic "1." In an active state set by the initialization signal 3, logic "1" is latched as a matching change signal P000 in the discriminating data comparison result latching circuit. This means that the adjoining CLKP0 and CLKP90 are the same data signals as the adjoining DCLKP1 and DCLKP2. Thus, in the illustrated clock discriminating circuit 91, if adjoining CLKP0 and CLKP90, CLKP90 and CLKP180, CLKP180 and CLKP270, and CLKP270 and CLKP0 match the adjoining DCLKP1 and DCLKP2, then the data signals and clock signals can be matched at that phase. In the example shown in FIGS. 21 and 23, logic 0 applies to CLKP270 and CLKP0, and logic 0 applies to DCLKP1 and DCLKP2, meaning that the adjoining discrimination data signals coincide with each other, so that the matching change signal P270 is output.

The clock comparing and discriminating block 73 is provided with an internal command matching clock generating circuit 92 (FIG. 25) in addition to the foregoing clock discriminating circuit 91. The internal command matching clock generating circuit 92 constructed of tristate buffers and a buffering circuit receives DRAM internal data phase frequency divided 4-phase clocks DCLK1/2/3/4 and matching change signals P000, P090, P180 and P270, switches 4-phase clock DCLK1/2/3/4 according to the matching change signals P000, P090, P180 and P270, and outputs as the DRAM internal command matching 4-phase clocks DCLK0/90/180/270. As previously described, when the matching change signal P270 is output from the clock discriminating circuit 91 shown in FIG. 24, DCLK1 is output as DCLK0, DCLK2 as DCLK90, DCLK3 as DCLK180, and DCLK4 as DCLK270, respectively. This causes the DRAM internal data phase frequency divided 4-phase clocks DCLK1 through DCLK4 to be changed to the DRAM internal command matching 4-phase clocks DCLK0 through DCLK270 in response to matching change signals P000 through P270.

The changed internal command matching 4-phase clocks DCLK0/90/180/270 correspond to internal data phase clocks and supplied to the command receiver and internal command signal generating circuit 76 shown in FIG. 20. As a result, the DF/Fs of the command receiver and internal command signal generating circuit 76 transfer the phase timings of command/address signals on the basis of DCLK0/90/180/270.

Figure 26:
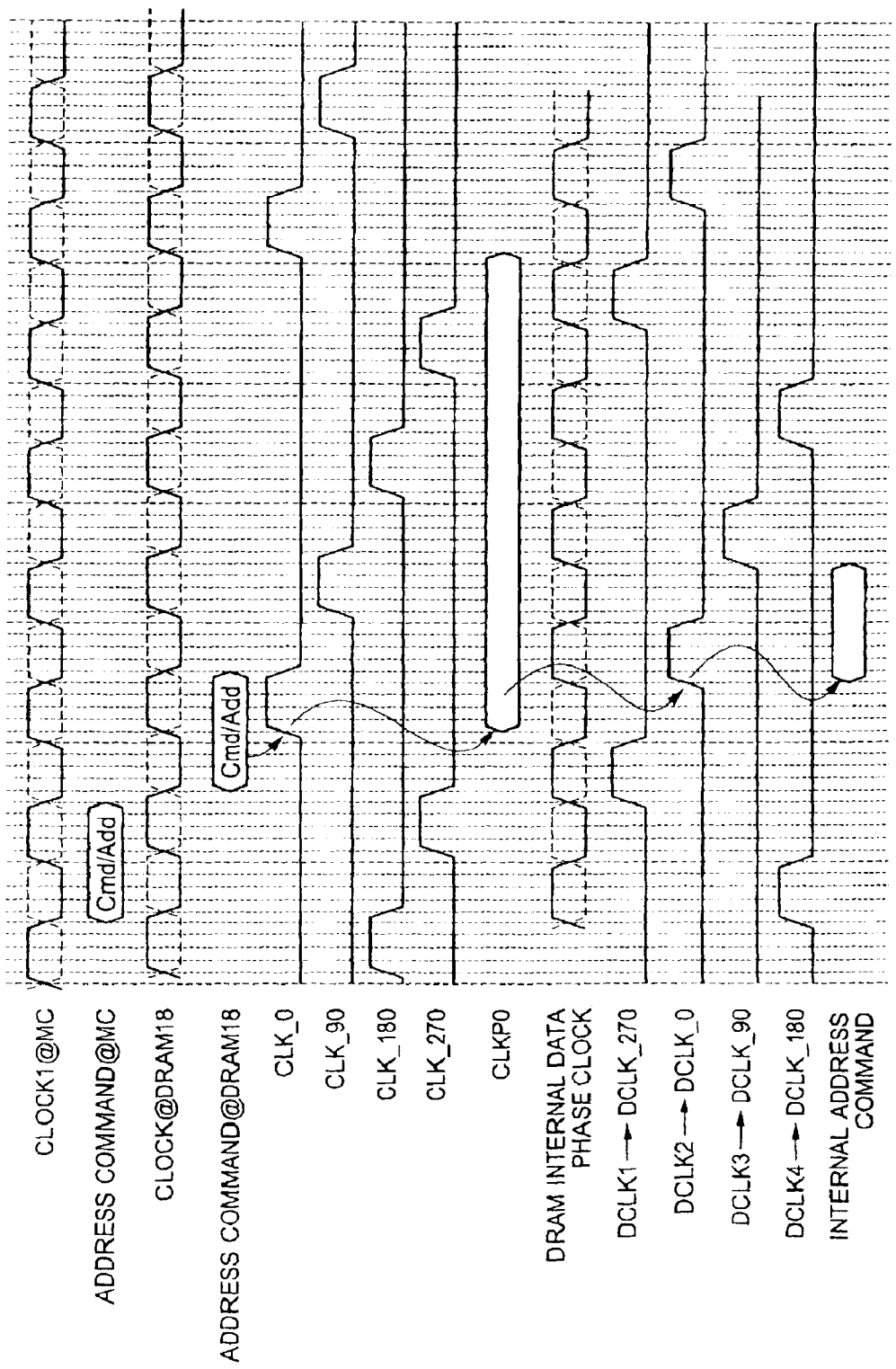
FIG. 26 is a timing chart illustrating the operation of the circuit shown in FIG. 25.

FIG. 26 illustrates a procedure for transferring a command signal captured at a clock signal timing during normal operation onto the timing of a DRAM internal data phase clock in a DRAM so as to turn it into an internal command signal. As shown in FIG. 26, it is assumed that an address command Cmd/Add (refer to address command@MC) output from the MC at the timing of a clock (clock@MC) has reached the DRAM 18 by being matched to a clock of the DRAM 18 (clock@DRAM18) shown in FIG. 26 (refer to address command@DRAM18). When a clock signal is received together with a command signal, the command address DLL circuit block 72 shown in FIG. 13 generates a frequency divided 4-phase clock CLK0/90/180/270 from the received clock signal and sends the generated signal to the command receiver and internal command signal generating circuit 76.

The command receiver and internal command signal generating circuit 76 captures the address command Cmd/Add at the CLK0 timing, and the clock discriminating data signal CLKP0 is sent out to the clock comparing and discriminating block 73.

The data DLL circuit block 71 in the DRAM generates the internal data phase clock DCLK for data and its data phase frequency divided 4-phase clocks DCLK1 through DCLK4. By performing the aforesaid operation, the clock comparing and discriminating block 73 transfers CLKP0 onto the command matching 4-phase clocks DCLK270, 0, 90 and 180 from the data phase frequency divided 4-phase clocks DCLK1/2/3/4 and supplies them to the command receiver and internal command signal generating circuit 76. In this example, the command receiver and internal command signal generating circuit 76 transfers the internal address command signal from the DCLK2 timing onto the DCLK0 timing to capture an internal address command at the internal timing, and supplies the captured internal address command into a DRAM.

By the procedure described above, a normal command address signal, including a command that is not timing-transferred, such as an initialization signal, is captured in the DRAM by being matched to a clock signal. An internal operation command is generated by being transferred onto an internal data phase clock timing. In this example, from the MC, if the number of clocks is counted, seemingly taking one clock for address command latency into account, then the operation of a DRAM can be grasped in synchronization with the clock. The DRAMs disposed in parallel in a rank have different timings for capturing commands because of the propagation time lags of clocks; however, after the commands are matched to a data phase, they are matched to the same clock phase, as observed from the MC.

Subsequently, the clock timing in the MC is associated with the data phase timing transmitted from a DRAM. In other words, an operation is performed to make it possible to discriminate when the data which is associated with a particular read command and output from a DRAM arrives at the MC. The initializing operation performed for that purpose by the MC is referred to as initialization 4, as previously mentioned.

Figure 27:
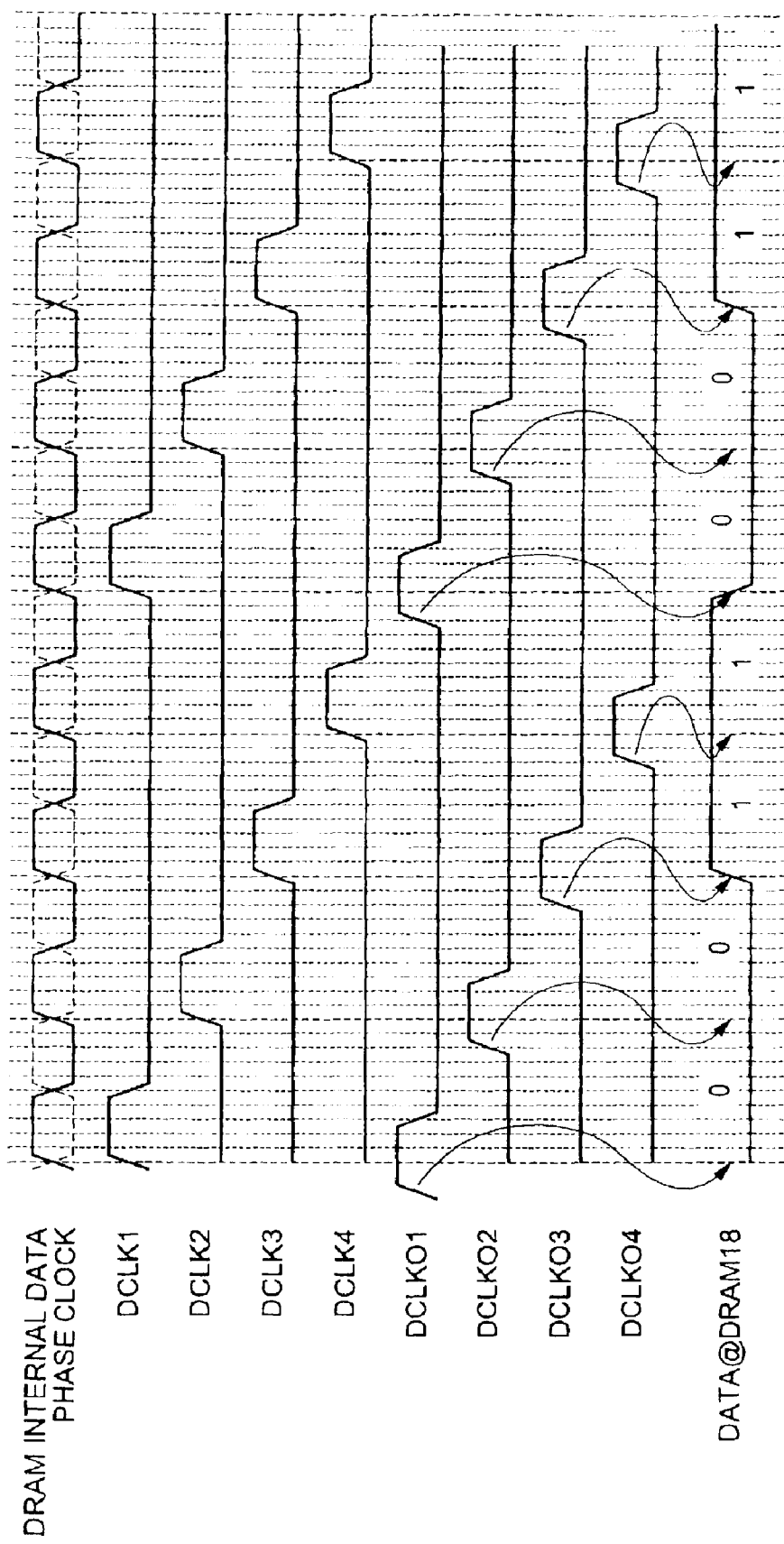
FIG. 27 is a timing chart illustrating another internal operation of the DRAM shown in FIG. 13.

In this case, as shown in FIG. 27, a DRAM internal data phase clock is generated and the clock is divided in quarters to produce DRAM internal data phase frequency divided 4-phase clocks DCLK1 through DCLK4 in the above DRAM. Furthermore, DRAM internal data output frequency divided 4-phase clocks DCLK01 through DCLK04 are supplied from the data DLL circuit block 71 to the output data switching circuit 74. In this state, the continuously reversing data (00110011) from the continuously reversing data generating circuit 78 is generated by being matched to DCLK01 through DCLK04. More specifically, the discrimination data supplied to discriminate data phases is now transmitted to the MC from the DRAM by being associated with the timings of the 4-phase frequency divided clocks DCLK01 through DCLK04. In the example of FIG. 27, a data signal (0011) is output from the DRAM 18 through a data line at the timings of the DRAM internal data output frequency divided 4-phase clocks DCLK01/2/3/4 (refer to data@DRAM18 in FIG. 27).

Figure 28:
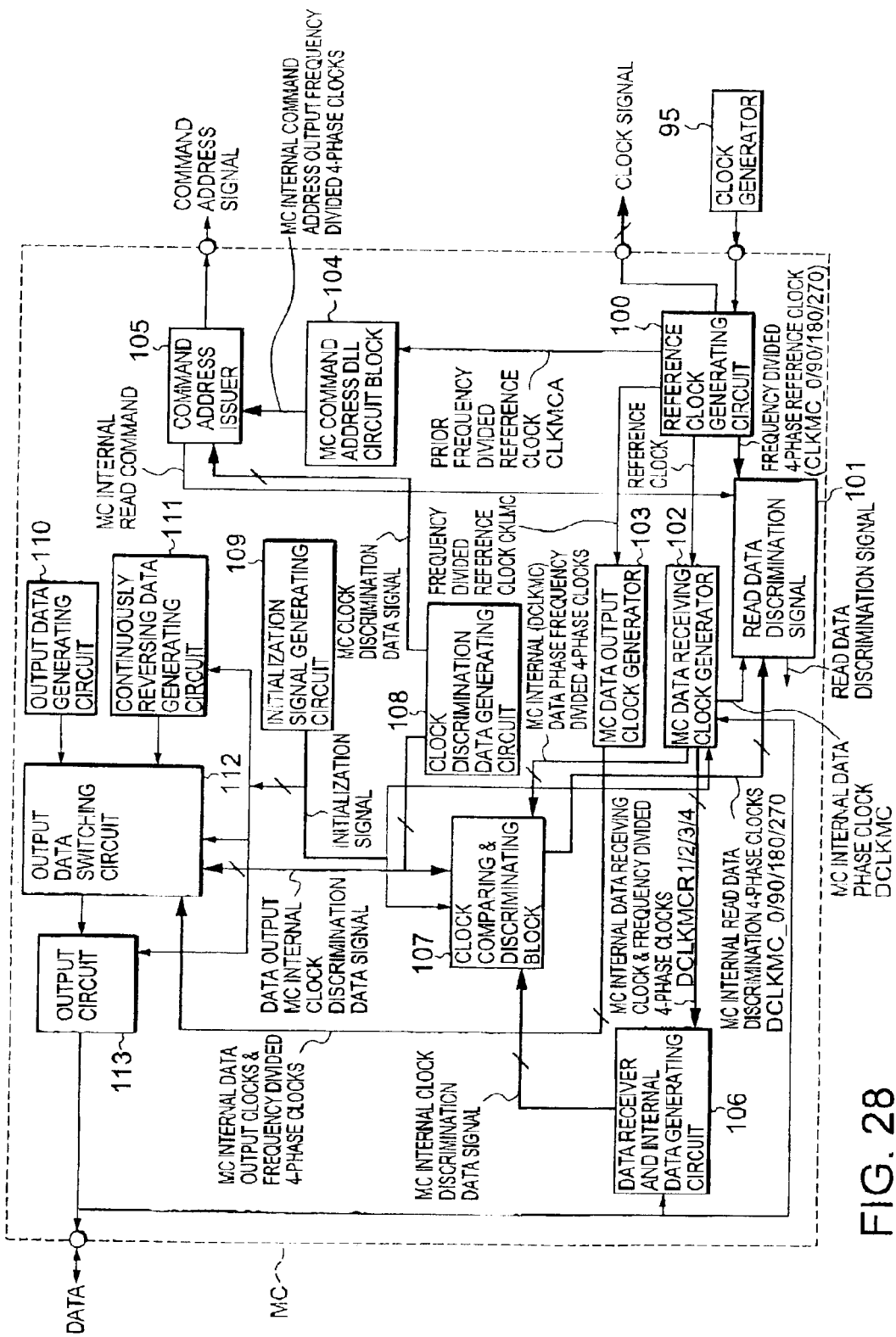
FIG. 28 is a block diagram for explanation an MC used in combination with the DRAM shown in FIG. 13.

Referring now to FIG. 28, an example of a MC capable of performing initializations 2 and 4 discussed above will be explained. As shown in the figure, the MC has a reference clock generating circuit 100 that generates, from a clock received from a clock generator 95, a reference clock and frequency divided 4-phase reference clocks CKLMC_0/90/180/270 obtained by quartering the reference clock. The MC shown in the figure further includes a read data discriminating signal generating circuit 101 actuated upon receipt of the frequency divided 4-phase reference clocks CKLMC_0/90/180/270 from the reference clock generating circuit 100, an MC data receiving clock generator 102 actuated upon receipt of a reference clock, an MC data output clock generator 103 actuated upon receipt of a frequency divided reference clock CKLMC, an MC command address DLL circuit block 104 actuated upon receipt of a prior frequency divided reference clock CLKMCA, and a command address issuer 105 connected to the MC command address DLL circuit block 104.

The MC further includes a data receiver and internal data generating circuit 106, a clock comparing and discriminating block 107, a clock discriminating data generating circuit 108, an initialization signal generating circuit 109, an output data generating circuit 110, a continuously reversing data generating circuit 111, an output data switching circuit 112, and an output circuit 113.

Figure 29:
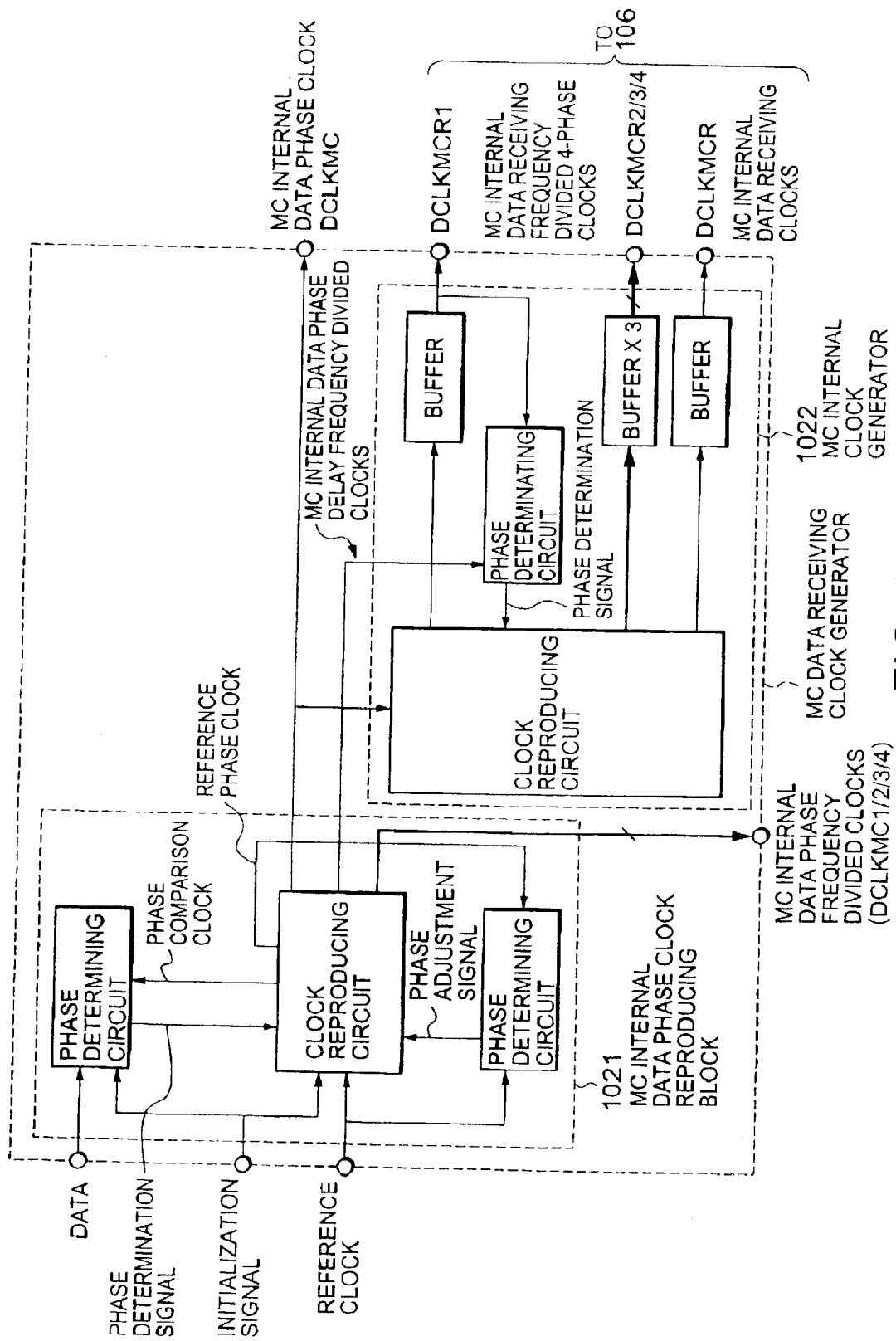
FIG. 29 is a block diagram showing an MC data receiving clock generator used with the MC shown in FIG. 28.
Figure 30:
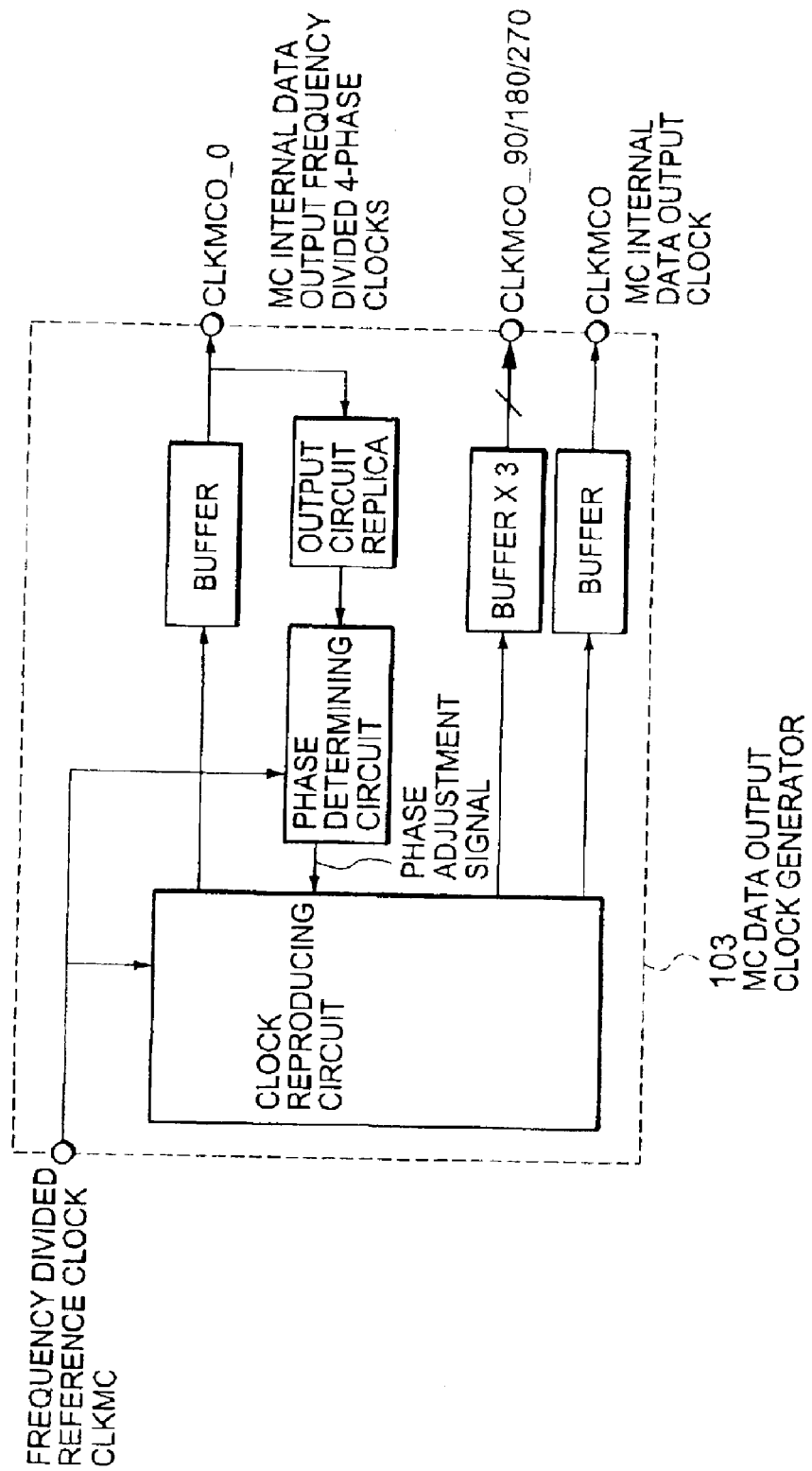
FIG. 30 is a block diagram showing an MC data outputting clock generator used with the clock discriminating circuit shown in FIG. 24.
Figure 31:
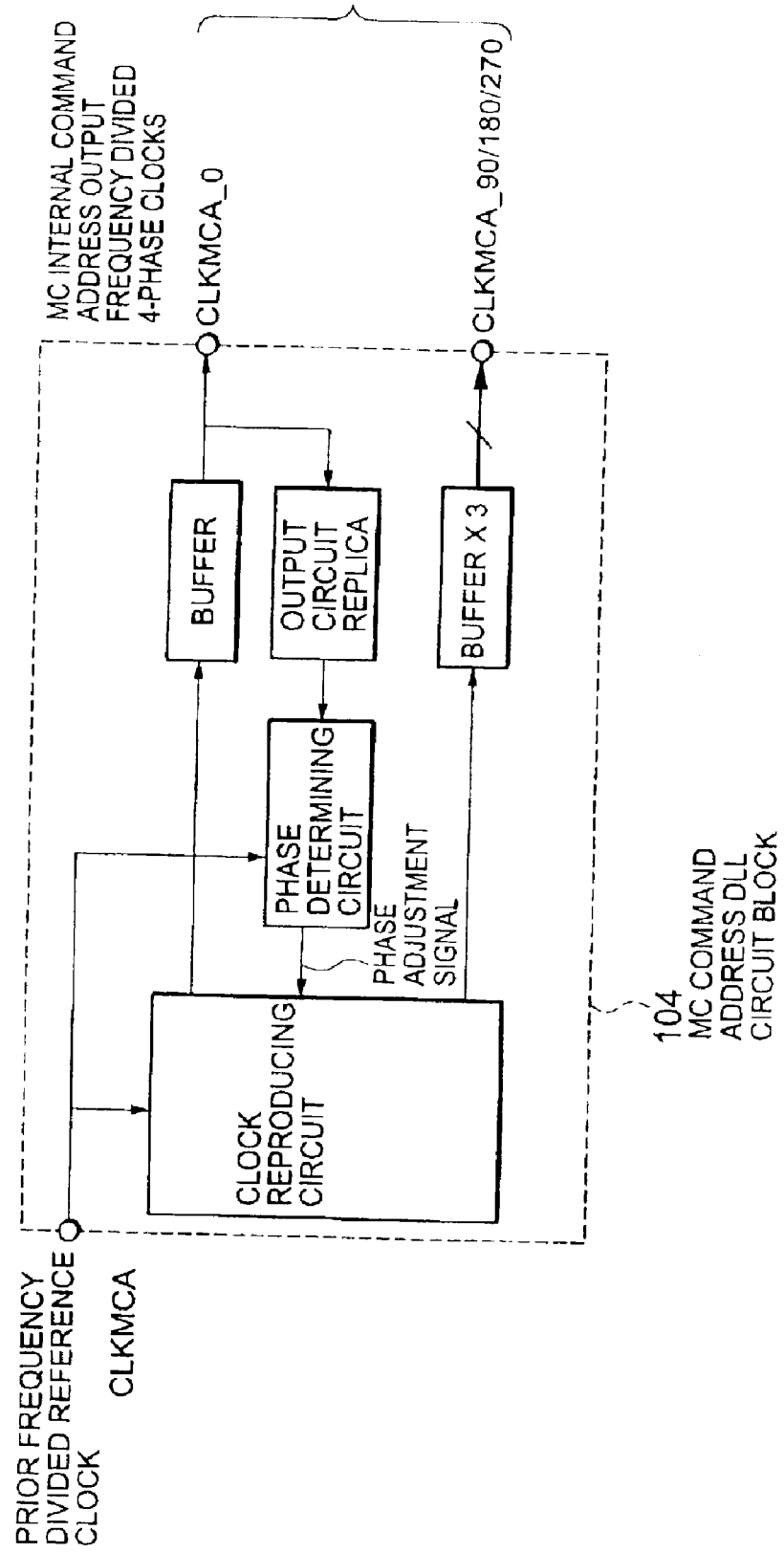
FIG. 31 is a block diagram showing an MC command/address DLL circuit block used with the circuit shown in FIG. 24.

Among the above components, the MC data receiving clock generator 102, an MC data output clock generator 103 and the MC command address DLL circuit block 104 have the configurations shown in FIGS. 29, 30 and 31.

Referring to FIGS. 28 and 29, the MC data receiving clock generator 102 receives data signals from a DRAM, initialization signals from the initialization signal generating circuit 109 and reference clocks from the reference clock generating circuit 100, and outputs MC internal data phase clocks DCLKMC, MC internal data receiving frequency divided 4-phase clocks DCLKMCR1/2/3/4, MC internal data receiving clocks DCLKMCR, and MC internal data phase frequency divided 4-phase clocks DCLKMC1/2/3/4.

The MC data receiving clock generator 102 is provided with an MC internal data phase clock reproducing block 1021 and an MC internal clock generator 1022. The MC internal data phase clock reproducing block 1021 is constructed of a clock reproducing circuit and two phase determining circuits, and the clock reproducing circuit outputs MC internal data phase clocks DCLKMC and the MC internal data phase delay frequency divided clocks according to phase determination signal and phase adjustment signals from the phase determining circuit, as shown in the figure. This operation is virtually the same as the operation of the DRAM internal data phase clock reproducing block 711 described with reference to FIG. 14. When initialization is carried out, the MC internal data phase frequency divided 4-phase clocks DCLKMC1/2/3/4, the MC internal data phase delay frequency divided clocks and the MC internal data phase clocks DCLKMC are output on the basis of the continuously reversing data signals received from a DRAM.

The MC internal clock generator 1022 constructed of a clock reproducing circuit, a phase determining circuit and three buffers sends out the MC internal data receiving frequency divided 4-phase clocks DCLKMCR1/2/3/4 and the MC internal data receiving clock DCLKMCR on the basis of the MC internal data phase clock DCLKMC and the MC internal data phase delay frequency divided clock, as in the case of the DRAMs.

In this case, the MC internal data receiving clocks DCLK-MCR and the MC internal data receiving frequency divided 4-phase clocks DCLKMCR1/2/3/4 are output to the data receiver and internal data generating circuit 106, while the MC internal data phase clocks DCLKMC are supplied to the read data discrimination signal generating circuit 101. Furthermore, the MC internal data phase frequency divided 4-phase clocks DCLKMC1/2/3/4 are sent out to the clock comparing and discriminating block 107.

Referring now to FIGS. 28 and 30, the MC data output clock generator 103 used with the MC receives the frequency divided reference clocks CLKMC from the reference clock generating circuit 100 to generate the MC internal data output clock CLKMC0, and also sends out the MC internal data output frequency divided 4-phase clocks CLKMC0_0/90/180/270 to an output data switching circuit 112. For this purpose, the MC data output clock generator 103 shown in FIG. 30 is formed of a clock reproducing circuit, an output circuit replica, a phase determining circuit and three buffers.

Referring to FIGS. 28 and 31, the MC internal command address DLL circuit block 104 constructed of a clock reproducing circuit, a phase determining circuit, two buffers and an output circuit replica outputs the MC internal command address output frequency divided 4-phase clocks CLKMCA_0/90/180/270 based on the prior frequency divided reference clocks CLKMCA to the command address issuer 105. The command address issuer 105 receives CLKMCA_0/90/180/270 and MC clock discrimination data signals and outputs command/address signals to the DRAMs, and also outputs MC internal read commands to the read data discrimination signal generating circuit 101.

As shown in FIG. 28, in the MC clock comparing and discriminating block 107, data receiving MC internal clock discrimination signals, data output MC internal clock discrimination data signals and MC internal data phase frequency divided 4-phase clocks (DCLKMC1/2/3/4) are received from the data receiver and internal data generating circuit 106, the clock discrimination data generating circuit 108 and the MC data receiving clock generator 102, respectively, and MC internal read data discrimination 4-phase clocks (DCLKMC_0/90/180/270) are output to the read data discrimination signal generating circuit 101.

Figure 32:
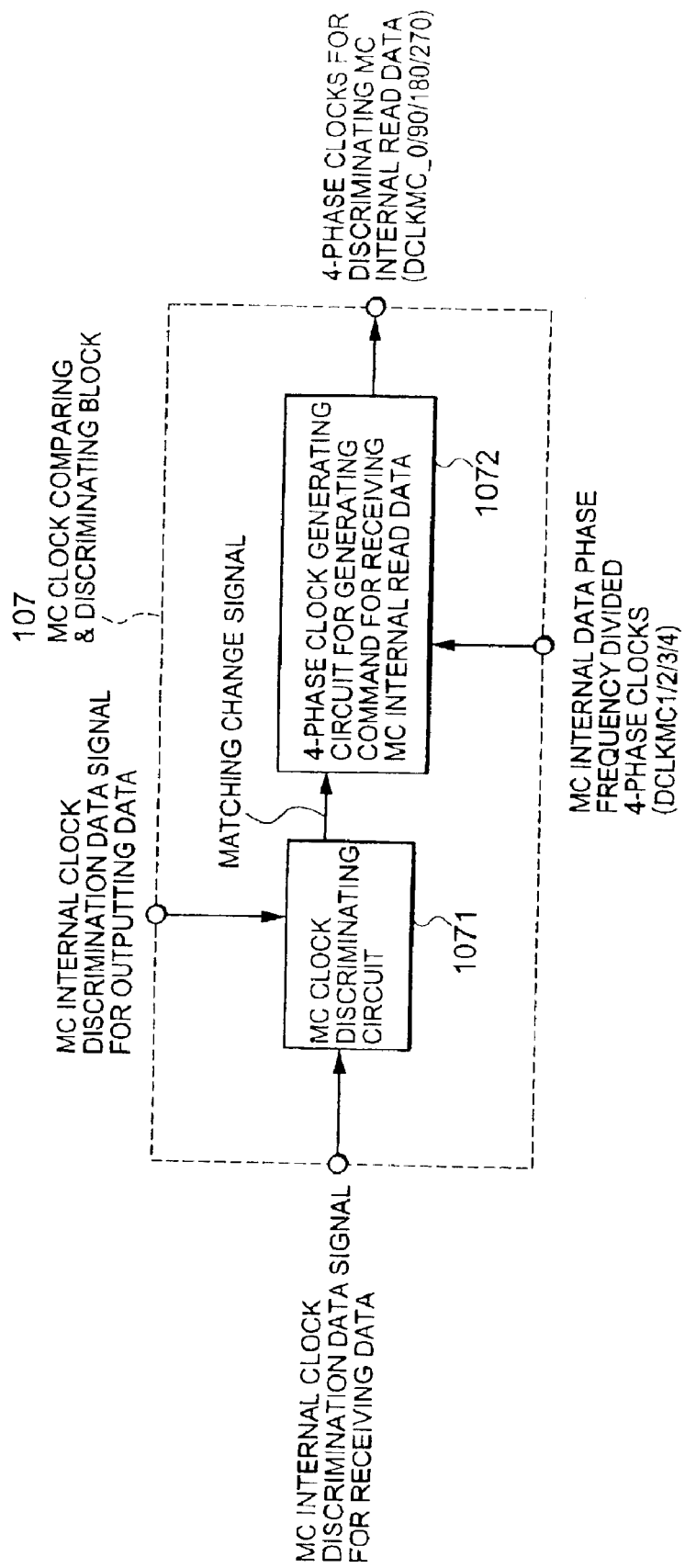
FIG. 32 is a block diagram showing an MC clock comparing and discriminating block used with the circuit shown in FIG. 24.

The MC clock comparing and discriminating block 107 shown in FIG. 32 is constructed of an MC clock discriminating circuit 1071 and an MC internal read data receiving command generating 4-phase clock generating circuit 1072. The MC clock discriminating circuit 1071 having a configuration similar to that of the DRAM clock discriminating circuit 91 shown in FIG. 24 outputs the matching change signals MCP000, 090, 180 and 270 based on the data receiving MC internal clock discrimination signals and the data output MC internal clock discrimination data signals to the MC internal read data receiving command generating 4-phase clock generating circuit 1072. The MC internal read data receiving command generating 4-phase clock generating circuit 1072 has a configuration similar to that shown in FIG. 25, and outputs the MC internal read data discrimination 4-phase clocks (DCLKMC_0/90/180/270) to the read data discrimination signal generating circuit 101.

Figure 33:
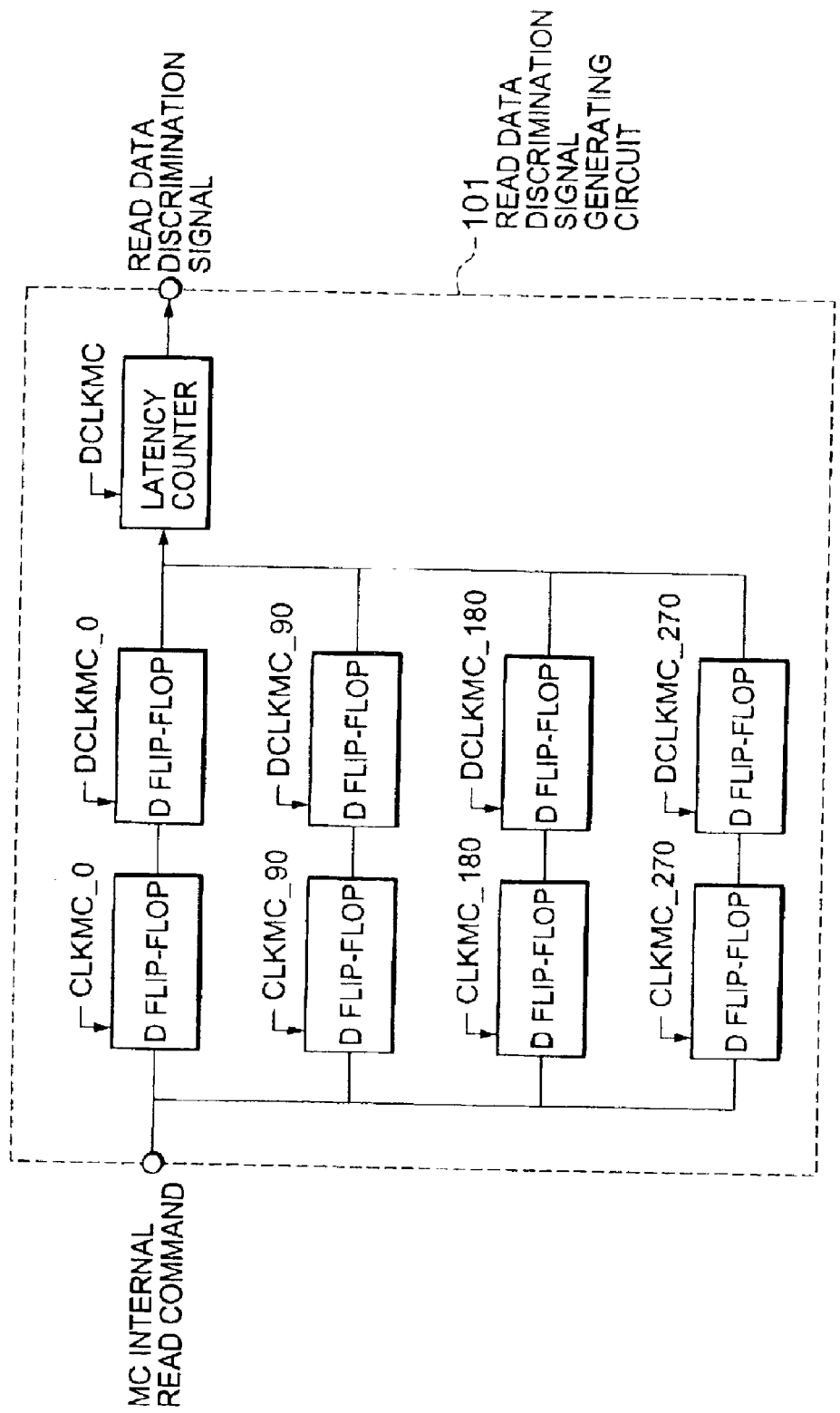
FIG. 33 is a block diagram for providing specific explanation of a read data discrimination signal generating circuit shown in FIG. 24.

Referring now to FIG. 33, the read data discrimination signal generating circuit 101 adjusts the timing of the MC internal read command supplied from the command address issuer 105 by a DF/F in a first stage that is actuated by frequency divided 4-phase reference clocks (CLKMC_0/90/180/270), then further adjusts the timing by the MC internal read data discrimination 4-phase clocks (DCLKMC_0/90/180/270) from the MC clock comparing and discriminating block 107. The adjusted read command is subjected to adjustment of its latency (e.g., latency equivalent to 5 clocks) by the MC internal read data phase clocks DCLKMC, then output as a read data discrimination signal to an MC internal circuit.

In the MC shown in FIGS. 28 through 33, an operation virtually identical to that performed in a DRAM is carried out. By implementing matching change, MC internal read data discrimination 4-phase clocks are internally generated. Meanwhile, in the MC, discrimination data has already been supplied by matching the data transmission timings from the MC to the frequency divided 4-phase clocks (refer to the discrimination data on the MC transmission side).

As a result, the MC compares transmission data from a DRAM and discrimination data to associate them or perform switching. Switched data phase clocks are supplied to the read data discrimination signal generating circuit 101 shown in FIGS. 28 and 33 to generate MC internal read data discrimination signals.

The MC clock comparing and discriminating block 107 shown in FIG. 32 transfers command signal issued in synchronization with clock signals for normal operation onto data phase clock timings generated in the MC, and counts the number of clocks thereby to receive the data transmitted from a DRAM. The operation of the MC for this procedure is virtually identical to that explained about a DRAM and therefore, detailed explanation will not be described.

The memory system according to the present invention can be consistently operated without logical contradiction by being equipped with the means for allowing clocks, command addresses and data to be associated with each other, as described above.

The description will be given of a second example applicable to a memory system in accordance with the present invention shown in FIGS. 4 through 6. The second example also uses the same technique as that of the first example. More specifically, the phase differences between pseudo clock signals obtained by continuously reversing data signals and clock signals supplied to DRAMs in the same topology as that of address command signals are retained while the system is being initialized, thereby generating, in the DRAMs, the clock signals for transfer of data signals in the DRAM as source clocks.

The second example of the present invention is the same as the first example except that the cycle of the pseudo clock signals obtained by continuously reversing data signals during system initialization is used for pre-quartered signals. The second example permits simplified initialization operation for discriminating data phase frequency divided clock signals in DRAMs and the MC, as compared with the first example.

Figure 34:
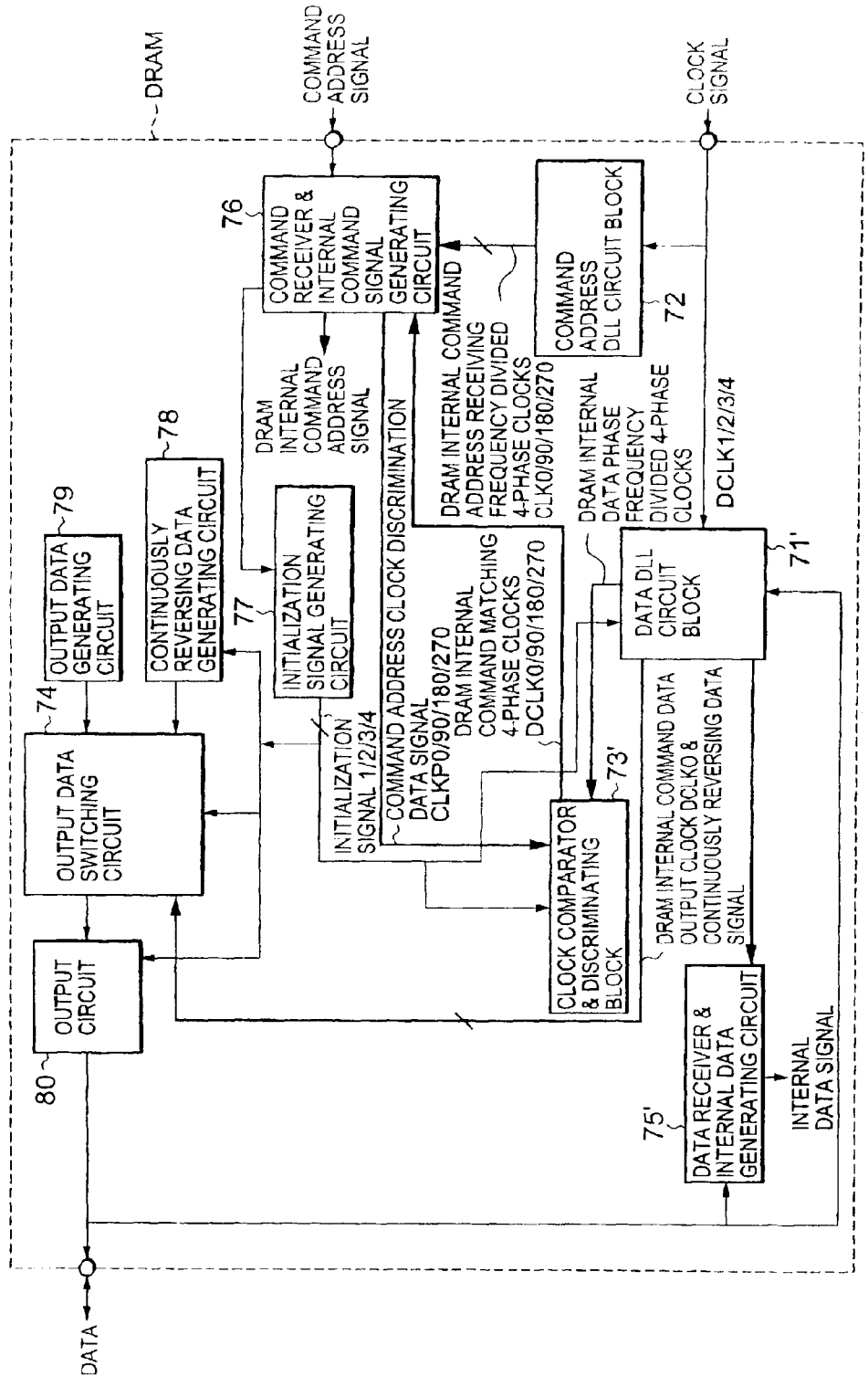
FIG. 34 is a block diagram illustrating a DRAM used with a second example of the present invention.

Referring now to FIG. 34, the configuration of the DRAMs used in the second example will be explained. The like components and signals of the DRAMs shown in FIG. 13 will be assigned like reference numerals and symbols. A data DLL circuit block 71' shown in FIG. 34 is the same as that shown in FIG. 13 in that it outputs DRAM internal data phase frequency divided 4-phase clocks (DCLK1/2/3/4). The data DLL circuit block 71' shown in FIG. 34, however, differs from the data DLL circuit block 71 shown in FIG. 13 in that it outputs DRAM internal data output clock DCLK0 and continuously reversing data signals to an output data switching circuit 74, while it does not output frequency divided 4-phase clocks, and that it outputs only DRAM internal data receiving clocks (DCLKR) and does not output the frequency divided 4-phase clocks (DCLKR1/2/3/4). Accordingly, a data receiver internal data generating circuit 75' is different from the one shown in FIG. 13 in that it does not output DRAM internal data clock discrimination signals (DCLKP1/2/3/4) and that DCLKP1/2/3/4 is not supplied to a clock comparing and discriminating block 73'.

In this example, the continuously reversing data signals supplied as pseudo clock signals from the MC through a data line are quartered, as previously mentioned; however, clock signals are generated by the MC at shorter cycles than delay times of the clock signals, as in the case of the first example. Thus, a DRAM associates continuously reversing data signals with internal clocks obtained by quartering the clock signals, permitting a simplified initializing operation to be achieved. In this case, it is required to switch data phase frequency divided 4-phase clocks.

The configuration of the clock comparing and discriminating block 73' for switching the data phase frequency divided 4-phase clocks will be explained more specifically. As shown in FIG. 34, the clock comparing and discriminating block 73' receives DRAM internal data phase frequency divided 4-phase clocks DCLK1/2/3/4, command address clock discrimination data signals CLKP00/90/180/270 and initialization signals 1/2/3 representing initializations 1/2/3, and outputs DRAM internal command matching 4-phase clocks DCLK0/90/180/270 to the command receiver and internal command signal generating circuit 76.

Figure 35:
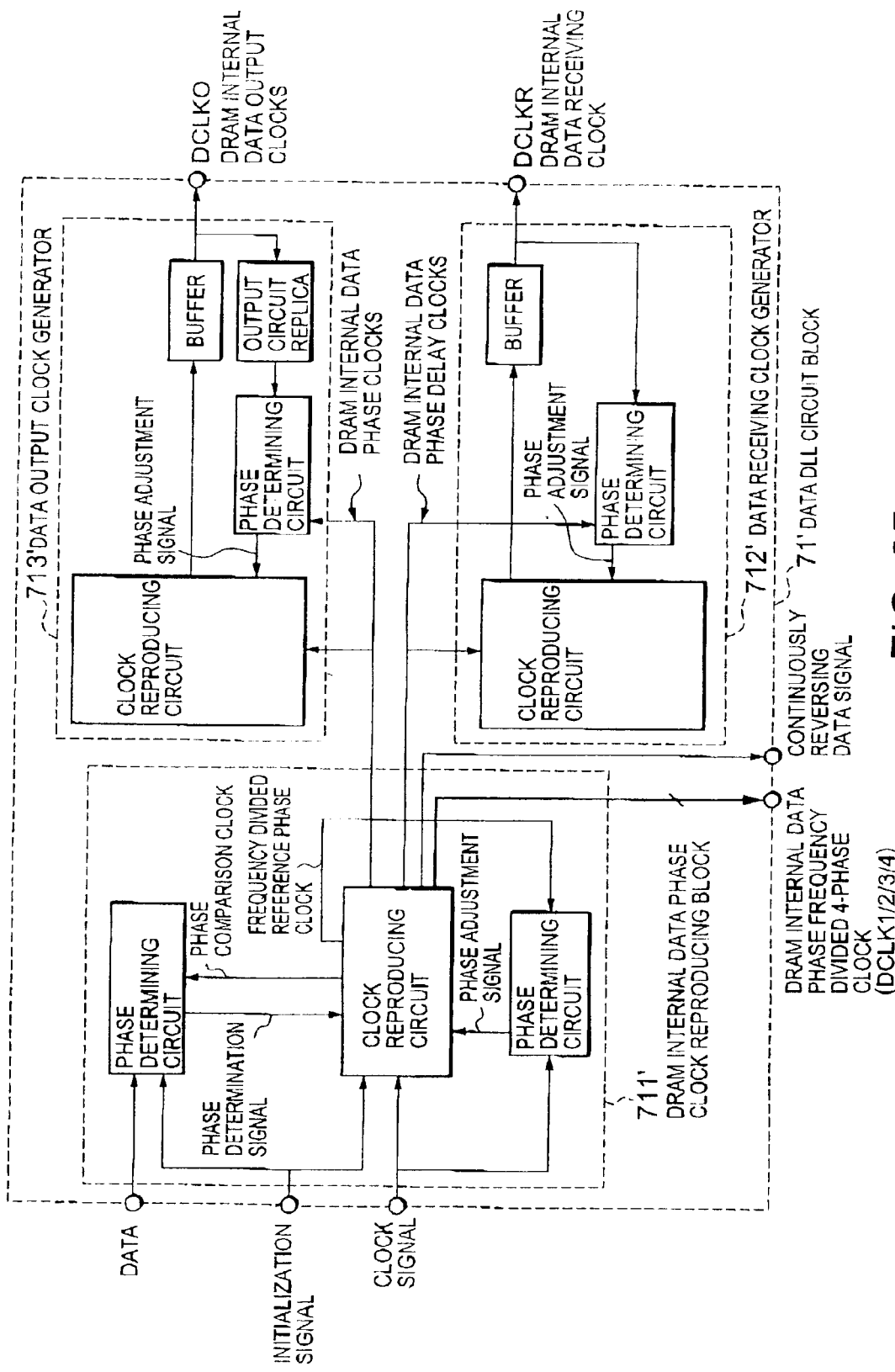
FIG. 35 is a block diagram for providing detailed explanation of the data DLL circuit block shown in FIG. 34.

Referring also to FIG. 35, the data DLL circuit block 71' used in the second example has a DRAM internal data phase clock reproducing block 711' that employs frequency divided reference phase clocks for determination by a phase determining circuit, generates DRAM internal data phase frequency divided 4-phase clocks (DCLK1/2/3/4) and continuously reversing data signals from data signals received from the MC, and sends the generated signals back to the MC. As in the case of the example shown in FIG. 14, a DRAM internal data phase clock reproducing block 711' outputs DRAM internal data phase clocks to a data output clock generator 713', and outputs DRAM internal data phase delay clocks to a data receiving clock generator 712'.

The data output clock generator 713' and the data receiving clock generator 712' shown in FIG. 35 differ from the generators 713 and 712 shown in FIG. 14 in that they do not have buffers for frequency division. Accordingly, the data output clock generator 713' and the data receiving clock generator 712' output only the DRAM internal data output clock DCLK0 and the DRAM internal data receiving clocks DCLKR.

Figure 25:
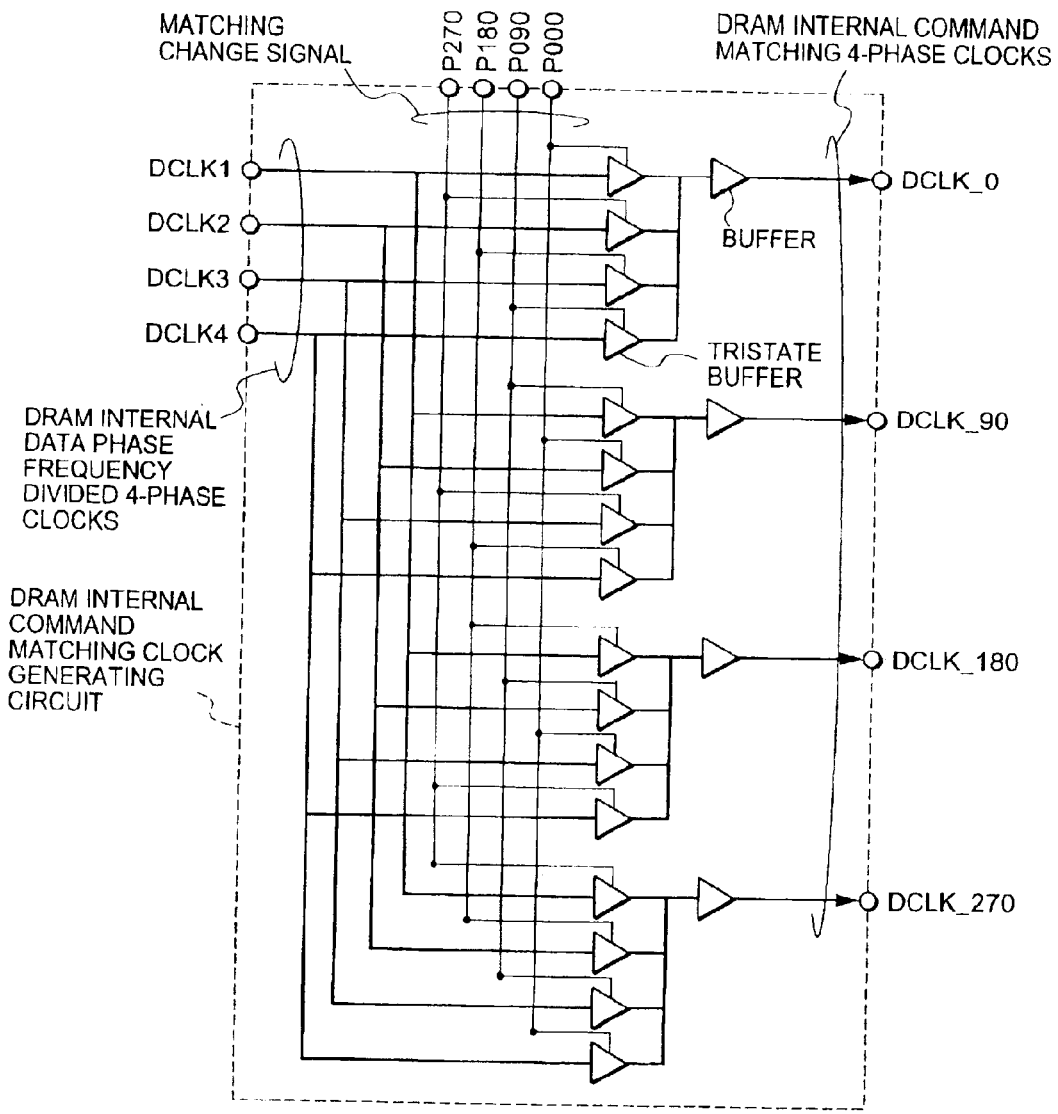
FIG. 25 is a block diagram showing a DRAM internal command matching clock generating circuit that operates using output signals of the clock discriminating circuit shown in FIG. 24.
Figure 36:
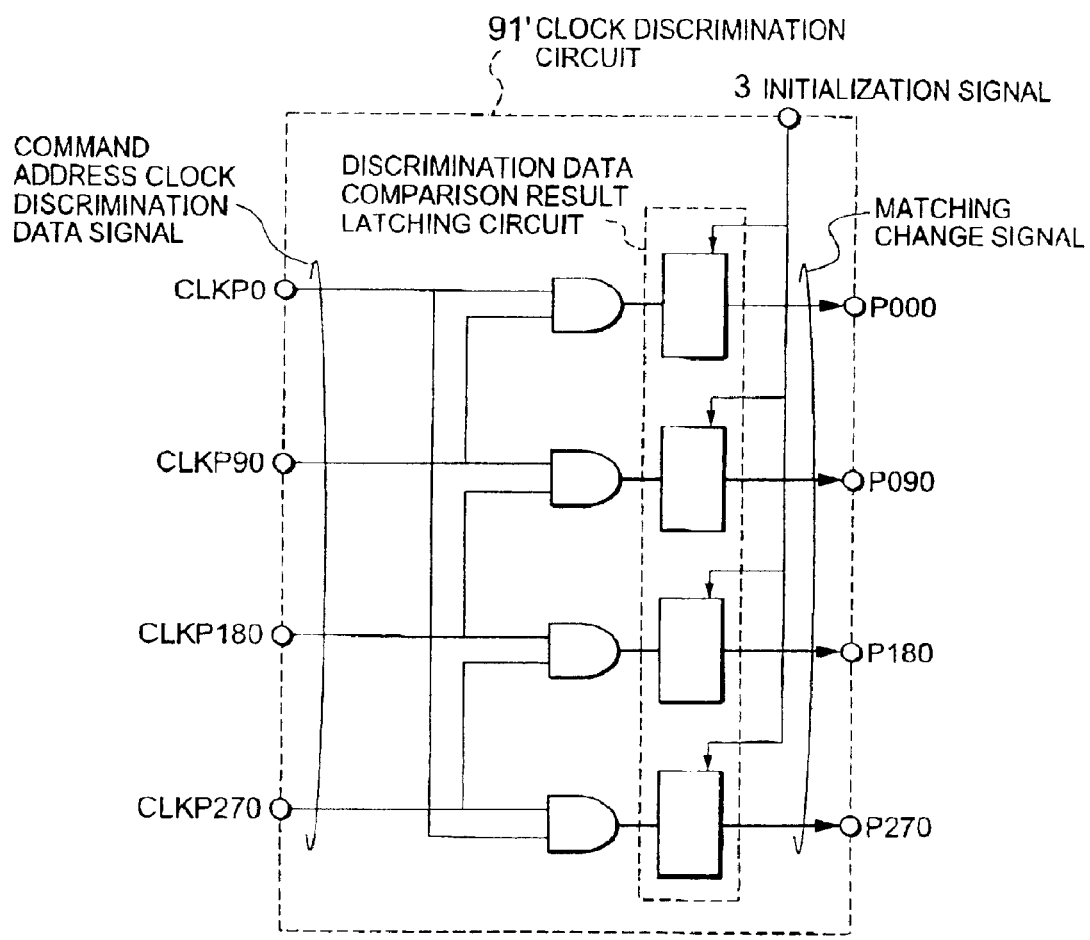
FIG. 36 is a block diagram showing a clock discriminating circuit used with the clock comparing and discriminating block shown in FIG. 34.
Figure 37:
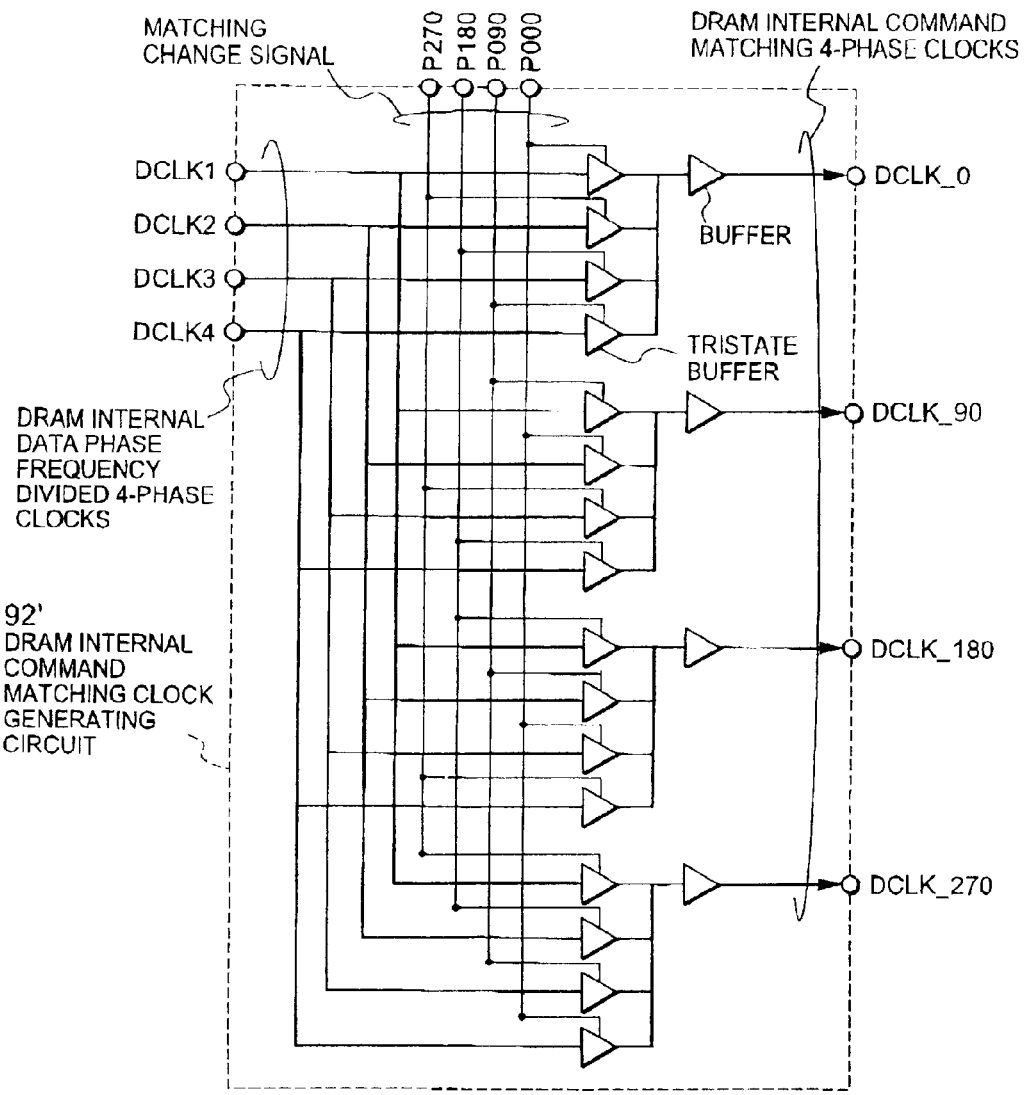
FIG. 37 is a block diagram showing a DRAM internal command matching clock generating circuit used in combination with the clock discriminating circuit shown in FIG. 36.

As shown in FIGS. 36 and 37, the clock comparing and discriminating block 73' includes a clock discriminating circuit 91' and a DRAM internal command matching clock generating circuit 92', and these correspond to the circuit 91 and 92, respectively, shown in FIGS. 24 and 25.

In the second example, command/address signals are generated by the MC such that they are matched to clock signals, and these clock signals and command/address signals are supplied to the DRAMs through lines having the same topologies. Taking this into account, a command receiver and internal command signal generating circuit 76 shown in FIG. 34 determines a particular one of the DRAM internal command address receiving frequency divided 4-phase clocks CLK0/90/180/270, which are supplied from the command address DLL circuit block 72, to which a command/address signal is matched, and outputs a corresponding command address clock discrimination data signal CLKP0/90/180/270 to the clock discriminating circuit 91'. In this example, two command address clock discrimination data signals CLKP0/90/180/270 that correspond to adjoining phases will be set to logic "1" to issues a command for matching to command/address signals.

The clock discriminating circuit 91' shown in FIG. 36 that is actuated in response to the foregoing command address clock discrimination data signals CLKP0 through CLKP270 has four AND circuits that take an AND of the command address clock discrimination data signals CLKP0 through CLKP270 that correspond to two adjoining phases, and a discrimination data comparison result latching circuit that latches outputs of the AND circuits by initialization signal 3. The latching circuit is formed of four latches. The latching results are output as matching change signals P000, P090, P180 and P270 to the DRAM internal command matching clock generating circuit 92' shown in FIG. 37. For example, if CLKP270 and CLKP0 are set to logic "1", then the matching change signal P270 is output.

The DRAM internal command matching clock generating circuit 92' shown in FIG. 37 includes four sets of tristate buffers for buffering the DRAM internal data phase frequency divided 4-phase clocks DCLK1/2/3/4 from the data DLL circuit block 71' by the aforesaid matching change signals P000, P090, P180 and P270, and buffers for retaining outputs of the tristate buffers. Each set of tristate buffers is constructed of four tristate buffers to correspond to DCLK1/2/3/4. According to this configuration, if, for example, DCLK1 is set to logic "1" and P270 is set to logic "1," then a DRAM internal command matching 4-phase clock DCLK_270 is output through one of the tristate buffers of the set disposed at the lowermost stage shown in FIG. 37 and a buffer connected to the tristate buffer. This means that the DRAM internal data phase frequency divided 4-phase clock DCLK1 has been transferred onto the DRAM internal command matching 4-phase clock DCLK_270.

As is obvious from the above description, this example advantageously makes it possible to shift data signal internal clocks into command internal clocks without using the DRAM internal data clock discrimination data signals DCLKP shown in FIG. 24, permitting simplified circuit configuration and procedure to be achieved. Thus, the transfer from the clock timings of command/address signals onto data phase timings can be easily accomplished without the need for a clock discriminating procedure.

In this example, it is assumed that the rising edge of a continuously reversing data signal, i.e., a pseudo clock signal transmitted for a DRAM internal data signal, output from the DRAM internal data phase clock reproducer 711' is preset such that it is one clock behind in the MC with respect to a following address command frequency divided data signal. Although the preset delay is one clock in this example, if it is necessary to delay longer, then a larger number of clocks is set in the MC.

Regarding the DRAM internal data phase frequency divided 4-phase clocks DCLK1/2/3/4, the continuously reversing data signals received from the MC are quartered before supplied as pseudo clock signals, so that DCLK1 and DCLK2 are preformed into clocks equivalent to 1, thus obviating the need for a clock discriminating procedure. The continuously reversing data signals serving as pseudo clock signals that are transmitted from the DRAMs to the MC are transmitted in the same phases as those of DRAM internal data phase frequency divided clocks.

In the MC, the MC internal data phase 4-phase clocks are generated from the pseudo clock signals received from the DRAMs. As in the case of the DRAMs, it is unnecessary to discriminate clocks, and the same phase as that of a pseudo clock signal will be at DCLKMC_0. At this point, therefore, clock signals and data phase clocks generated in the MC are associated with each other in the MC. Thus, it is possible to receive data transmitted from the DRAMs by transferring command signals issued by being matched to clock signals onto data phase clock timings generated in the MC, and by counting the number of clocks. The configuration of the MC used in the second example is virtually identical to the configuration of the MC used in the first example except that the second example does not have include the clock discrimination data generating circuit, the clock comparing and discriminating circuit, and the continuously reversing data generating circuit. The MC of the second example also shares the same configuration with the MC of a third example shown in FIG. 42, so that the explanation will be omitted.

In the second example, as an alternative, signals of quartered cycles may be transmitted only for address signals in DRAMs and received by the DRAMs, and command address clock discrimination data signals may be captured to switch data phase frequency divided 4-phase clocks in the DRAMs. This arrangement also obviates the need for an initializing procedure for discriminating data phase 4-phase clocks in the MC as in the first example.

Figure 38:
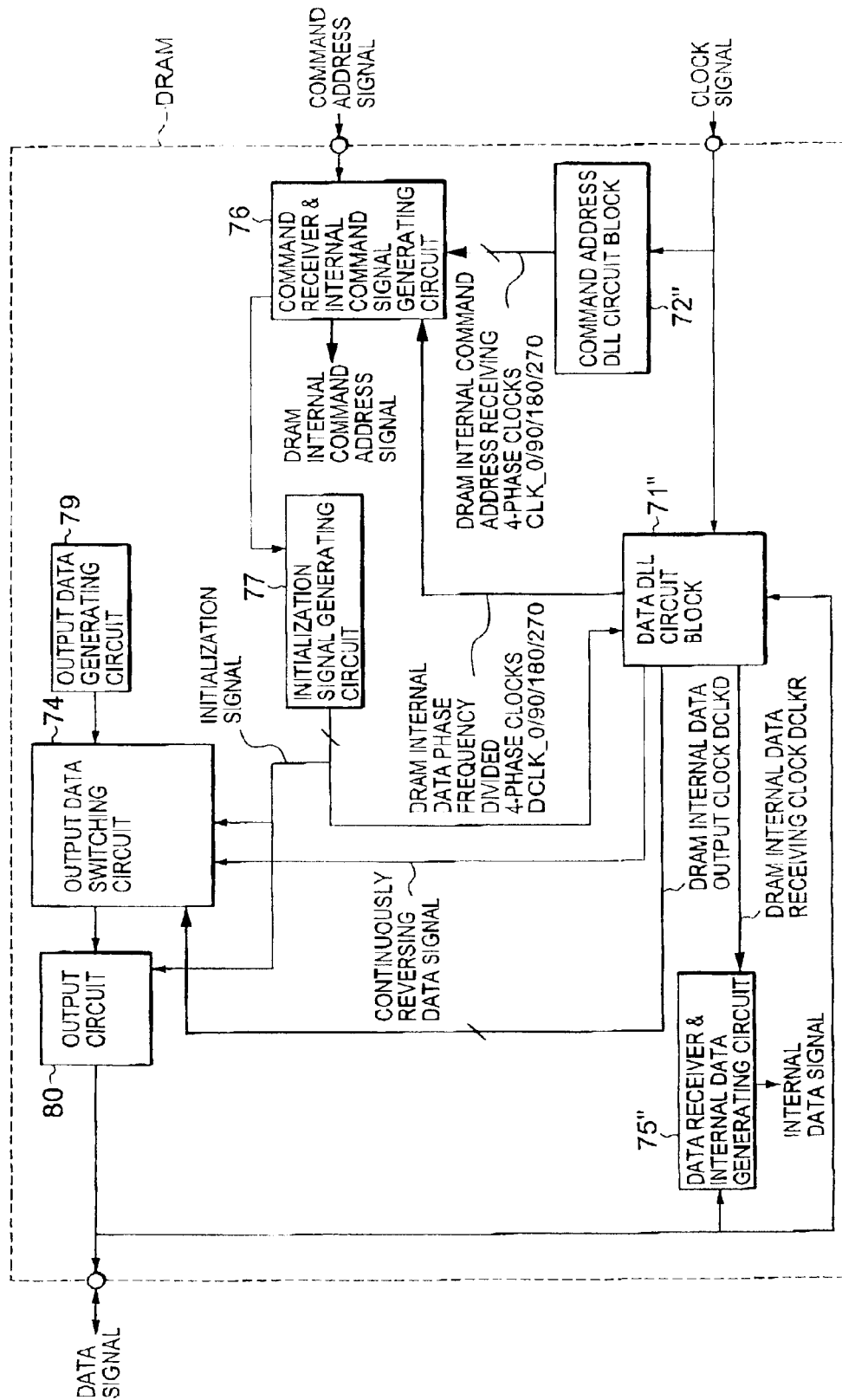
FIG. 38 is a block diagram showing a DRAM used in a third example of the present invention.

Referring now to FIG. 38, a DRAM according to the third example of the present invention will be first explained. This example is characterized by that a pseudo clock data signal input from an MC is frequency-divided by a data DLL circuit block 71" and a clock signal itself is supplied as a frequency division cycle clock to a command address DLL circuit block 72". In this case, it is assumed that normal data signals other than the pseudo clock data signals during initialization are transferred between the MC and the DRAMs during a 1-clock cycle of a clock signal supplied from the MC. This means that the phases of a pseudo clock data signal and a clock signal in the 1-clock cycle may be detected, making it further easier to associate clocks, command addresses and data. When this arrangement is used, the normal operation will be performed, as illustrated in FIG. 8.

Also in this example, the clock signals transferred between the MC and the DRAMs are frequency-divided in the MC with respect to reference clocks, so that clock signals are transmitted to the DRAMs by delaying the rising edges of pseudo clock data signals by one clock in relation to the rising edges of the clock signals. Although the delay in this example is set to one clock, the number of clocks may be set to a large value in the MC if it is necessary to increase the time lag.

Figure 39:
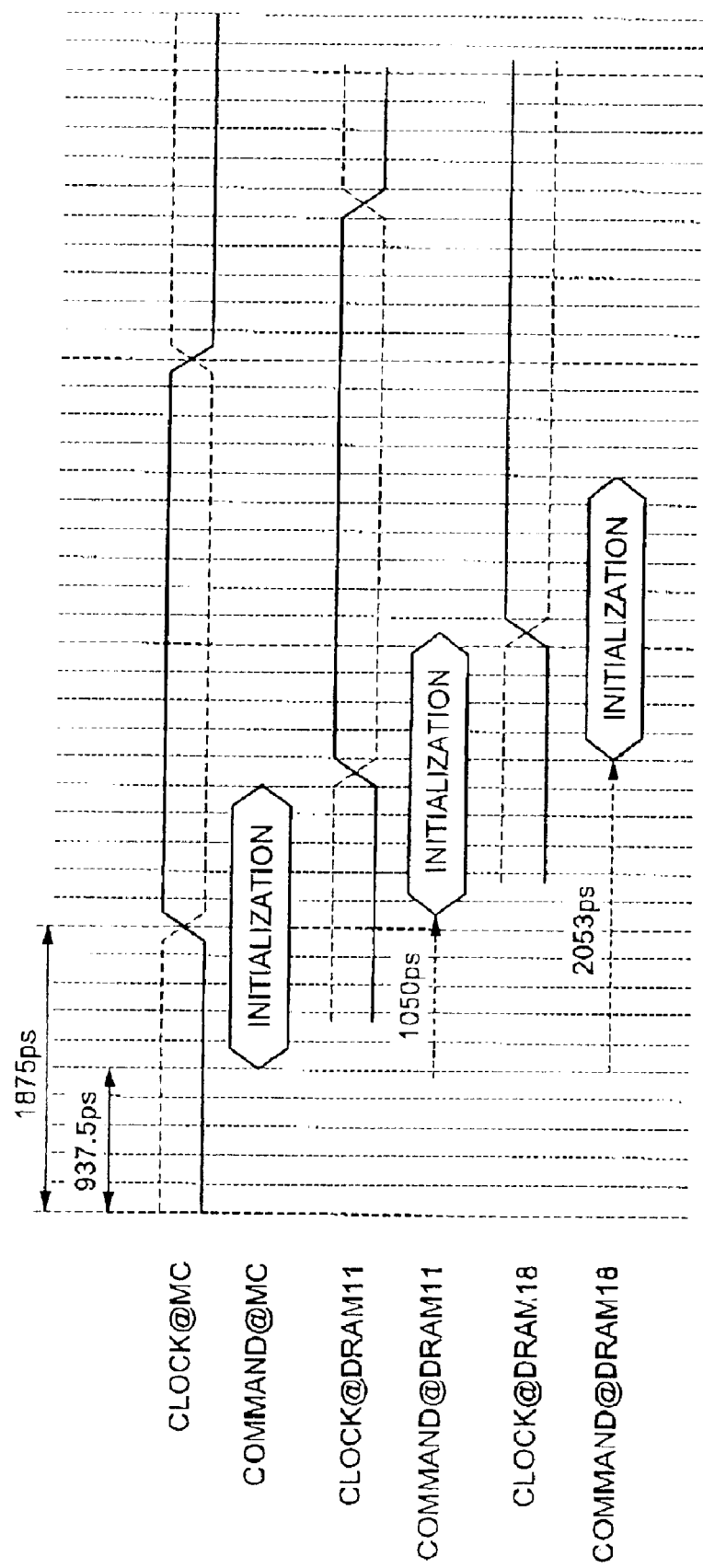
FIG. 39 is a timing chart showing a relationship between commands and clocks in the initializing operation of the third example of the present invention.

Referring to FIG. 39, an initialization command (command@MC) is first issued to the DRAM shown in FIG. 38 from the MC at initialization such that the command is matched to the front edges of clocks (refer to clock@MC). The clocks have a 7500-ps cycle, and these clocks are received by a DRAM 11 with a time delay of 1050 ps (clock@DRAM11, command@DRAM11), and then received by a DRAM 18 with a time delay of 2053 ps (clock@DRAM18, command@DRAM18). The MC also generates data signals at the same cycle as that of the clock signals and supplies continuously reversing data signals to DRAM 11 through DRAM 18 through data lines at initialization.

The data DLL circuit block 71" and the command address DLL circuit block 72" shown in FIG. 38 generate clocks for 4-phase data and command addresses, namely, DRAM internal data phase 4-phase clocks DCLK_0/90/180/270 and DRAM internal command address receiving 4-phase clocks CLK_0/90/180/270, without frequency-dividing continuously reversing data signals and clock signals, and supply the generated clocks to the command receiver and internal command signal generating circuit 76. Thus, the data DLL circuit block 71" designed not to perform frequency division can be implemented by the circuit shown in FIG. 35. The command address DLL circuit block 72" can be also implemented by the circuit configuration shown in FIG. 34.

The data DLL circuit block 71" outputs a DRAM internal data receiving clock DCLKR and a DRAM internal data output clock DCLK0 to the data receiver internal data generating circuit 75" and the output data switching circuit 74, respectively. The DRAMs not shown are not provided with circuits for generating continuously reversing data signals because received continuously reversing data signals are sent back to the MC through the output data switching circuit 74 and an output circuit 80.

Figure 40:
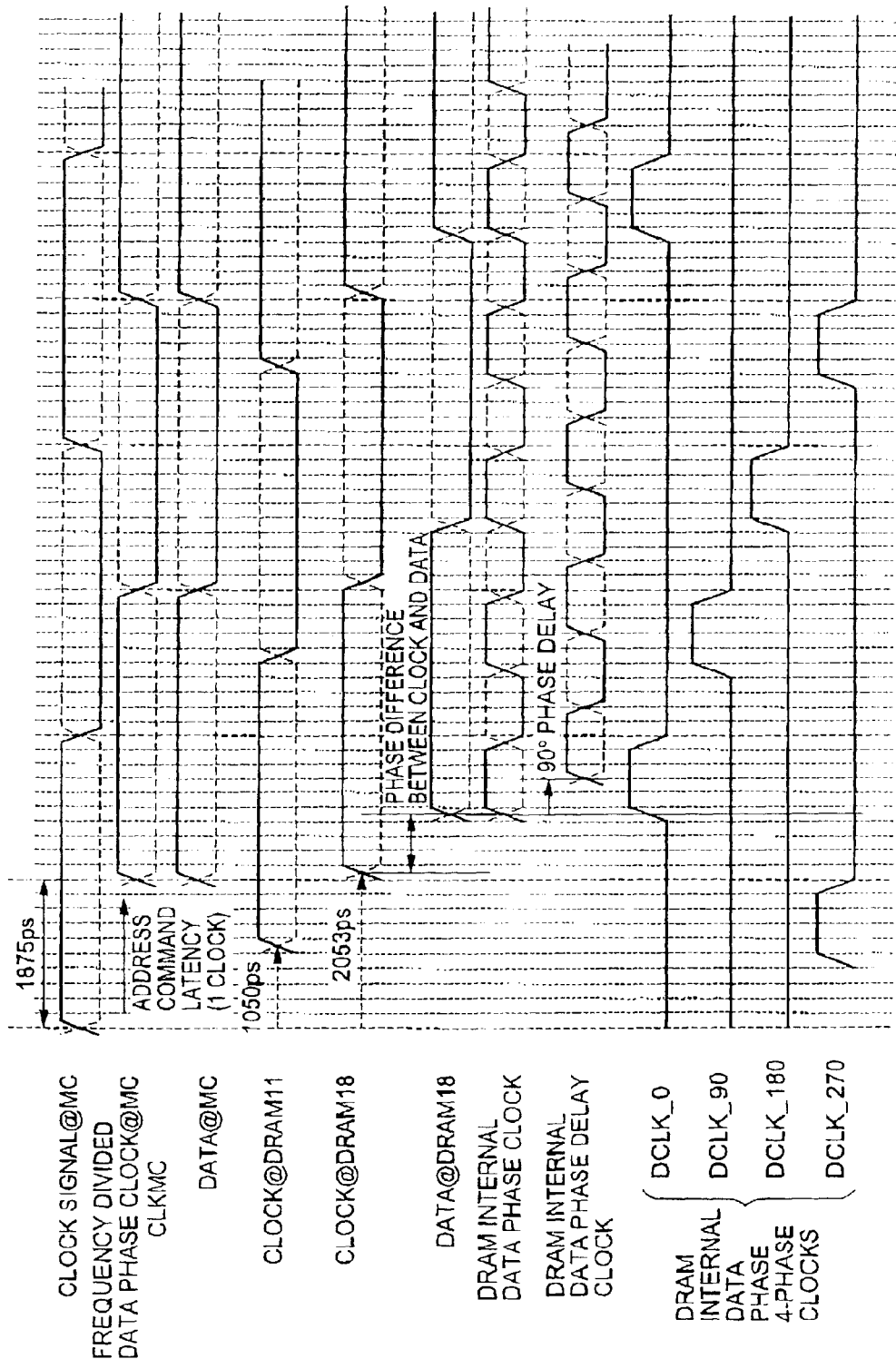
FIG. 40 is a timing chart illustrating the initializing operation in the DRAM in the third example of the present invention.

Referring also to FIG. 40, the operation of initialization 1 performed by the DRAM shown in FIG. 38 will be described. The MC issues clock signals (clock signal@MC) to the DRAM, while it also internally generates a frequency divided data reference clock (frequency divided data reference clock@MC) with a 1875-ps delay based on an estimated 1875-ps address command latency. The MC outputs the frequency divided data reference clock in addition to continuously reversing data signals as pseudo clock signals (refer to data@MC) to the DRAM through data lines.

The foregoing clock signals are supplied to the DRAM 11 and the DRAM 18, respectively, after the elapse of 1050 ps and 2053 pseudo (clock@DRAM11, clock@DRAM18). Regarding the DRAM 18, a continuously reversing data signal is supplied as a pseudo clock signal (data@DRAM18) from the MC to the DRAM 18 with a delay that is shorter than 2053 ps. Hence, as in the case of the examples described above, phase differences exist between the clock signals and the continuously reversing data signals received by the DRAM 18.

The data signals received by the DRAM 18 are sent back to the MC through the data DLL circuit block 71". The data DLL circuit block 71" generates a DRAM internal data phase clock on the basis of a received data signal and also generates a DRAM internal data phase delay clock by delaying the internal data phase clock by 90 degrees. Subsequently, the data DLL circuit block 71" divides the DRAM internal data phase clock in four phases to produce DRAM internal data phase 4-phase clocks DCLK_0/90/180/270, as shown in FIG. 40, and outputs the produced clocks to the command receiver and internal command generating circuit 76 shown in FIG. 38. Thus, the third example makes it possible to set phases simply by generating DRAM internal data phase clocks on the basis of received data signals, permitting the operation of initialization 1 in the DRAMs to be simplified.

Figure 41:
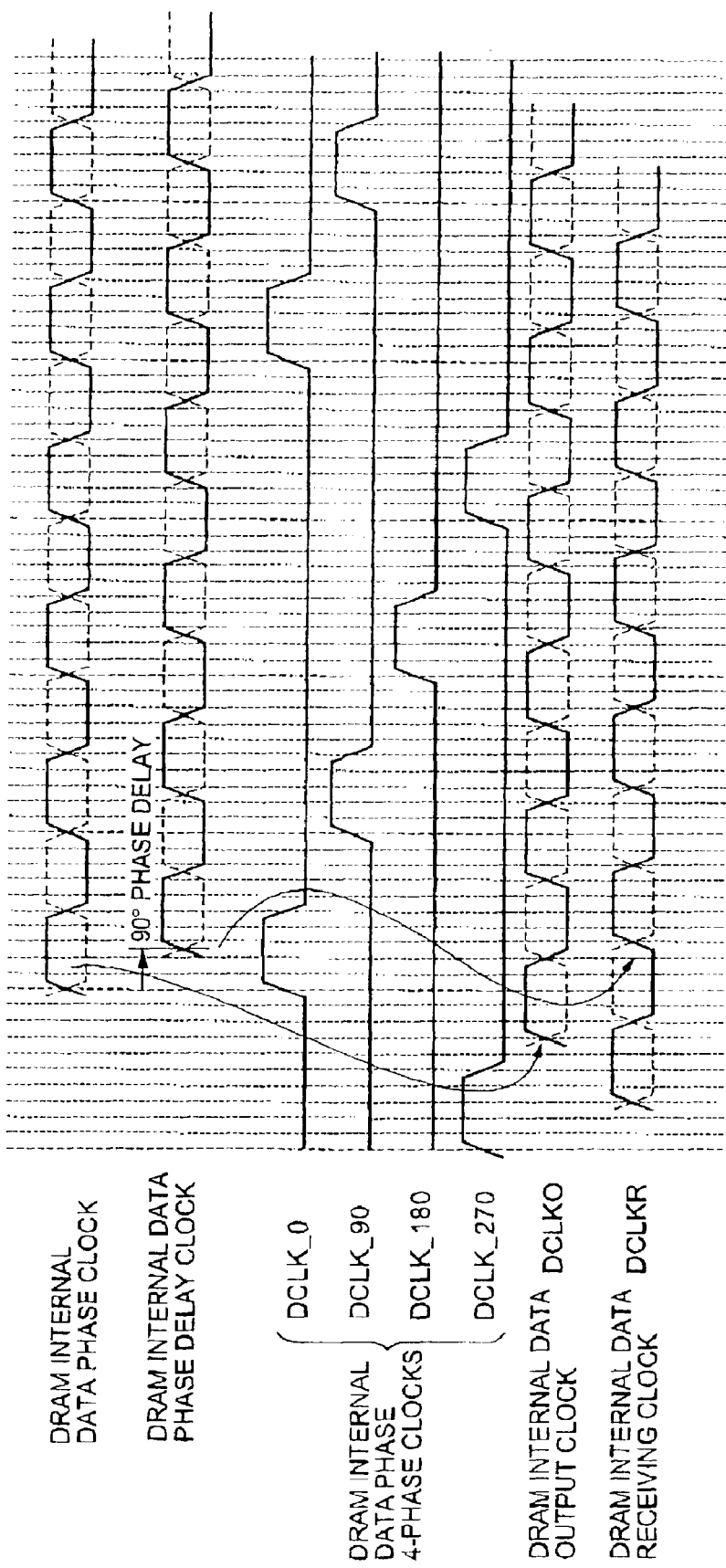
FIG. 41 is a timing chart illustrating the operation of the DRAM after the initializing operation shown in FIG. 40.

When the phase of a DRAM internal data clock is determined, a DRAM internal data output clock DCLK0 and receiving clock DCLKR are internally generated on the basis of a DRAM internal data phase clock and internal data phase delay clock, respectively, as shown in FIG. 41.

Figure 42:
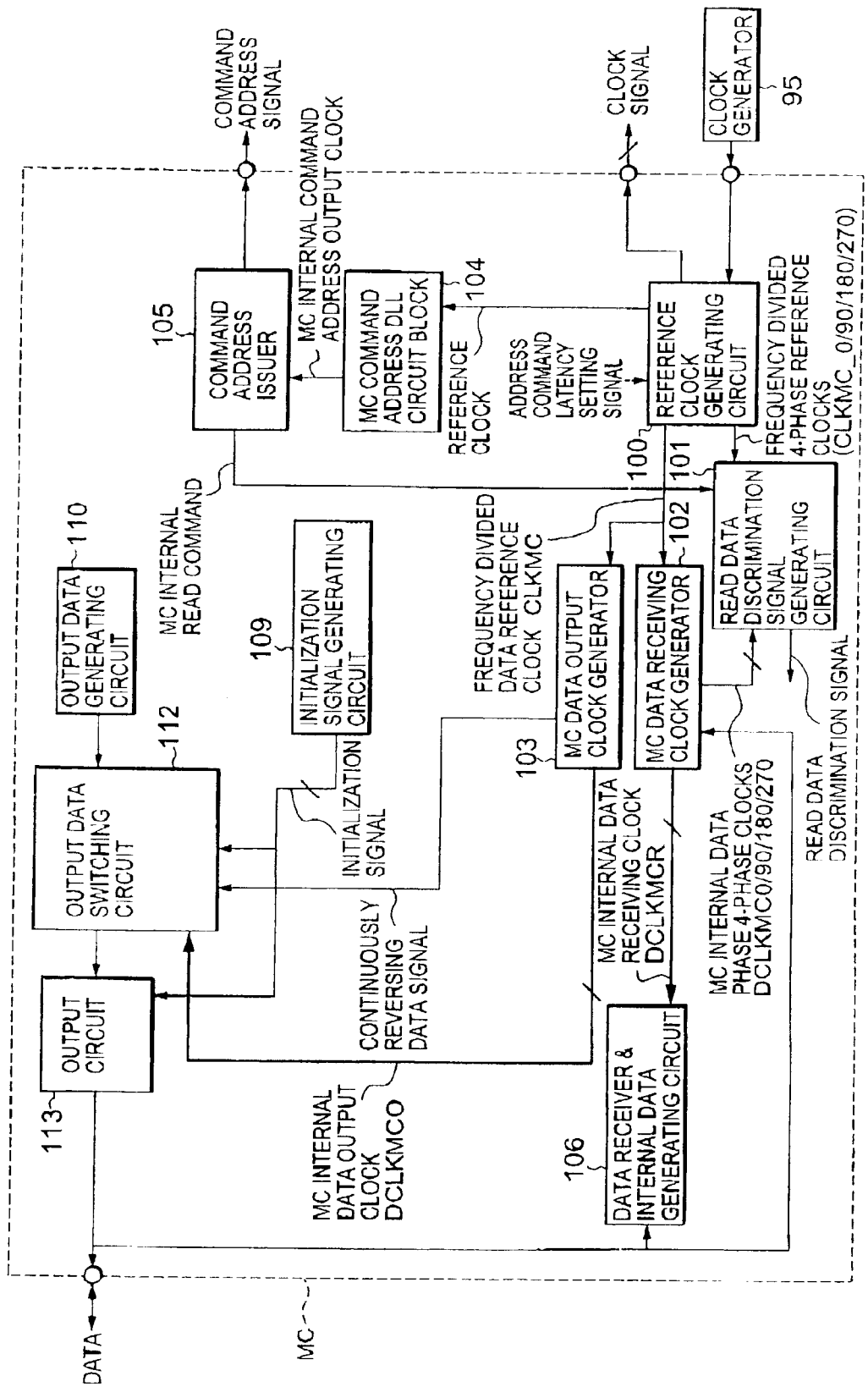
FIG. 42 is a block diagram illustrating the internal configuration of an MC used in the third example of the present invention.

FIG. 42 shows an example of the MC used in combination with a DRAM having the construction shown in FIG. 38. In FIG. 42, the components corresponding to those shown in FIG. 28 are denoted by the same reference numerals. The MC shown in FIG. 42 structurally differs from the MC shown in FIG. 28 in that it does not include the clock comparing and discriminating block 107 and the clock discriminating data generating circuit 108 shown in FIG. 28.

Figure 43:
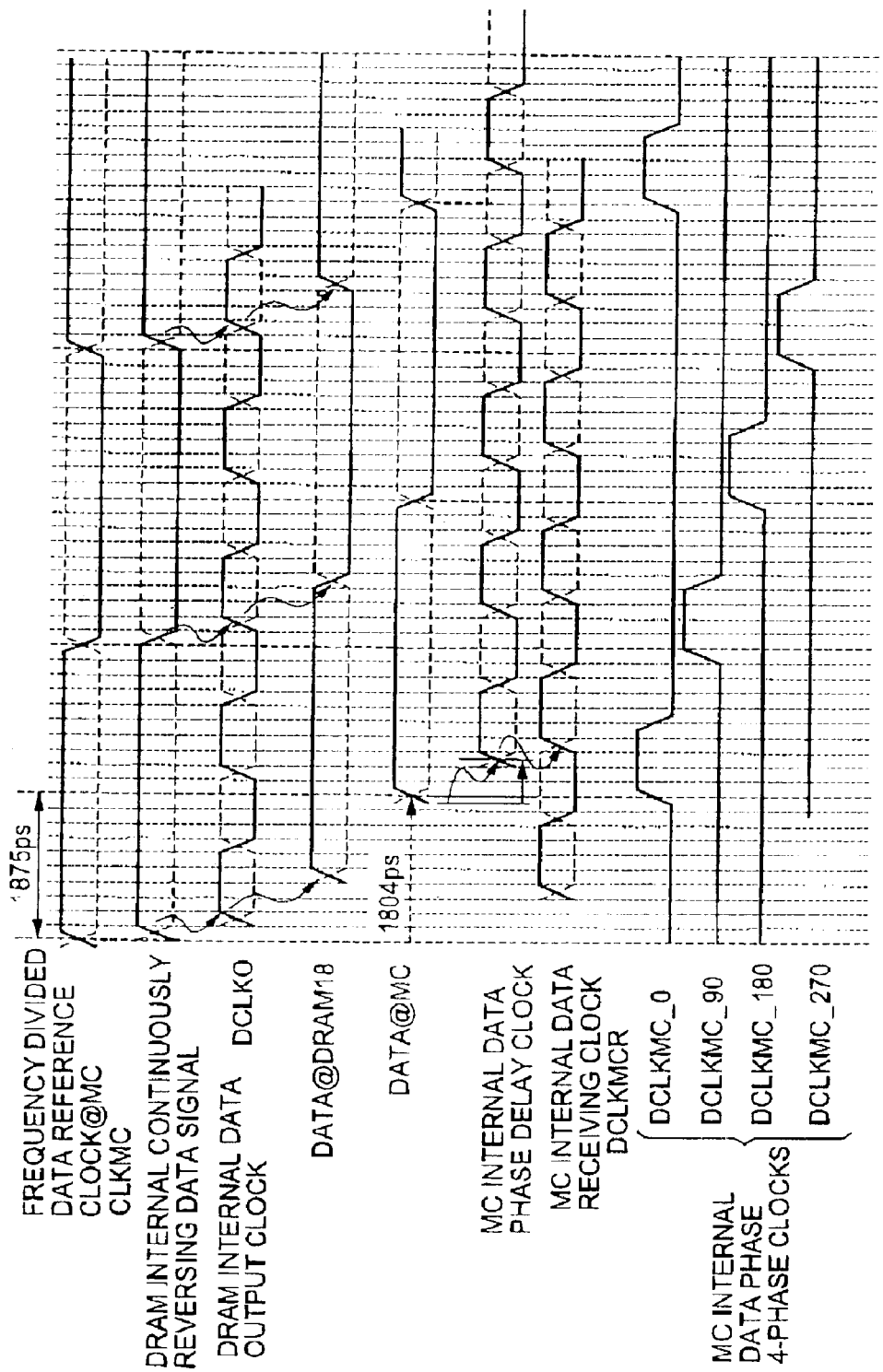
FIG. 43 is a timing chart illustrating the initializing operation in the MC shown in FIG. 42.

Referring also to FIG. 43, the operation for initialization 2 performed by the MC shown in FIG. 42 will be explained. The operation for initialization 2 is carried out to set the phase of a reading internal data clock. As shown in FIG. 43, the MC generates a clock signal and a frequency divided data reference clock, and also outputs a continuously reversing data signal to a DRAM, as explained with reference to FIG. 40. In the DRAM, a DRAM internal data output clock DCLK0 is produced from the continuously reversing data signal, and the continuously reversing data signal is sent back on the basis of the DCLK0, it has already bee described.

The continuously reversing data signal generated in the DRAM is delayed through a data line and received by the MC (data@MC). The MC generates an internal data clock from the received data signal, as the DRAM does, and also generates an MC internal data phase delay clock by delaying the internal data clock. As shown in FIG. 43, an MC data receiving clock generator 102 of the MC produces an internal data clock on the basis of the received continuously reversing data signal (data@MC), and also divides the internal data clock in quarters to produce MC internal data phase 4-phase clocks DCLKMC_0/90/180/270 shown in FIG. 43. The MC data receiving clock generator 102 also produces MC internal data receiving clock DCLKMCR on the basis of the MC internal data phase delay clock. This completes initialization 2 in the MC for setting the phase of the internal data clock for reading data from the DRAM.

Referring to FIG. 42, the MC internal data phase 4-phase clocks DCLKMC_0/90/180/270 and the MC internal data receiving clock DCLKMCR are respectively output from the MC data receiving clock generator 102 to a read data discrimination signal generating circuit 101 and a data receiver internal data generating circuit 106.

As shown in FIG. 42, a string of clock pulses from a clock generator 95 is supplied to a reference clock generating circuit 100 wherein it is subjected to frequency division, then output to the DRAM as a clock signal illustrated in FIG. 40. The frequency divided data reference clock CLKMC is output to the MC data output clock generator 103, the clock signal being delayed by one clock pulse. The MC data output clock generator 103 generates a continuously reversing data signal in synchronization with the rising edge of the frequency divided data reference clock CLKMC, and also generates the MC internal data output clock DCLKMC0, as shown in FIG. 40. The output data is output from the MC at the MC internal data output clock DCLKMC0.

Figure 44:
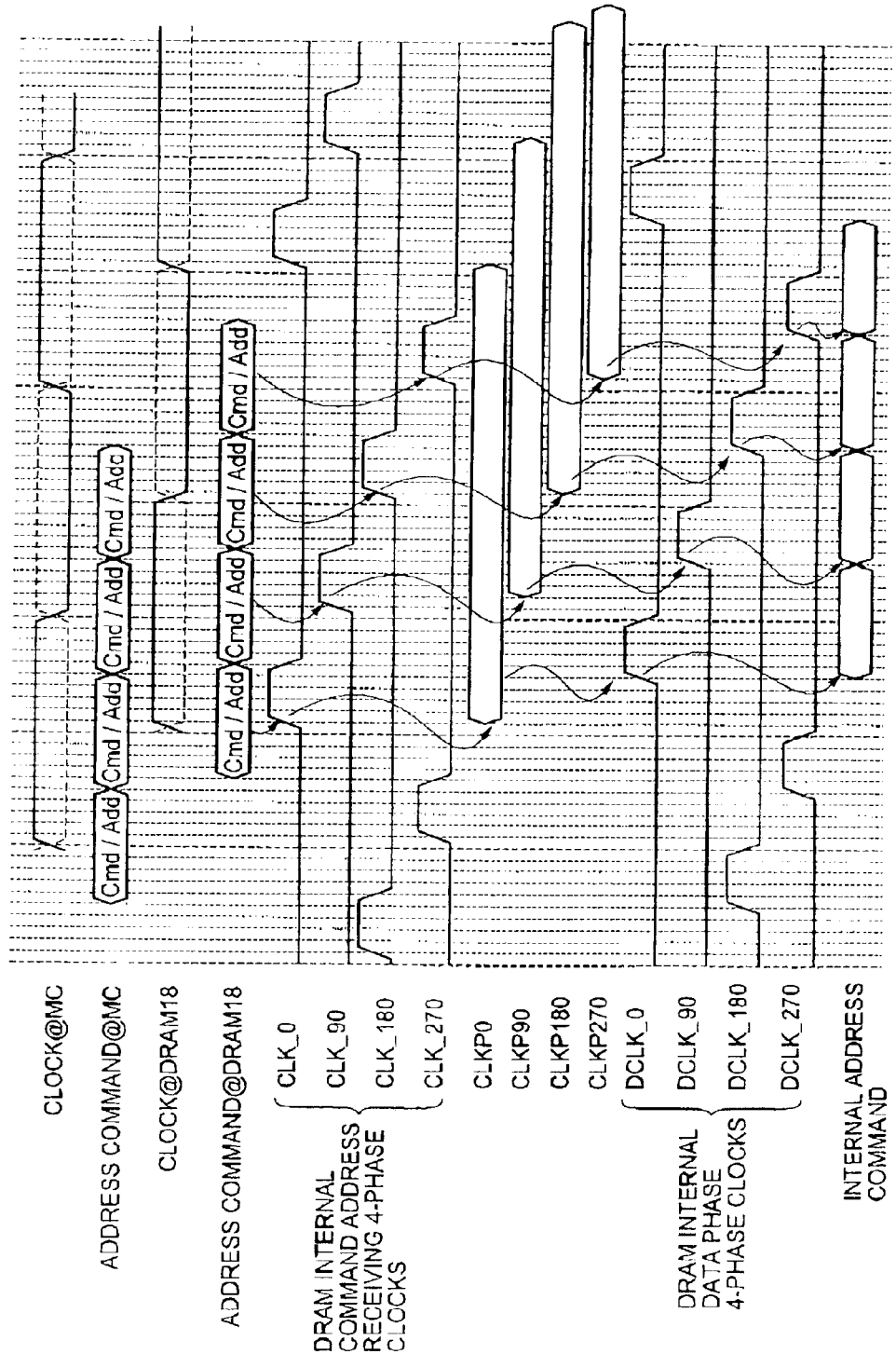
FIG. 44 is a timing chart illustrating the command/address receiving operation in the DRAM shown in FIG. 42.

Referring now to FIG. 44, a description will be given of the operation for transferring command/address signals between the DRAM shown in FIG. 38 and the MC shown in FIG. 42. First, in FIG. 44, it is assumed that four command/address signals (hereinafter referred to as "Cmd/Add signals") are issued from the MC (addresscommand@MC) such that they are matched to the clock signal (clock@MC), and the clock signal and the Cmd/Add signals are supplied to the DRAM 18 through line having the same topology. Referring back to FIG. 42, to issue the clock signal and the Cmd/Add signals, the reference clock generating circuit 100 generates a frequency divided clock signal and sends out a reference clock to the MC command address DLL circuit block 104, as previously described. The MC command address DLL circuit block 104 supplies an MC internal command address output clock to the command address issuer 105, and the command address issuer 105 outputs the Cmd/Add signals to the DRAM according to the output clock.

As shown in FIG. 44, the clock signals and the Cmd/Add signals from the MC reach the DRAM 18 with virtually the same delay time (clock@DRAM18, addresscommand@DRAM18). Referring back to FIG. 38, in the DRAM, the aforesaid Cmd/Add signals are received in the command receiver and internal command signal generating circuit 76, and the clock signals are also received in the command address DLL circuit block 72" and the data DLL circuit block 71".

In this example, the command address DLL circuit block 72" generates DRAM internal command address receiving 4-phase clocks CLK_0/90/180/270 on the basis of the received clock signal and outputs the generated clocks to the command receiver and internal command signal generator circuit 76. The phases of these CLK_0/90/180/270 differ from the phases of the internal data phase 4-phase clocks DCLK_0/90/180/270 of the data DLL circuit block 71", so that it is necessary to match them. In the case of this example, however, the delay time differences between the clock signals and the command/address signals lie within one cycle of the clock signals. Accordingly, CLK_0 is associated with DCLK_0 and not any other clocks DCLK_90/180/270. This applies also to other clocks CLK_90/180/270.

Figure 45:
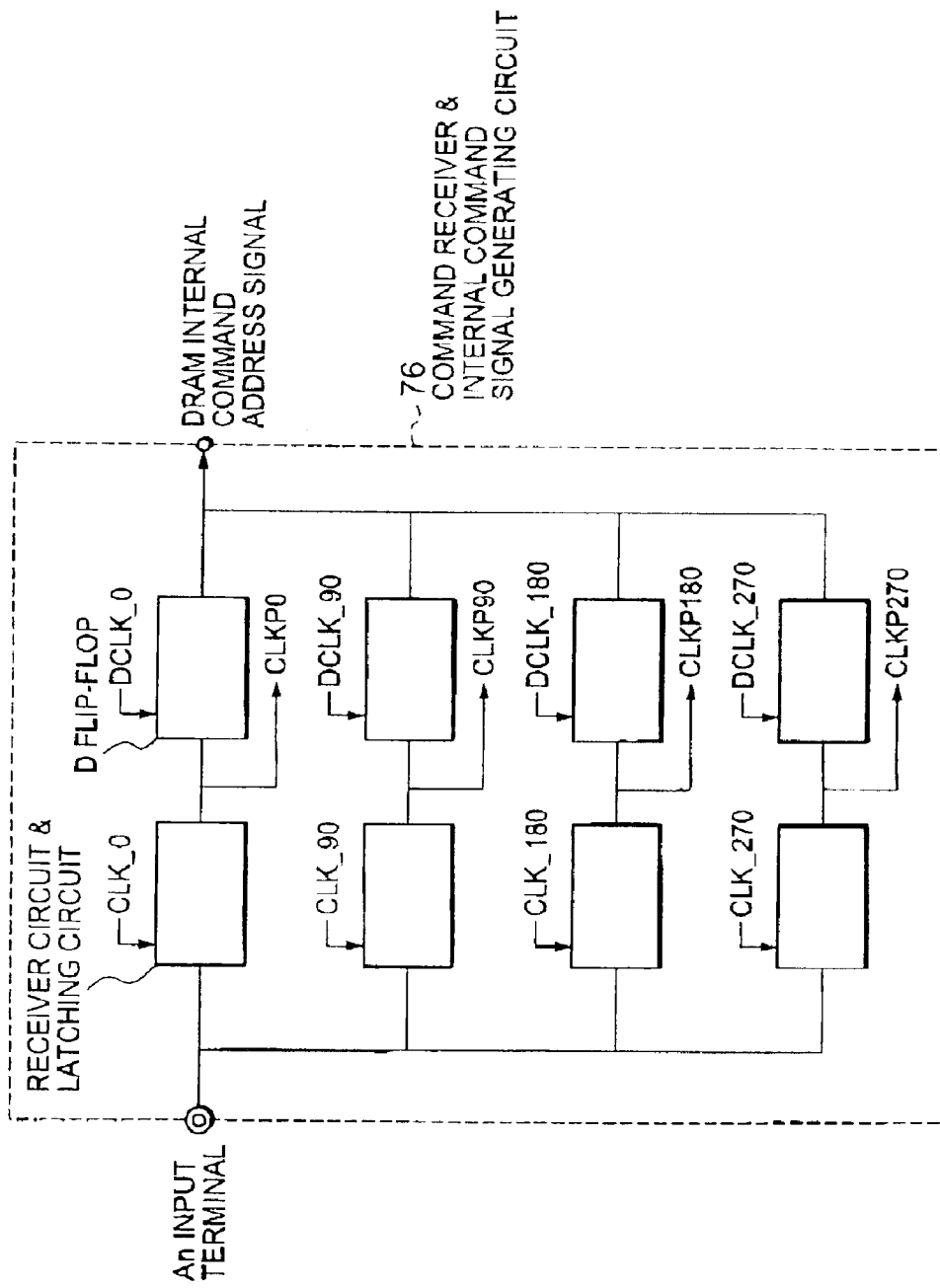
FIG. 45 is a block diagram showing a command receiver and internal command signal generating circuit shown in FIG. 38.

Referring also to FIG. 45, the command address and internal command signal generating circuit 76 used in this example is constructed of a receiver and latching circuit that latches command/address signals supplied through an input terminal (An internal terminal) by CLK_0/90/180/270 and outputs them as command address clock discrimination data signals CLKP0/90/180/270, and a DF/F that takes out CLKP0/90/180/270 at timings of DCLK_0/90/180/270, respectively, and outputs them as DRAM internal command/address signals.

FIG. 44 illustrates the waveforms of components of the foregoing command receiver and internal command signal generating circuit 76. At the timings of CLK_0/90/180/270, the Cmd/Add signals are latched as CLKP_0/90/180/270, then output as internal address command signals at the timings of DCLK_0/90/180/270. This means that the command/address signals from the MC have been transferred from the DRAM internal command address receiving 4-phase clocks to the DRAM internal data phase 4-phase clocks.

In short, according to this example, in the DRAMs, the DRAM internal command address receiving 4-phase clocks are produced from received clock signals. In this case, the DRAM internal command address receiving 4-phase clock having the same phase as that of the clock phase will be CLK_0, and clocks CLK_90, CLK_180 and CLK_270 are produced by shifting the phase by a quarter cycle. The DRAM internal data phase 4-phase clocks are generated from pseudo data clocks, and a clock of the same phase as a data phase will be DCLK_0. Clocks DCLK_90, DCLK_180 and DCLK_270 are produced by shifting the phase by a quarter cycle. In the case of this example, CLK_0 is associated with DCLK_0, CLK_90 is associated with DCLK_90, CLK_180 is associated with DCLK_180, and CLK_270 is associated with DCLK_270, respectively in the DRAM.

Subsequently, the DRAM transmits a pseudo clock data signal of the same phase with the DRAM internal data phase clock DCLK_0 at the DRAM end to the MC as a continuously reversing data signal. In the timing chart shown in FIG. 41, a continuously reversing data signal changes to provide output data in response to a DRAM internal data output clock, and corresponding data is output so as to transmit a pseudo clock signal of the same timing and phase as those of the internal data phase clock signal DCLK_0.

Meanwhile, the MC generates an MC internal data receiving clock and an MC internal data phase 4-phase clock upon receipt of the pseudo clock signal. Furthermore, a clock of the same phase as that of the pseudo clock is generated as an MC internal data phase 4-phase clock DCLKMC_0. At this point, the clock signal and the data phase clock are associated with each other in the MC.

In the MC, therefore, the command signal issued in synchronization with the clock signal is transferred onto the data phase clock timing produced in the MC, and the number of clocks is counted, thus allowing the data transmitted from the DRAM to be received.

Figure 46:
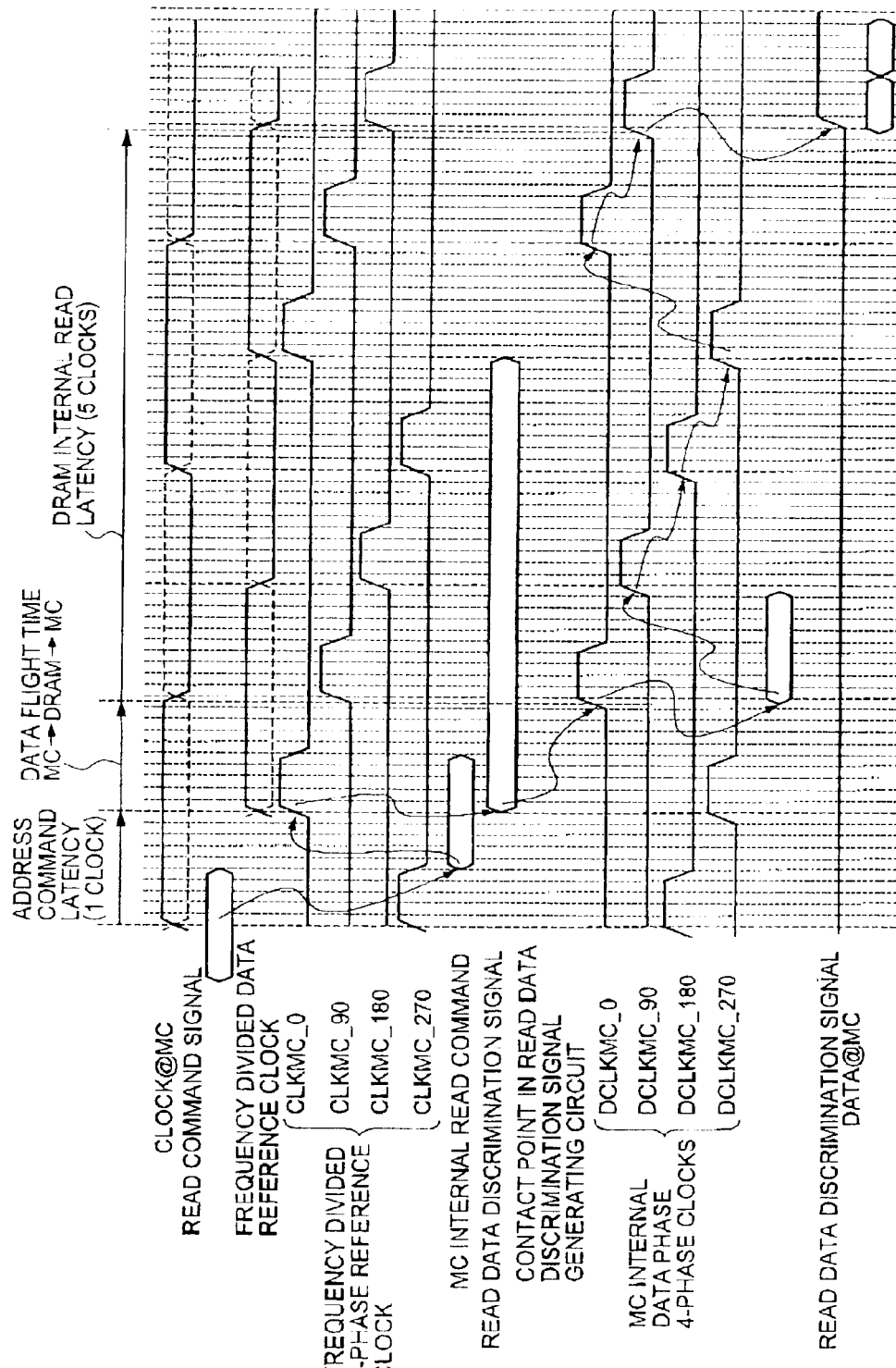
FIG. 46 is a timing chart illustrating the internal operation of the MC shown in FIG. 42.
Figure 47:
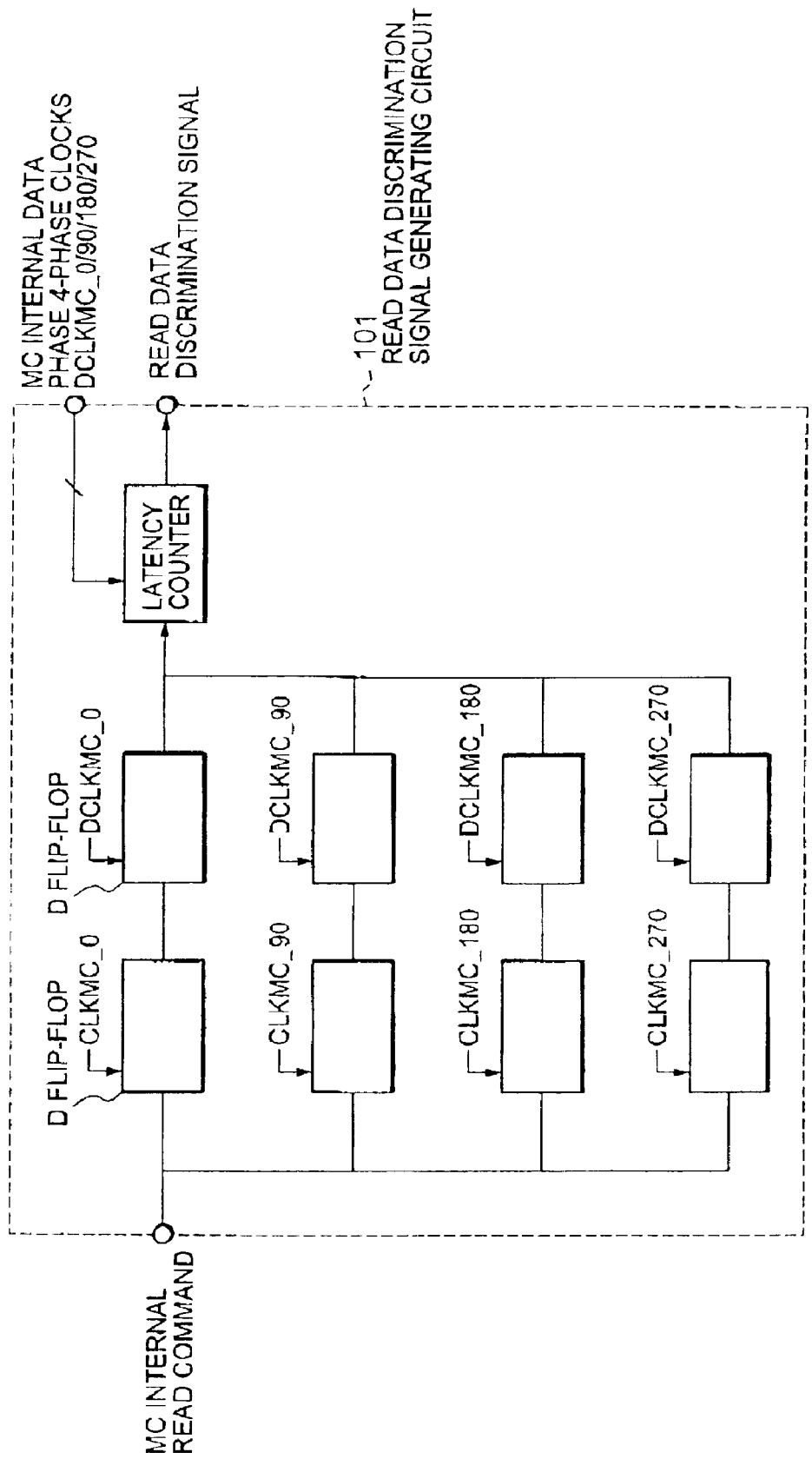
FIG. 47 is a block diagram showing a read data discriminating signal generating circuit shown in FIG. 42.

Referring now to FIGS. 42, 46 and 47, the operation performed from the moment a read command signal is issued from the MC to the moment read data associated with the read command signal is output to the MC will be explained. In this case, it is assumed that a 1-clock address command latency is given to the MC, while 5-clock internal read latency is given to the DRAM. In this case, as shown in FIG. 46, a frequency divided reference clock CLKMC is generated by delaying a clock signal in the MC, and frequency divided 4-phase reference clocks CLKMC_0/90/180/270 are produced on the basis of the above CLKMC by the reference clock generating circuit 100 and supplied to a read data discrimination signal generating circuit 101.

In this state, an MC internal read command is being supplied to the read data discrimination signal generating circuit 101 from a command address issuer 105 in the MC such that it matches CLKMC_0. Furthermore, as shown in FIG. 42, the MC internal data phase 4-phase clocks DCLKMC_0/90/180/270 from the MC data receiving clock generator 102 and the frequency divided 4-phase reference clocks CLKMC_0/90/180/270 from the reference clock generator 100 are being supplied to the read data discrimination signal generating circuit 101.

Referring to FIG. 47, the read data discrimination signal generating circuit 101 has a DF/F for capturing an MC internal read command at the timings of CLKMC_0/90/180/270, the command being taken out at the timings of DCLKMC_0/90/180/270. In the example illustrated in FIG. 46, the internal read command is captured at the timing of CLKMC_0 and output to a latency counter at the timing of DCLKMC_0. As shown in FIG. 46, the latency counter counts the DCLKMC_0/90/180/270 for five clocks, and activates the read data discrimination signal at the moment the count reaches five clocks so as to process the data received thereafter as read data (data@MC).

Thus, the example of the memory system according to the present invention does not have system clocks peculiar to data signals for transferring data signals. Instead, the phase differences between the pseudo clock signal obtained by continuously reversing data signals when initializing a system and the clock signals supplied to a DRAM by the same topology as that of address command signals are retained thereby to generate the clocks for transferring data signals in the DRAM, using the clock signals as the source clocks thereof.

In the case of the example described above, data signals are not referred to after initialization, and internal data phase clocks are produced by the DRAM internal data phase clock reproducing block on the basis of the phase differences between continuously reversing data signals and the clock signals retained during the initialization. For this reason, if the temperature conditions or voltage of the memory system changes after the initialization, then it is necessary to perform the initialization again. It is also necessary to perform re-initialization at appropriate intervals, assuming that conditional changes take place in a certain period of time. In any case, unexpected conditional changes after initialization lead to problems.

The following will describe an example showing a solution to a problem arising due to a phase difference discussed above.

Figure 48:
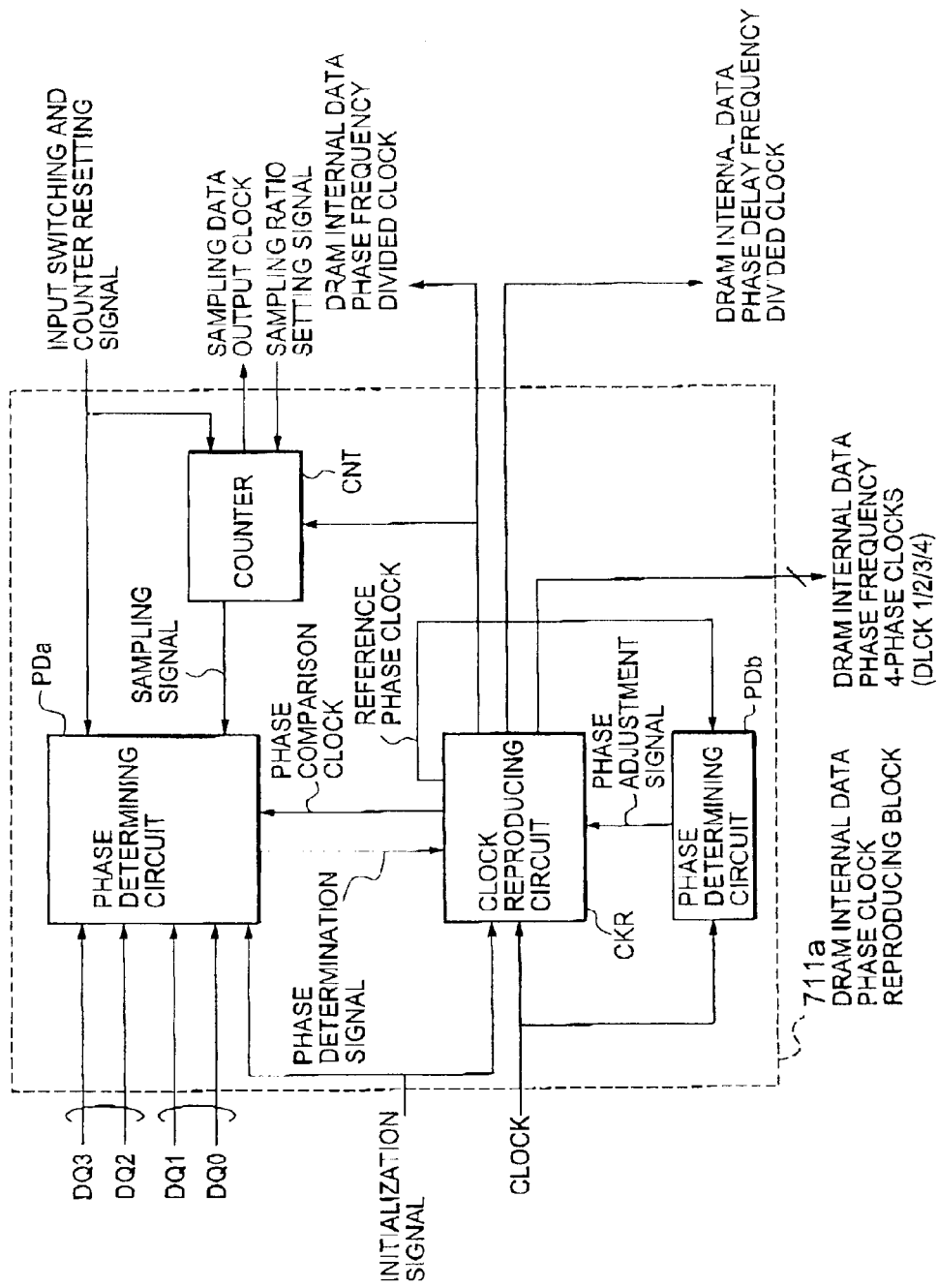
FIG. 48 is a block diagram showing a DRAM internal data phase clock reproducing block used with a fourth example of the present invention.

FIG. 48 shows a DRAM internal data phase clock reproducing block 711a used with a DRAM according to a fourth example of the present invention. As in the case of the previous examples, the DRAM internal data phase clock reproducing block 711a is provided in a DRAM data DLL circuit block 71. The DRAM internal data phase clock reproducing block 711a differs from the DRAM internal data phase clock reproducing block 711 or the like in other examples in that it has a counter CNT to count clock signals. By counting the number of clocks by the counter CNT, the frequency for sampling external data signals for generating DRAM internal data phase clocks can be changed.

As shown in FIG. 48, this example further differs from other examples in that it is provided with a phase determining circuit PDa for switching between data terminals DQ0,1 functioning as sampling terminals for external data signals during initialization and data terminals DQ2, 3 functioning as sampling terminals during normal operation. In this example, it is assumed that continuously reversing data signals are input as pseudo signals through the data terminals DQ0, 1 provided in a DRAM during initialization. A clock reproducing circuit CKR and a phase determining circuit PDb in the figure are the same as those shown in FIG. 14, so that the description thereof will be omitted.

Figure 49:
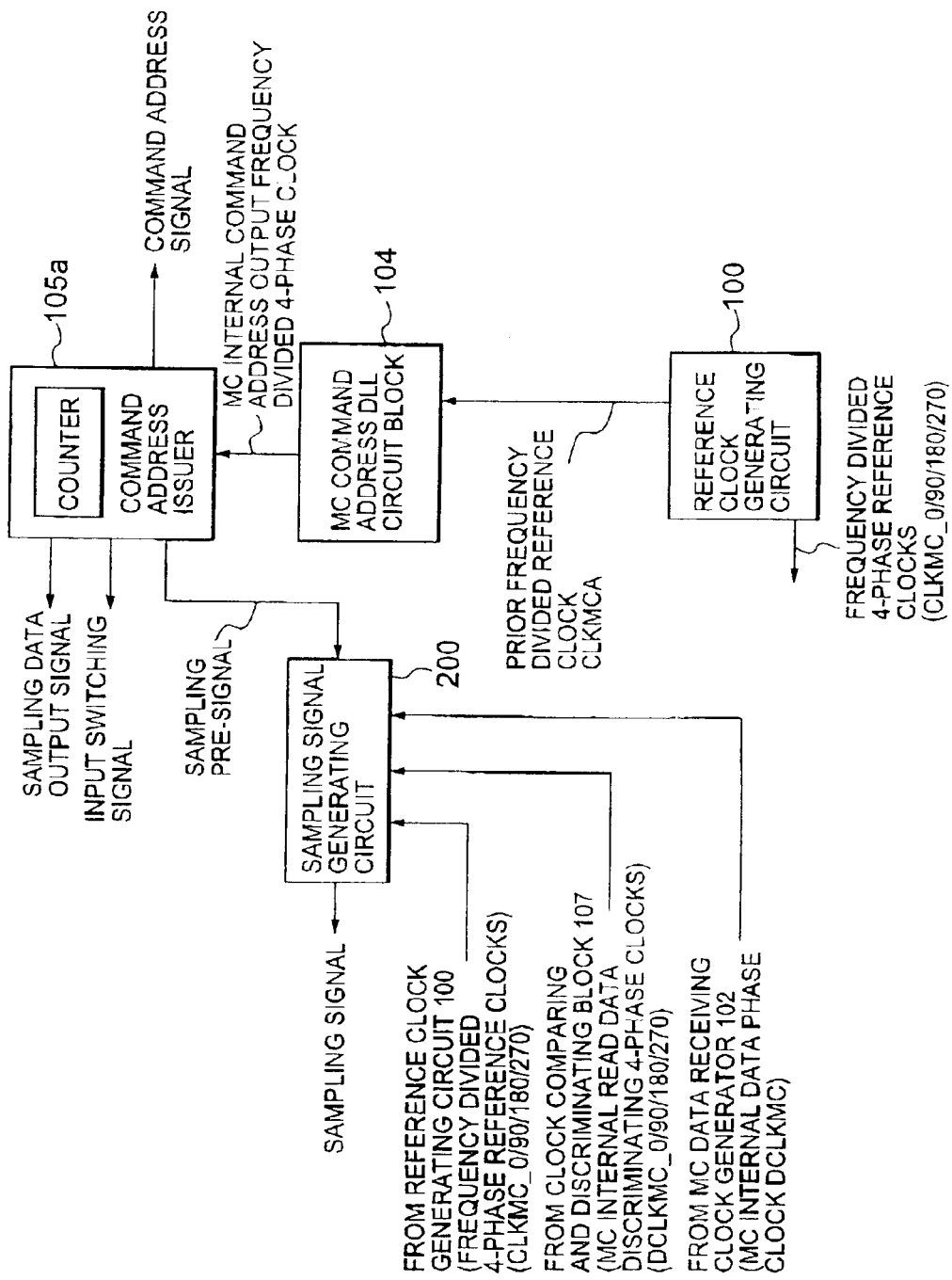
FIG. 49 is a block diagram showing a schematic configuration of an MC used in the fourth example of the present invention.

FIG. 49 shows a schematic construction of an MC used in combination with the DRAM internal data phase clock reproducing block 711a shown in FIG. 48. The MC shown in FIG. 49 is similar to the MC shown in FIG. 28 in that it is also provided with a reference clock generating circuit 100 and an MC command address DLL circuit block 104. The MC command address DLL circuit block 104 supplies MC internal command address output frequency divided 4-phase clocks to a command address issuer 105a. The command address issuer 105a differs from the command address issuer 105 shown in FIG. 28 in that it has a counter. The counter counts the MC internal command address output frequency divided 4-phase clocks from the MC internal command address DLL circuit block 104, and outputs sampling data output signals, input switching signals and sampling pre-signals, as will be discussed hereinafter. The sampling pre-signals are supplied to a sampling signal generating circuit 200.

The sampling signal generating circuit 200 receives sampling pre-signals, the frequency divided 4-phase reference clocks (CLKMC_0/90/180/270) from the reference clock generating circuit 100, the MC internal read data discrimination 4-phase clocks (DCLKMMC_0/90/180/270) from the clock comparing and discriminating block 107 shown in FIG. 28, and the MC internal data phase clocks (DCLKMC) from the MC data receiving clock generator 102. Based on these clocks, sampling signals are output.

Figure 50:
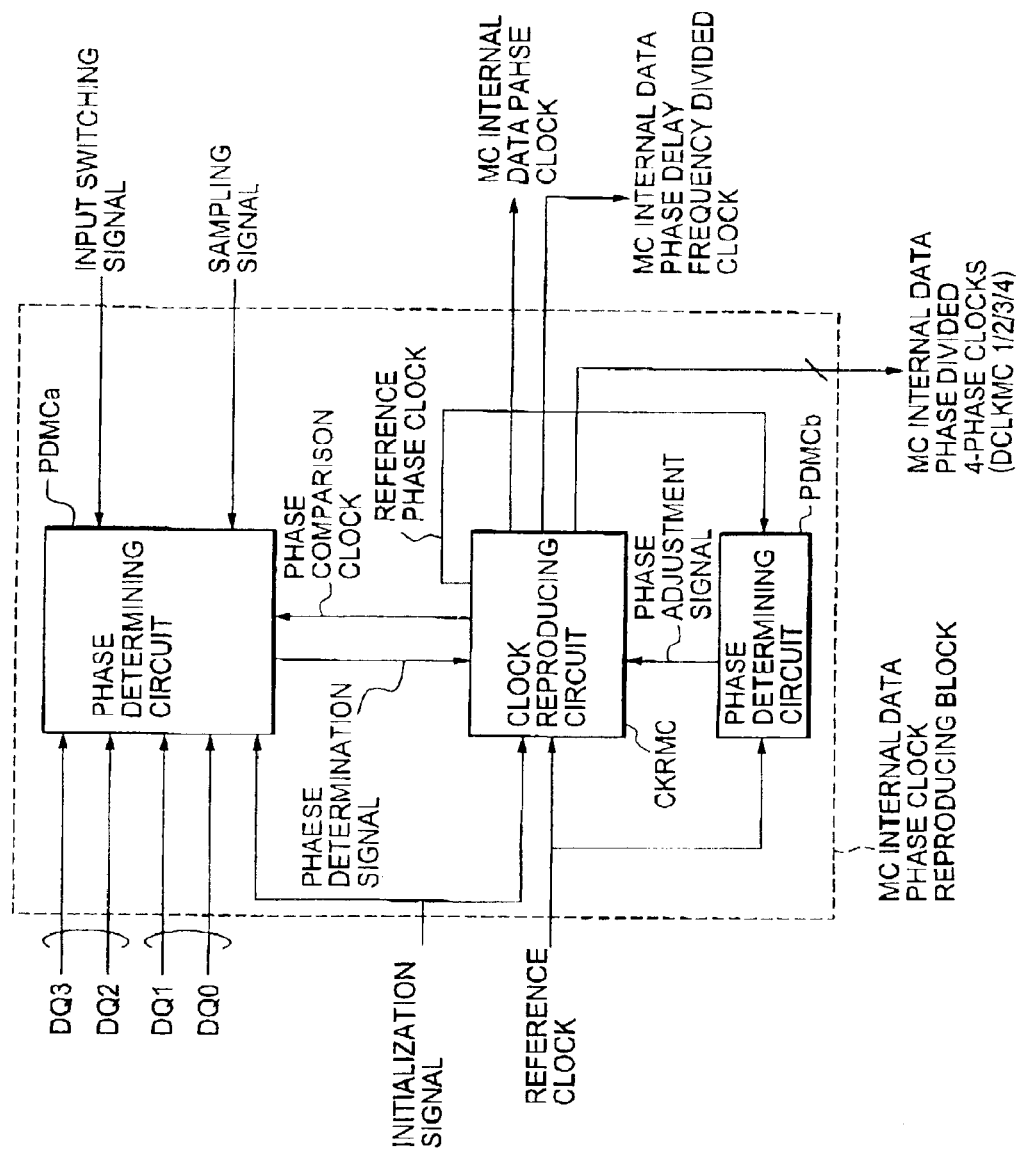
FIG. 50 is a block diagram showing an MC internal data phase clock reproducing block used in the fourth example.

The input switching signals from a command address issuer 105a shown in FIG. 49 are supplied to an MC internal data phase clock reproducing block 1021a of the MC data receiving clock generator 102 shown in FIG. 28 (refer to FIG. 50). The MC internal data phase clock reproducing block 1021a shown in FIG. 50 includes a phase determining circuit PDMCa actuated in response to an input switching signal and a sampling signal received from the sampling signal generating circuit 200 shown in FIG. 49, a phase determining circuit PDMCb actuated in response to a reference clock and a reference phase clock, and a clock reproducing circuit CKRMC. The clock reproducing circuit CKRMC and the phase determining circuit PDMCb operate similarly to the circuit shown in FIG. 29. The clock reproducing circuit CKRMC generates MC internal data phase clocks DCLKMC and MC internal data phase delay frequency divided clocks, and outputs MC internal data phase clock frequency divided clocks DCLKMC1/2/3/4 to the clock comparing and discriminating circuit 107.

Figure 51:
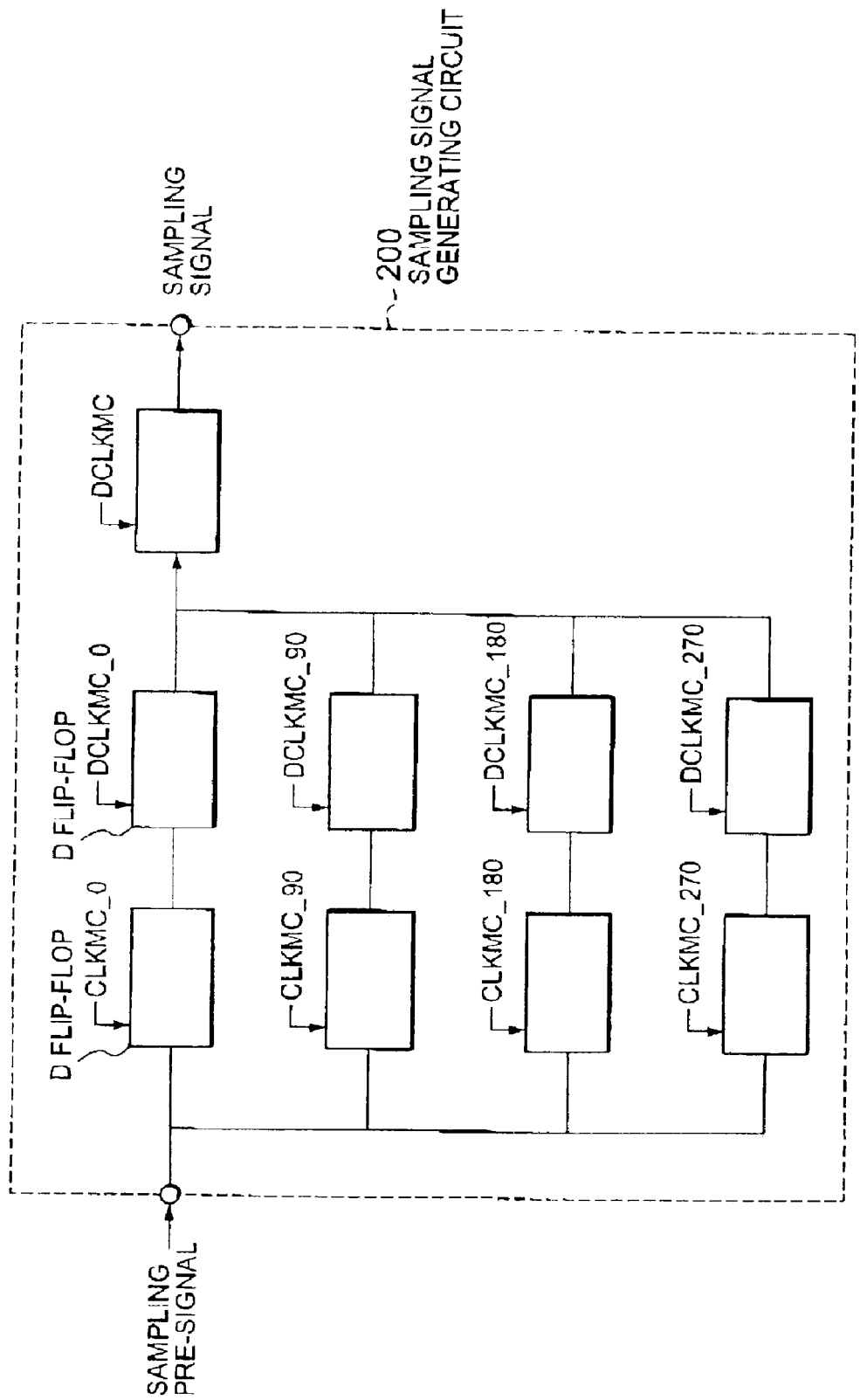
FIG. 51 is a block diagram showing a sampling signal generating circuit shown in FIG. 49.

Referring now to FIG. 51, a specific configuration of the sampling signal generating circuit 200 shown in FIG. 49 will be explained. The sampling signal generating circuit 200 has four sets of DF/Fs in two stages connected in series. Sampling pre-signals from the command address issuer 105a are supplied to the four sets of DF/Fs in a first stage. The DF/Fs in the first stage hold the sampling pre-signals at the timings of the frequency divided 4-phase reference clocks (CLKMC_0/90/180/270) supplied from the reference clock generating circuit 100, then the DF/Fs in a second stage hold the outputs of the DF/Fs in the first stage at the timings of the MC internal read data discrimination 4-phase clocks (DCLKMC_0/90/180/270) supplied from the clock comparing and discriminating circuit 107. The outputs of the DF/Fs in the second stage are taken out by the DF/Fs in a third stage at the timings of the MC internal data phase clocks DCLKMC supplied from the MC data receiving clock generator 102 and output as sampling signals. This means that the sampling pre-signals from the command address issuer 105a are transferred from the timings of CLKMC_0/90/180/270 of the reference clock generating circuit 100 to the timings of the data signal receiving data phase clocks DCLKMC in the MC.

The operation of a memory system according to a fourth example of the present invention that has the DRAMs and the MC shown in FIGS. 48 through 51 will be described with reference to the timing charts shown in FIGS. 52 and 53.

Figure 52:
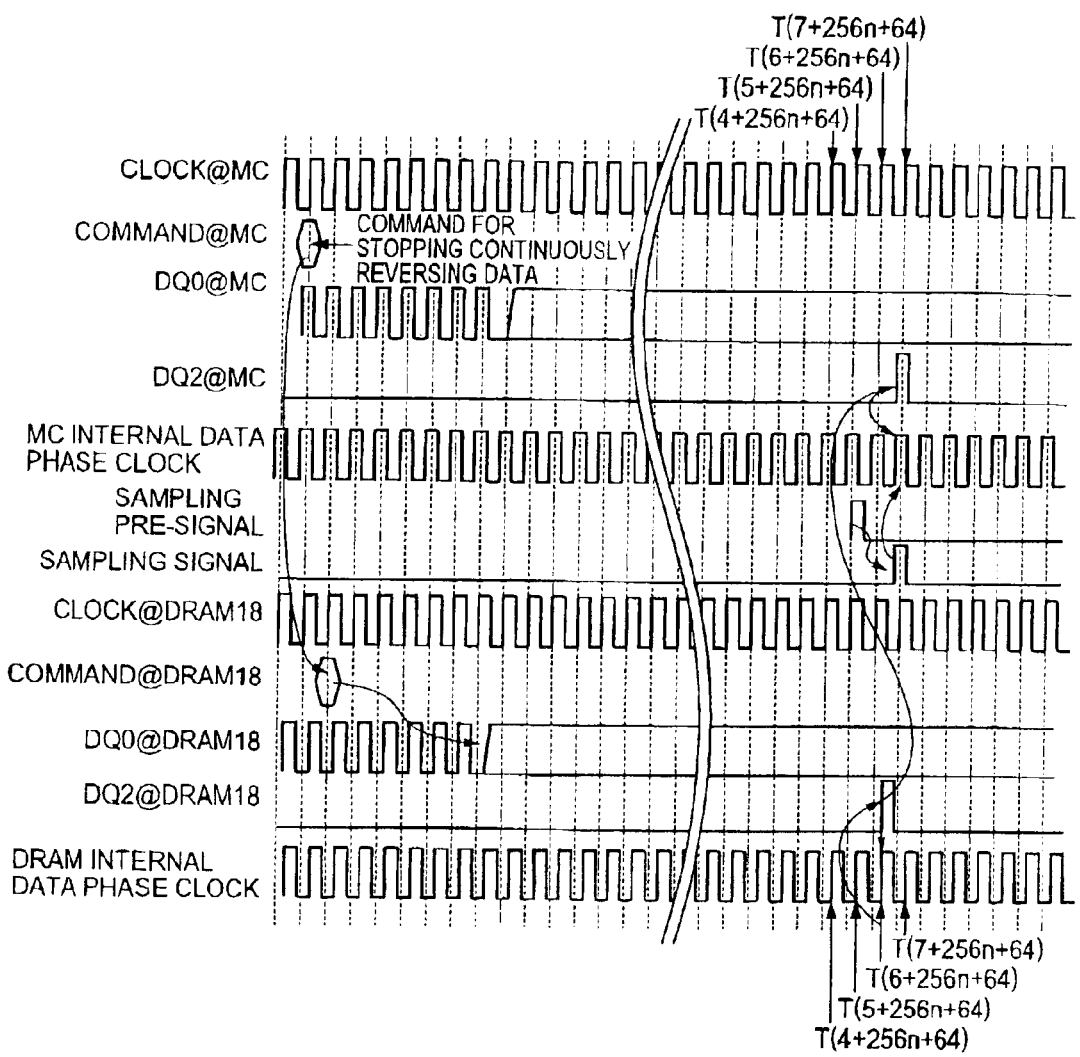
FIG. 52 is a timing chart illustrating the initializing operation of a memory system according to the fourth example of the present invention.

Referring first to FIG. 52, it is assumed that the MC outputs clock signals to clock lines (clock@MC) at initialization and is outputting a continuously reversing data signal to a data line through a data terminal DQ0 (refer to DQ0@MC). In this state, a command for stopping the continuously reversing data signal is output from the command address issuer 105a shown in FIG. 49 by being matched to the clock signal (refer to command@MC). In this case, an MC internal data phase clock is being generated in the MC, as shown in FIG. 52. The aforesaid clock signal and the continuously reversing data signal are supplied to a DRAM 18 through clock lines having different topologies and data lines (refer to clock@DRAM18 and DQ0@DRAM18). Meanwhile, the command for stopping the continuously reversing data signal is supplied to the DRAM 18 (command@DRAM18) through command/address lines having the same topology as that of the clock lines. As previously mentioned, in the DRAM 18, a DRAM internal data phase clock is generated on the basis of the continuously reversing data signal that arrives earlier than a command through the data terminal DQ0. The DRAM 18 receives the arrived command for stopping the continuously reversing data signal by matching it to internal data phase clocks, counts a predetermined number (6 in this example) of the internal data phase clocks, then stops the continuously reversing data signal received through the data terminal DQ0 (refer to DQ0@DRAM18).

In the MC, after the command for stopping the continuously reversing data signal is output, the clock signals are counted up to 8, then the output of the continuously reversing data signal is stopped, and the data terminal DQ0 is switched to the data terminal DQ2. In this case, when the command for stopping the continuously reversing data signal is issued to the DRAM (refer to command@MC), the sampling clocks from the DRAM thereafter are transferred between the DRAM and the MC according to a count value set during the initialization.

In the MC shown in FIG. 49, after the command for stopping the continuously reversing data signal is sent out, the counter of the command address issuer 105a begins counting internal command address clocks, and when the count value on the counter reaches a predetermined value (T(5+256n+64) in this case), the counter outputs a sampling pre-signal to the sampling signal generating circuit 200 shown in FIG. 49. As a result, the MC switches data signal monitoring terminals from DQ0,1 to DQ2,3 in response to an input switching signal. At the 6+256n+64th clock, the DRAM issues sampling clocks to DQ2,3 for every 256 clocks. The MC receives the sampling clocks to adjust a data phase.

Meanwhile, upon receipt of the command for stopping the continuously reversing data signal, the DRAM 18 counts DRAM internal data phase clocks by a counter CNT shown in FIG. 48, and when a predetermined count value (T(6+256n+64) in this example) is reached, a sampling signal is output to the data terminal DQ2, and the sampling signal is received through the data terminal DQ2 of the MC at the timing of ((T(7+256n+64)).

As described with reference to FIG. 51, in the sampling signal generating circuit 200 of the MC, the sampling pre-signal is transferred from the timings of CLKMC_0/90/180/270 to the timings of MC internal data phase clocks DCLKMC to produce a sampling signal (refer to FIG. 52). An MC internal data phase clock based on the phase difference between a sampling signal (DQ2@MC) from the DRAM 18 supplied through the data terminal DQ2 and a sampling signal generated in the MC is generated, as shown in FIG. 52.

A sampling data output signal in the DRAM is generated by the counter CNT shown in FIG. 48. Regarding the timing of sampling clocks from the DRAM, the sampling pre-signal shown in FIG. 49 is transferred to the timing of the MC internal data phase clocks by the sampling signal generating circuit shown in FIG. 51, and the phase is determined by an MC internal data phase clock reproducing block 1021*a* shown in FIG. 50.

As discussed above, an input switching signal and a counter resetting signal are supplied as commands from the MC to a DRAM reproducing block 711*a* shown in FIG. 48. The counter CNT is reset upon receipt of a counter resetting signal, and it starts counting the DRAM internal data phase frequency divided clocks from a clock reproducing circuit CKR. Meanwhile, a phase determining circuit PDa switches between the data terminals DQ0, 1 and the data terminals DQ2, 3 in response to the input switching signal. The rest of the configurations of the clock reproducing circuit CKR and the phase determining circuit PDb are identical to those shown in FIG. 14, so that the description thereof will not be repeated.

An outline of the operation of the DRAM internal data phase reproducing block 711*a* shown in FIG. 48 will be given with reference to the timing chart of FIG. 53. First, at initialization, internal data phase clocks are generated using a pseudo clock signal supplied to the data terminals DQ0, 1, as described above.

The MC outputs a clock signal (clock@MC) to the DRAM through a clock line and also outputs a phase retaining command and a counter resetting command (refer to command@MC) to a command line as commands. In the example, the commands are issued at a timing matched to a clock signal T1. Meanwhile, continuously reversing data signals are output as pseudo clock signals (refer to T1 through T6) to the data terminal DQ0 or 1 (DQ0 in this case). The clock signals and the commands are received by the DRAM 18 with virtually the same delay time (refer to clock@DRAM18 and command@DRAM18), while the pseudo clock signals reach the DRAM 18 at an earlier timing than that of the clock signals and the commands (refer to DQ0@DRAM18). The MC begins counting clock signals by the counter of the command address issuer 105*a* after 4 clocks. Following 256 clocks, a sampling ratio setting signal is output to the data terminal DQ2 at a timing of T261(5+256). A sampling setting signal here is a signal for setting the frequency for sampling data signals after initialization. The MC sets the sampling setting signal in a DRAM by an address signal or the like at initialization according to a system construction. In this example, the setting is made so that data signals are sampled every 256 clocks. (During initialization, the sampling is carried out at a higher frequency, e.g., every clock or a few clocks, and locked in at high speed.)

Figure 53:
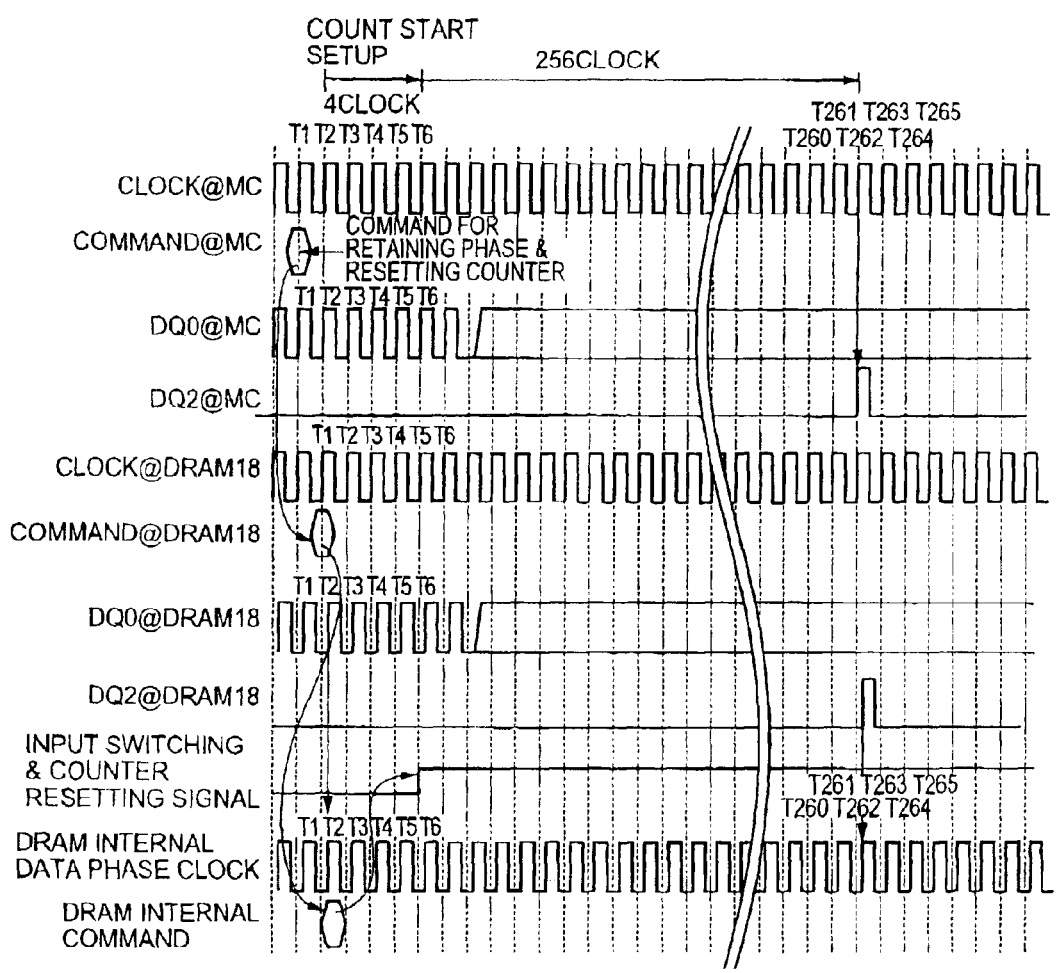
FIG. 53 is a timing chart illustrating the sampling timings in the fourth example of the present invention.

As in the case of the examples discussed above, the reproducing block 711*a* shown in FIG. 48 generates internal data clock signals based on the pseudo clock signals supplied through the data terminals DQ0, 1 (refer to the DRAM internal phase clocks shown in FIG. 53). Meanwhile, the command for retaining a phase and for resetting the counter, that is, an initialization completion signal, is received by a DRAM internal command by being matched at a clock T2 among DRAM internal data phase clocks.

In the DRAM, upon receipt of the DRAM internal command, the input switching signal and the counter resetting signal are switched to high level when a predetermined number of clocks (4 clocks in this example) is reached. In this state, the counter CNT is reset and started to begin counting clocks, while the data terminal DQ0 is switched to the data terminal DQ2 at the same time (refer to DQ0@DRAM18 and DQ2@DRAM18).

Thus, the reproducing block 711*a* in the DRAM shown in FIG. 48 switches the data phase monitoring terminal to DQ2, 3 in response to an input switching signal. This is necessary to use DQ0,1 for initializing a data phase from the DRAM with respect to the MC. Hence, the phase determining circuit PDa shown in FIG. 48 is configured to switch the data terminal DQ0,1 to the data terminal DQ2,3 in response to an input switching signal.

As described above, the sampling ratio setting signal is supplied to the counter CNT through the data terminal DQ2 (DQ2@DRAM18) at the timing of a DRAM internal data phase clock T262 in this example. In the DRAM, upon receipt of the sampling setting signal, a sampling signal is output from the counter CNT for every 256 clocks and a sampling data output signal is output.

Thus, the clocks in the MC and the DRAM are synchronously counted. For every 256 clocks, a sampling clock is issued from the MC to DQ2,3, and the DRAM refers to the clock to adjust a clock phase. When the phase of a data signal with respect to a clock signal is retained, the frequency of generating clocks for the data signal may be periodically reduced, and the sampling frequency of in the clock reproducing circuit may be also reduced to adjust a data phase thereafter. In this case, normal data transmission is performed between sampling clocks.

The MC has a counter in the command address issuer 105*a* in the MC to count the clocks after a phase is retained and the command for resetting the counter is issued. When a predetermined number of clocks is reached, a sampling data output signal is generated so as to issue sampling clock data, and sampling clocks are issued.

The timings are shifted 64 clocks in order to provide appropriate intervals between the sampling clocks from the MC to the DRAM and the sampling clocks from the DRAM to the MC.

Figure 54:
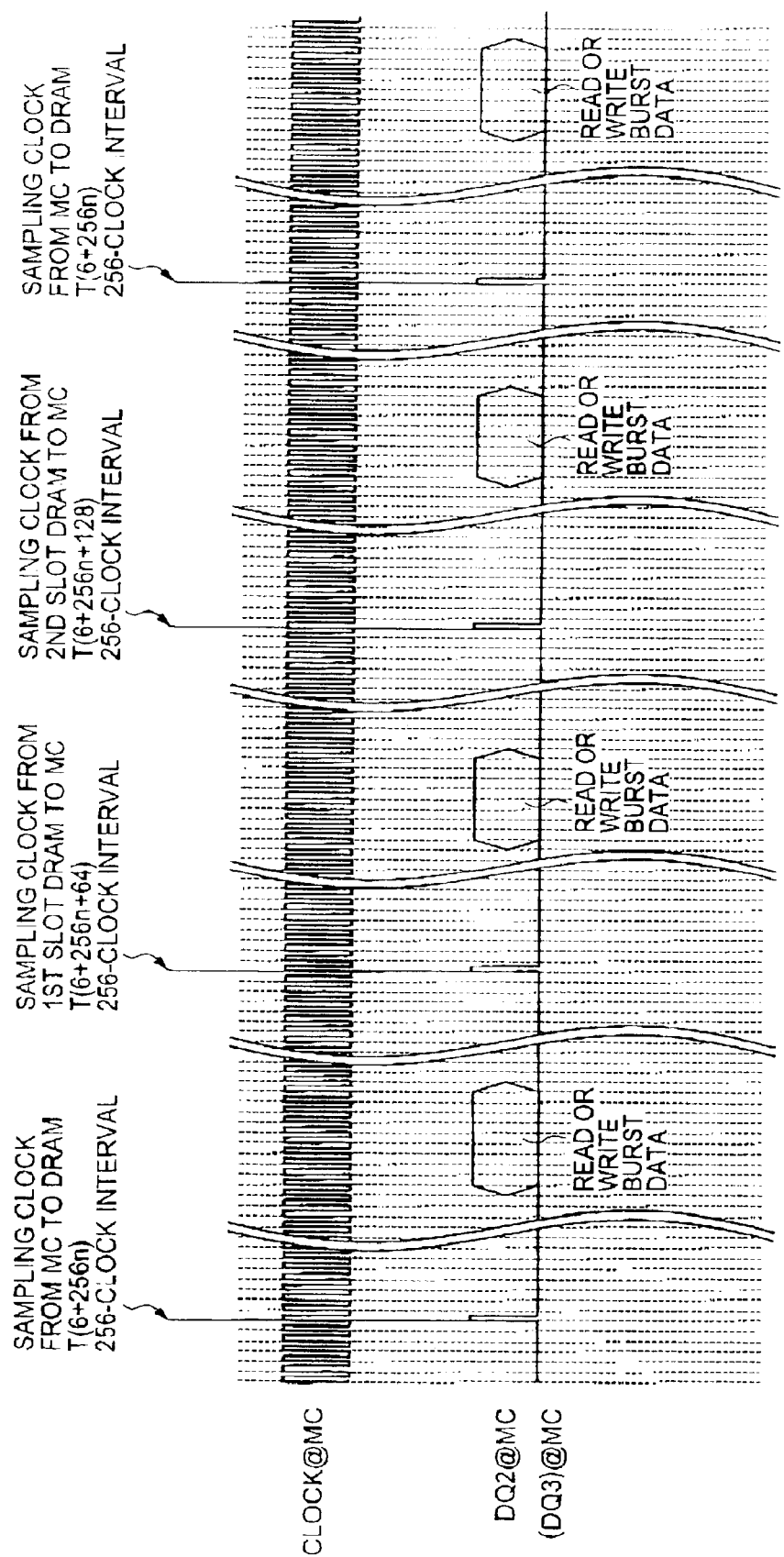
FIG. 54 is a timing chart illustrating a relationship between sampling clocks and read/write data in the fourth example of the present invention.

FIG. 54 shows the sampling clocks observed when the present invention is applied to a memory system of two ranks. In FIG. 54, the DRAM of rank 1 is assumed to be installed in a first slot, and the DRAM of rank 2 in a second slot. In this case, when a sampling clock is output from the MC to the DRAM in the first slot at a timing T(6+256n), the DRAM in the first slot outputs a sampling clock to the MC at a timing of T(6+256n+64). More specifically, with the 64-clock intervals, the sampling clock is supplied to a DRAM data terminal DQ2 or DQ3 of the first slot (DQ2@DRAM) for every 256 clocks. Meanwhile, the DRAM in the second slot outputs the sampling clock to DQ2,3 at the timing T(6+256n+128), with the 64-clock intervals. Thus, the data terminals DQ2,3 are shared among the DRAMs of all ranks to transmit sampling clocks. Hence, as shown in FIG. 54, write or read in normal operation is performed in a duration free of sampling clocks.

Figure 55:
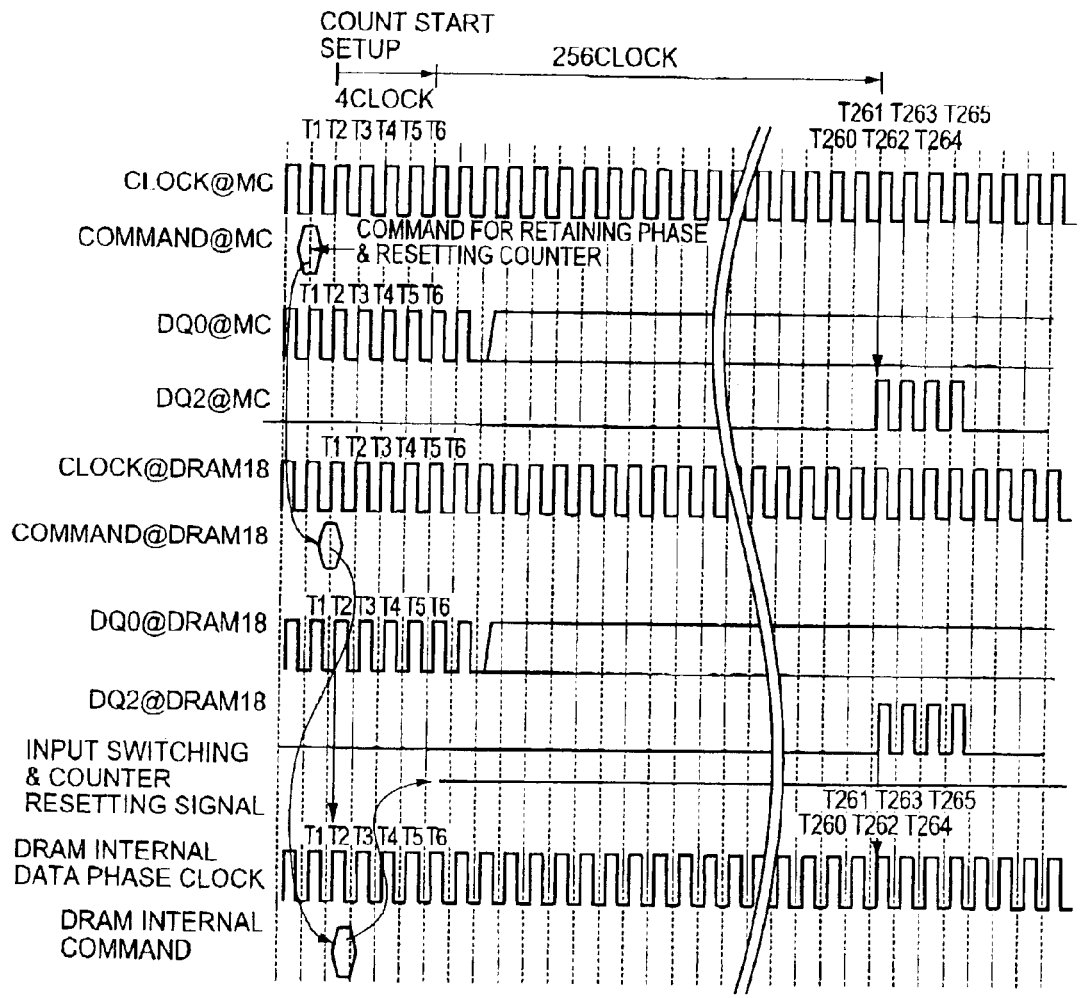
FIG. 55 is a timing chart illustrating modification examples of the fourth example of the present invention.

In the example shown in FIGS. 48 through 54, the description has been given of the phase adjustment performed by referring to a single sampling clock. As shown in FIG. 55, however, a plurality of clocks may be used for sampling (refer to DQ2@MC and DQ2DRAM18).

The example described above makes it possible to reduce the frequency of sampling the phases of data signals after initialization, and to always perform data phase adjustment while permitting data burst in normal operation, thereby permitting higher reliability of a memory system. It is understood that, in this example, after a phase is retained by a DRAM, which is a device, the frequency of generation of clocks for data signal from the MC is periodically reduced, and data phase is adjusted in the DRAM thereafter.

In the fourth example previously described, the sampling terminal is switched from the data terminal DQ0,1 to the data terminal DQ2,3 after initialization. This slightly restricts read or write timings during normal operation. To solve this problem, dedicated sampling terminals (data recovery terminals CDR, CDRB) used after initialization are provided in a fifth example, which will be described below.

Figure 56:
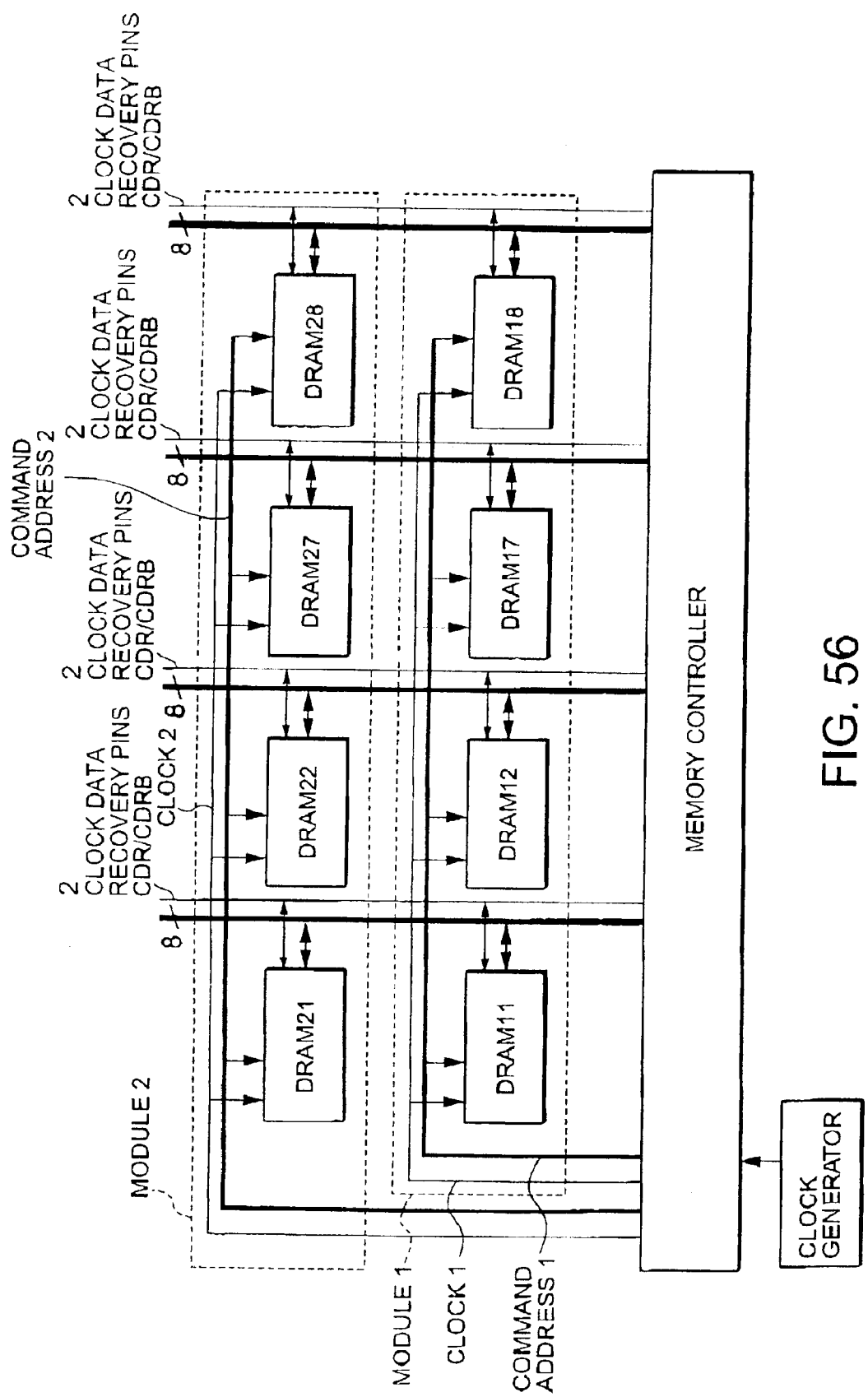
FIG. 56 is a block diagram showing a memory system according to a fifth example of the present invention.

Referring to FIG. 56, a memory system according to the example differs from the memory systems according to other examples in that clock data recovery lines having the same topology as that of data lines are provided between the MC and DRAMs and that each DRAM is provided with clock data recovery pins CDR/CDRB.

The operation of this example is identical to that of the foregoing fourth example; however, the fifth example is provided with the dedicated signal lines, so that there are no restrictions on the read or write operation during normal operation. This permits a sampling frequency to be increased with resultant higher reliability.

Figure 57:
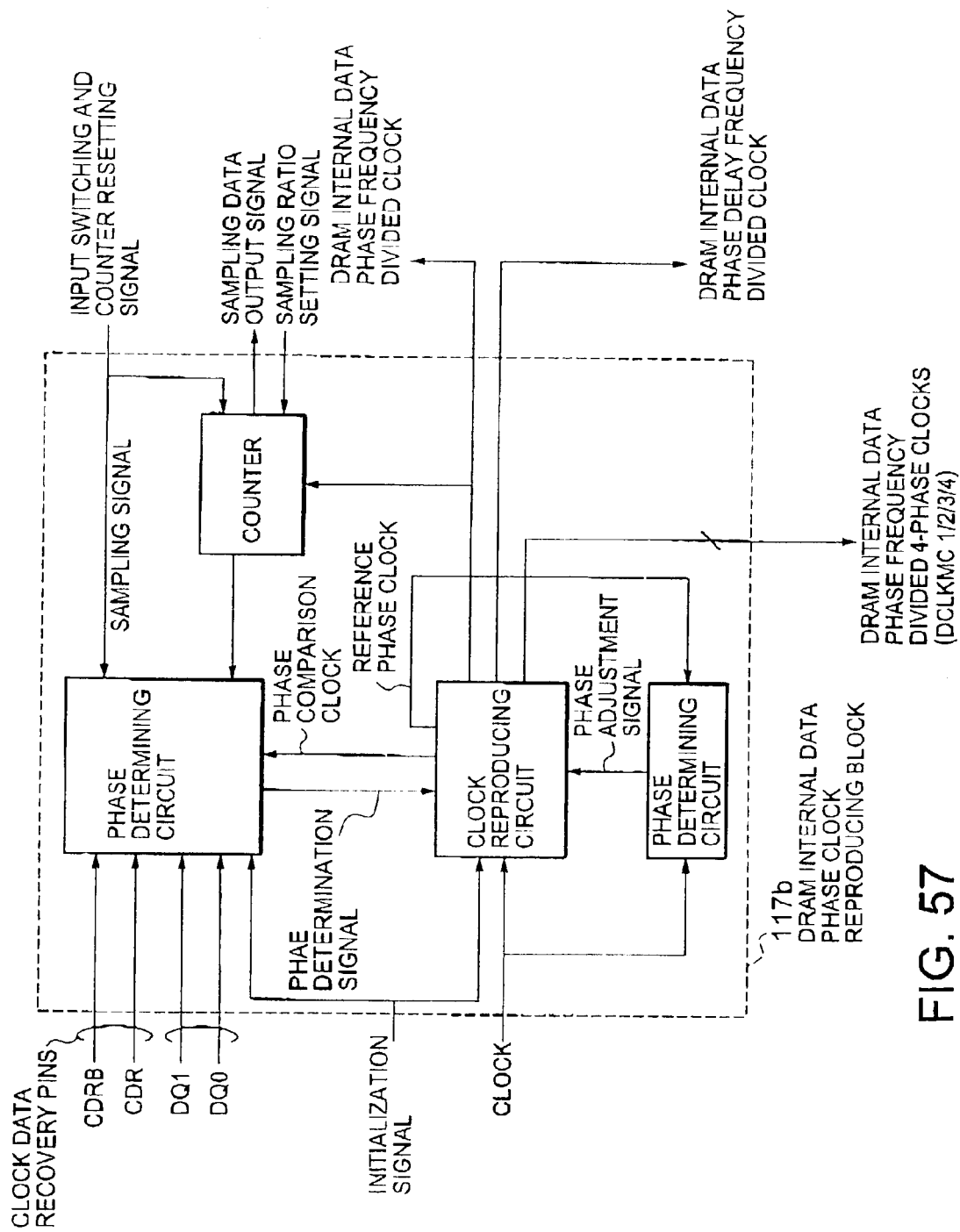
FIG. 57 is a block diagram showing the configuration of a DRAM used with the memory system shown in FIG. 56.
Figure 58:
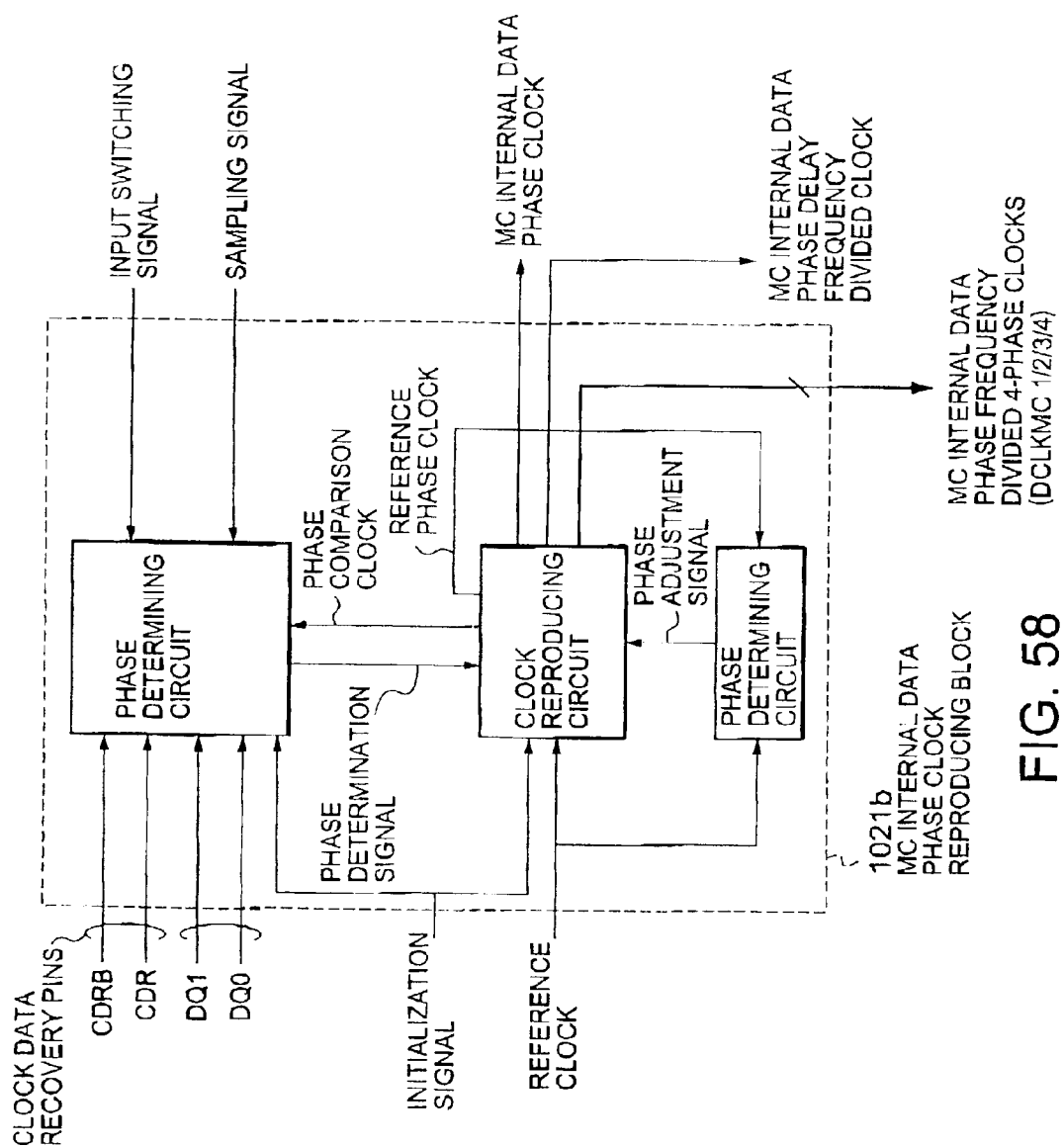
FIG. 58 is a block diagram showing the configuration of an MC used with the memory system shown in FIG. 56.
Figure 59:
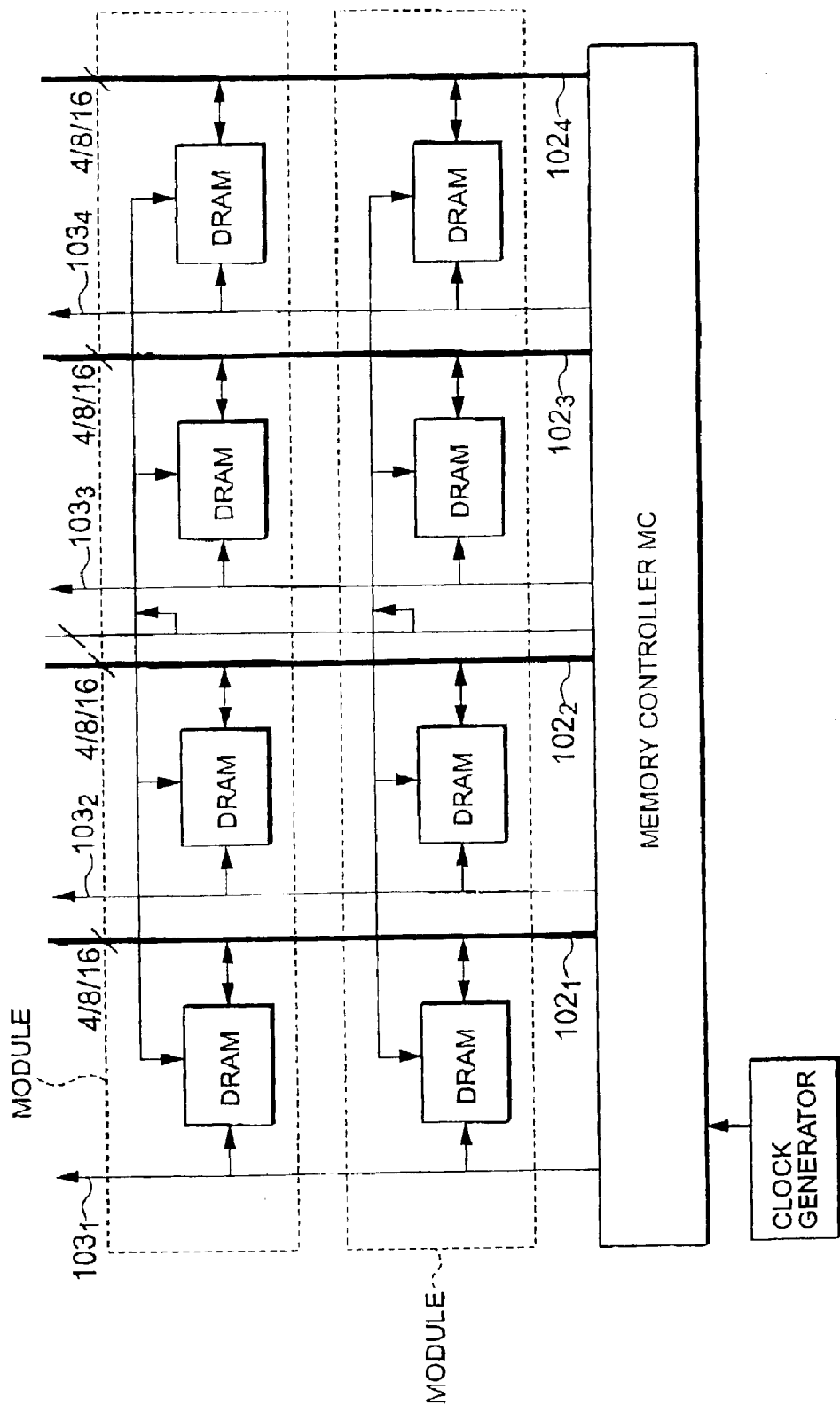
FIG. 59 is a block diagram showing the configuration of the memory system previously proposed by the applicant.

Referring to FIG. 57, the DRAMs shown in FIG. 56 are the same as those shown in FIG. 48 except that a DRAM internal data phase clock reproducing block 711b is equipped with clock data recovery pins CDR/CDRB in place of the data terminals DQ2 and DQ3 shown in FIG. 48, and the pins CDR/CDRB are connected to a phase determining circuit. The memory system according to the fifth example also differs from that shown in FIG. 50 in that the clock data recovery pins CDR/CDRB are also provided in an MC internal data phase clock reproducing block 1021b of the MC shown in FIG. 58. The operation of the system shown in FIGS. 57 and 58 is identical to that shown in FIGS. 48 and 49 except for the use of the clock data recovery pins CDR/CDRB in place of the data terminals DQ2,3; therefore, the description will be omitted. Accordingly, in this case also, after a phase is retained in a DRAM, a pseudo clock signal having its frequency reduced may be transmitted to a dedicated sampling data line from the MC, and a sampling frequency may also be reduced to adjust a data phase in a DRAM clock reproducing circuit, or a pseudo clock signal having its clock generating frequency periodically reduced may be transmitted to the dedicated sampling data line so that the DRAM may adjust a data phase by the pseudo clock signal.

The example shown in FIGS. 56 through 58 may be configured to carry out sampling by using a plurality of clocks rather than a 1-clock sampling.

In the example described with reference to FIGS. 48 through 58, the description has been given of the case where a transmission line is used to transmit sampling clocks in only one direction from the MC to the DRAMs. The present invention, however, can be applied also to a case where sampling clocks are shared among a plurality of DRAMs through a transmission line. Moreover, the signal line may be used also for transmitting controller data from the DRAMs rather than being used merely for transmitting sampling clocks of the DRAMs from the MC.

In the embodiments and examples described above, only the memory systems that include the MCs and the DRAMs have been described. The present invention, however, can be applied also to a system equipped with a controller and a device that are connected with a clock line and a data line, and a control method for the same. The devices are not limited to DRAMs. In this case, a plurality of devices are preferably disposed in a scattered fashion on a module.

Furthermore, frequency divided clocks and frequency divided pseudo clock signals may be transferred between an MC and a DRAM only during initialization, and after completion of the initialization, data may be read or written using clock signals that are not frequency-divided. The present invention can be also applied to a memory system that operates at a low clock frequency so that the time lag between clocks and command/address signals and data signals leads to no problem, rather than being restrictively applied to a memory system having high clock frequencies.

Thus, according to the present invention, in a system having devices connected to data lines that are disposed in a scattered fashion on a plurality of modules, data lines have a different topology from those of clock lines and command/address lines, and the clock lines and command/address lines are exclusively disposed for each module, while the data lines are commonly connected to the devices on the plurality of modules. This arrangement allows a clock signal to be distributed to each module, making it possible to reduce the number of clock signals and to increase the frequencies of the clock signals.

In addition, according to the present invention, the influences attributable to the different delay times of clock signals and data signals can be restrained by transferring a continuously reversing data signal at initialization to set separate internal data clocks in a controller and a device so as to separately operate them on the basis of the internal data clocks. Moreover, carrying out sampling at regular intervals makes it possible to restrain malfunction caused by changes in phase.

What is claimed is:

1. A memory system comprising: a memory device; and a memory controller for controlling the memory device, wherein the memory controller comprises a means for outputting, to the memory device, a command/address signal matched with a clock signal together with a data signal also, and the memory device comprises a means for receiving the command/address signal to generate an internal command/address signal based on the data signal.

2. The memory system according to claim 1, wherein the memory controller comprises a means for outputting a pseudo clock signal to a data signal line at initialization of the system so as to give timing for the data signal, and the memory device comprises a means for internally generating an internal clock which has the phase of the data signal by using the pseudo clock signal as a source in response to the pseudo signal, thus retaining the timing of the data signal in the memory device.

3. The memory system according to claim 1, wherein the memory device comprises:
   a means for generating a first multi-phase clock of a shifted phase obtained by dividing the frequency of the clock signal internally supplied from the memory controller;
   a means for generating an internal clock of the memory device having the phase of the data signal;
   a means for generating a second multi-phase clock of a shifted phase obtained by dividing the internal clock by the same cycle as that of the clock signal; and
   a means for generating an internal command/address signal of a data signal phase by making the first and second multi-phase clocks correspond to one another on a one-to-one basis.

4. The memory system according to claim 3, wherein the memory controller comprises a means for outputting a pseudo clock signal at initialization as a frequency divided clock, and
   the memory device comprises a means for comparing a reception clock obtained from a received command/address signal with the frequency divided clock to make the frequency divided clock and the reception clock correspond to each other.

5. The memory system according to claim 1, wherein the memory controller comprises a means for generating first and second pseudo frequency divided clocks by dividing the frequencies of the command/address signal and the data signal, respectively, and
   the memory device has a means for comparing the first and second pseudo frequency divided clocks with one another to make them correspond to one another.

6. The memory system according to claim 1, wherein
   the memory controller comprises a means for outputting both a pseudo clock signal obtained by frequency-dividing a data signal and a clock signal for generating timing for the data signal by frequency-dividing the data signal, and
   the memory device has a means for internally generating multi-phase clocks obtained by shifting the phases from individual frequency divided clocks and a means for generating an internal command/address signal which has the phase of a data signal by associating the multi-phase clocks.

7. The memory system according to claim 6, wherein the memory device has a means for transmitting a data signal to the memory controller at the timing of the internal data phase clock.

8. The memory system according to claim 7, wherein the memory controller comprises a means for generating timing for discriminating a data signal on the basis of a pseudo frequency divided clock in response to the pseudo frequency divided clock generated at the timing of the internal data phase clock of the memory device.

9. The memory system according to claim 1, wherein the memory device is a DRAM.

10. A memory system comprising:
    a plurality of memory devices operable in common in response to a command/address signal; and
    a memory controller for controlling the memory devices, wherein
    each of the plurality of memory devices comprises a means for receiving data signals all made to correspond to one another, and a means for generating internal command/address signals on the basis of each timing of the data signals.

11. The memory system according to claim 10, wherein the memory controller comprises a means for outputting a pseudo clock signal to a data signal line at initialization of the system so as to give timing for the data signal, and
    the memory device comprises a means for internally generating an internal clock which has the phase of the data signal by using the pseudo clock signal as a source in response to the pseudo signal, thus retaining the timing of the data signal in the memory device.

12. The memory system according to claim 11, wherein the memory controller comprises a means for outputting a pseudo clock signal at initialization as a frequency divided clock, and
    the memory device comprises a means for comparing a reception clock obtained from a received command/address signal with the frequency divided clock to make the frequency divided clock and the reception clock correspond to each other.

13. The memory system according to claim 10, wherein the memory device comprises:
    a means for generating a first multi-phase clock of a shifted phase obtained by dividing the frequency of the clock signal internally supplied from the memory controller;
    a means for generating an internal clock of the memory device having the phase of the data signal;
    a means for generating a second multi-phase clock of a shifted phase obtained by dividing the internal clock by the same cycle as that of the clock signal; and
    a means for generating an internal command/address signal of a data signal phase by making the first and second multi-phase clocks correspond to one another on a one-to-one basis.

14. The memory system according to claim 10, wherein the memory controller comprises a means for generating first and second pseudo frequency divided clocks by dividing the frequencies of the command/address signal and the data signal, respectively, and
    the memory device has a means for comparing the first and second pseudo frequency divided clocks with one another to make them correspond to one another.

15. The memory system according to claim 10, wherein
    the memory controller comprises a means for outputting both a pseudo clock signal obtained by frequency-dividing a data signal and a clock signal for generating timing for the data signal by frequency-dividing the data signal, and
    the memory device has a means for internally generating multiphase clocks obtained by shifting the phases from individual frequency divided clocks and a means for generating an internal command/address signal which has the phase of a data signal by associating the multi-phase clocks.

16. The memory system according to claim 15, wherein the memory device has a means for transmitting a data signal to the memory controller at the timing of the internal data phase clock.

17. The memory system according to claim 16, wherein the memory controller comprises a means for generating timing for discriminating a data signal on the basis of a pseudo frequency divided clock in response to the pseudo frequency divided clock generated at the timing of the internal data phase clock of the memory device.

18. The memory system according to claim 10, wherein the memory device is a DRAM.

19. A control method used for a memory system comprising a memory device and a memory controller for controlling the memory device, the method comprising:

a step for outputting a command/address signal from the memory controller to the memory device in synchronization with a clock signal, and for outputting a data signal also; and a step for receiving the command/address signal to generate an internal command/address signal on the basis of the received data signal in the device.

20. The control method for a memory system according to claim 19, comprising:

a step for outputting a pseudo clock signal from the memory controller to a data signal line when initializing the system so as to supply a timing for the data signal, and a step for internally generating an internal clock based on the phase of the data signal using the pseudo clock signal as a source when the memory device receives the pseudo clock signal, thus retaining the timing of the data signal in the memory device.

21. The control method for a memory system according to claim 19, comprising:

a step for generating a first multi-phase clock of a shifted phase obtained by dividing the frequency of the clock signal supplied from the memory controller;

a step for generating an internal clock of the memory device that has the phase of the data signal;

a step for generating a second multi-phase clock of a shifted phase obtained by dividing the internal clock by the same cycle as that of the clock signal; and a step for generating an internal command/address signal adjusted to a data signal phase by associating the first and second multi-phase clocks on a one-to-one basis, the steps being carried out in the memory device.

22. The control method for a memory system according to claim 21, wherein the memory controller carries out:

a step for generating first and second pseudo frequency divided clocks by dividing the frequencies of the command/address signal and the data signal, respectively, while the memory device carries out:

a step for comparing the first and second frequency divided clocks with one another to make them correspond to one another.

23. The control method for a memory system according to claim 22, comprising:

a step for outputting a pseudo clock signal at initialization as a frequency divided clock from the memory controller, and a step for comparing a reception clock obtained from a received command/address signal with the frequency divided clock to make the frequency divided clock and the reception clock correspond to one another in the memory device.

24. The control method for a memory system according to claim 23, comprising:

a step for generating a first multi-phase clock of a shifted phase obtained by dividing the frequency of the clock signal supplied from the memory controller;

a step for generating an internal clock of the memory device that has the phase of the data signal;

a step for generating a second multi-phase clock of a shifted phase obtained by dividing the internal clock by the same cycle as that of the clock signal; and a step for generating an internal command/address signal adjusted to a data signal phase by associating the first and second multi-phase clocks on a one-to-one basis, the steps being carried out in the memory device.

25. The control method for a memory system according to claim 24, wherein the memory controller carries out:

a step for generating first and second pseudo frequency divided clocks by dividing the frequencies of the command/address signal and the data signal, respectively, while the memory device carries out:

a step for comparing the first and second frequency divided clocks with one another to make them correspond to one another.

26. The control method for a memory system according to claim 23, further comprising:

a step for outputting a pseudo clock signal obtained by dividing the transmission frequency of a data signal from the memory controller;

a step for outputting a clock signal for generating a timing for a data signal in the form of the clock signal obtained by dividing the transmission frequency of the data signal from the memory controller;

a step for generating multi-phase clocks obtained by shifting the phases from the pseudo clock signal and the clock signal in the memory device; and a step for generating an internal command/address signal which has the phase of the data signal by associating the multi-phase clocks in the memory device.

27. The control method for a memory system according to claim 26, further comprising a step for transmitting a data signal from the memory device to the memory controller at the timing of the internal data phase clock.

28. A control method for a memory system according to claim 27, further comprising:

a step for receiving, in memory controller, a pseudo frequency divided clock generated at the timing of the internal data phase clock in the memory device; and a step for generating timing of discriminating a data signal on the basis of the pseudo frequency divided clock.

29. A control method for a memory system comprising a plurality of memory devices operable in commonly receiving a command/address signal; and a memory controller for controlling the memory devices, wherein each of the plurality of memory devices executes a step for receiving data signals made to correspond to one another and a step for generating an internal command address based on the phase of each received data signal.

30. The control method for a memory system according to claim 29, comprising:

a step for outputting a pseudo clock signal from the memory controller to a data signal line when initializing the system so as to supply a timing for the data signal, and a step for internally generating an internal clock based on the phase of the data signal using the pseudo clock signal as a source when the memory device receives the pseudo clock signal, thus retaining the timing of the data signal in the memory device.

31. The control method for a memory system according to claim 30, comprising:

a step for outputting a pseudo clock signal at initialization as a frequency divided clock from the memory controller, and a step for comparing a reception clock obtained from a received command/address signal with the frequency divided clock to make the frequency divided clock and the reception clock correspond to one another in the memory device.

* * * * *